United States Patent [19]
Gooch

[11] Patent Number: 5,189,572
[45] Date of Patent: Feb. 23, 1993

[54] MAGNETIC CONTROL OF A TRANSDUCER SIGNAL TRANSFER ZONE TO EFFECT TRACKING OF A PATH ALONG A RECORD MEDIUM

[75] Inventor: Beverley R. Gooch, Sunnyvale, Calif.

[73] Assignee: Ampex Corporation, Redwood City, Calif.

[21] Appl. No.: 843,453

[22] Filed: Mar. 24, 1986

Related U.S. Application Data

[63] Continuation-in-part of Ser. No. 829,592, Feb. 13, 1986, Pat. No. 5,119,255, and a continuation-in-part of Ser. No. 715,211, Mar. 22, 1985, abandoned, and a continuation-in-part of Ser. No. 808,588, Dec. 13, 1985, abandoned, and a continuation-in-part of Ser. No. 808,924, Dec. 13, 1985, abandoned, said Ser. No. 829,592, and Ser. No. 715,211, each is a continuation-in-part of Ser. No. 641,817, Aug. 16, 1984, abandoned, said Ser. No. 808,588, is a continuation-in-part of Ser. No. 715,211.

[51] Int. Cl.⁵ ............... G11B 5/584; G11B 5/187; G11B 5/23; G11B 5/52
[52] U.S. Cl. .................... 360/77.12; 360/70; 360/84; 360/107; 360/115; 360/77.13; 360/119; 360/122; 360/125
[58] Field of Search .............. 360/115, 77, 70, 119, 360/120, 123, 125, 128, 137, 55

[56] References Cited

U.S. PATENT DOCUMENTS

| | | | |
|---|---|---|---|
| 3,079,468 | 2/1963 | Morey | 360/119 |
| 3,084,227 | 4/1963 | Peters | 360/115 |
| 3,106,617 | 10/1963 | Fox | 360/119 |
| 3,152,225 | 10/1964 | Peters | 360/115 |
| 3,175,049 | 3/1965 | Gabor | 350/115 |
| 3,188,399 | 6/1965 | Eldridge | 360/115 |
| 3,255,307 | 6/1966 | Schuller | 360/119 |
| 3,314,056 | 4/1967 | Lawrance | 360/119 |
| 3,382,325 | 5/1968 | Camras | 360/115 |
| 3,391,254 | 7/1968 | Honig | 360/115 |
| 3,435,440 | 3/1968 | Nallin | 360/115 |
| 3,555,204 | 1/1968 | Braun | 360/115 |
| 3,573,844 | 6/1968 | Gardner | 360/115 |
| 3,696,216 | 10/1972 | Sugaya | 360/115 |
| 3,845,503 | 10/1974 | Kanai | 360/115 |
| 3,893,187 | 7/1975 | Kanai et al. | 360/115 |
| 4,163,993 | 8/1979 | Ravizza | 360/10 |
| 4,287,538 | 9/1981 | Sakamoto et al. | 360/10 |
| 4,318,136 | 3/1982 | Jeffers | 360/17 |
| 4,322,763 | 3/1982 | Lemke | 360/115 |
| 4,404,605 | 9/1983 | Sakamoto | 360/77 |
| 4,426,665 | 1/1984 | Bradford et al. | 360/10.2 |
| 4,530,016 | 7/1985 | Sawazaki | 360/55 |
| 4,535,369 | 8/1985 | Sawazaki | 360/55 |

OTHER PUBLICATIONS

Hathaway, R. A., and Ray Ravizza, "Development and Design of the Ampex Auto Scan Tracking (AST) System," SMPTE Journal, vol. 89, pp. 931-934, Dec. 1980.

Primary Examiner—Robert S. Topper
Attorney, Agent, or Firm—Ralph L. Mossino; James A. LaBarre

[57] ABSTRACT

A magnetic transducer has a transducing gap that is wider than that used for transferring information signals with respect to a magnetic record medium. A magnetic control flux is applied to the transducer to enable a selected segment of the transducing gap, which defines a transducing zone, for transferring information signals with respect to a selected path along the magnetic record medium. Registration of the transducing zone over the selected path is maintained by varying the applied magnetic control flux to thereby move the transducing zone along the wider transducing gap so as to compensate for deviations between the path traced by the transducing zone over the magnetic record medium and the selected path.

68 Claims, 21 Drawing Sheets

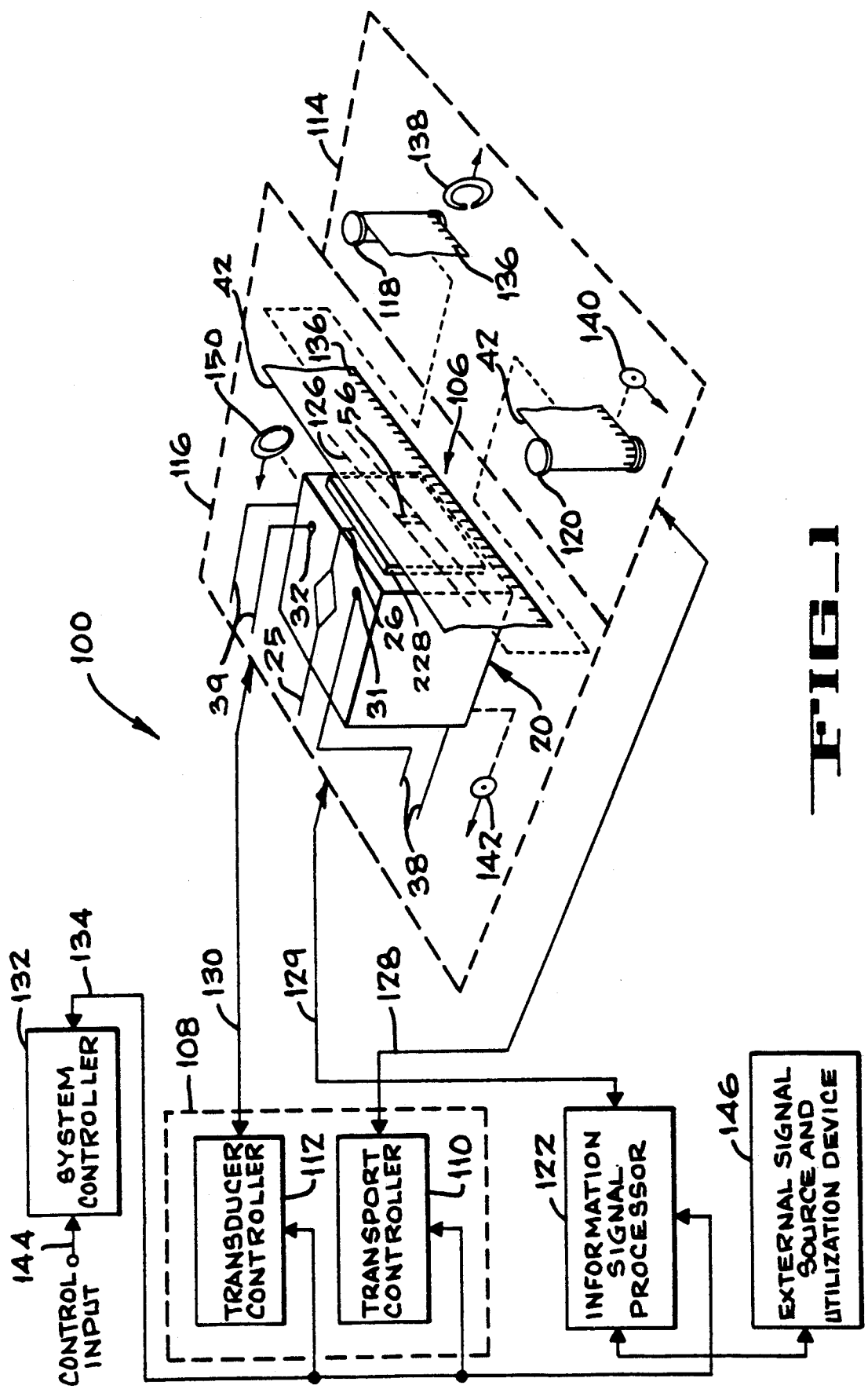
FIG_1

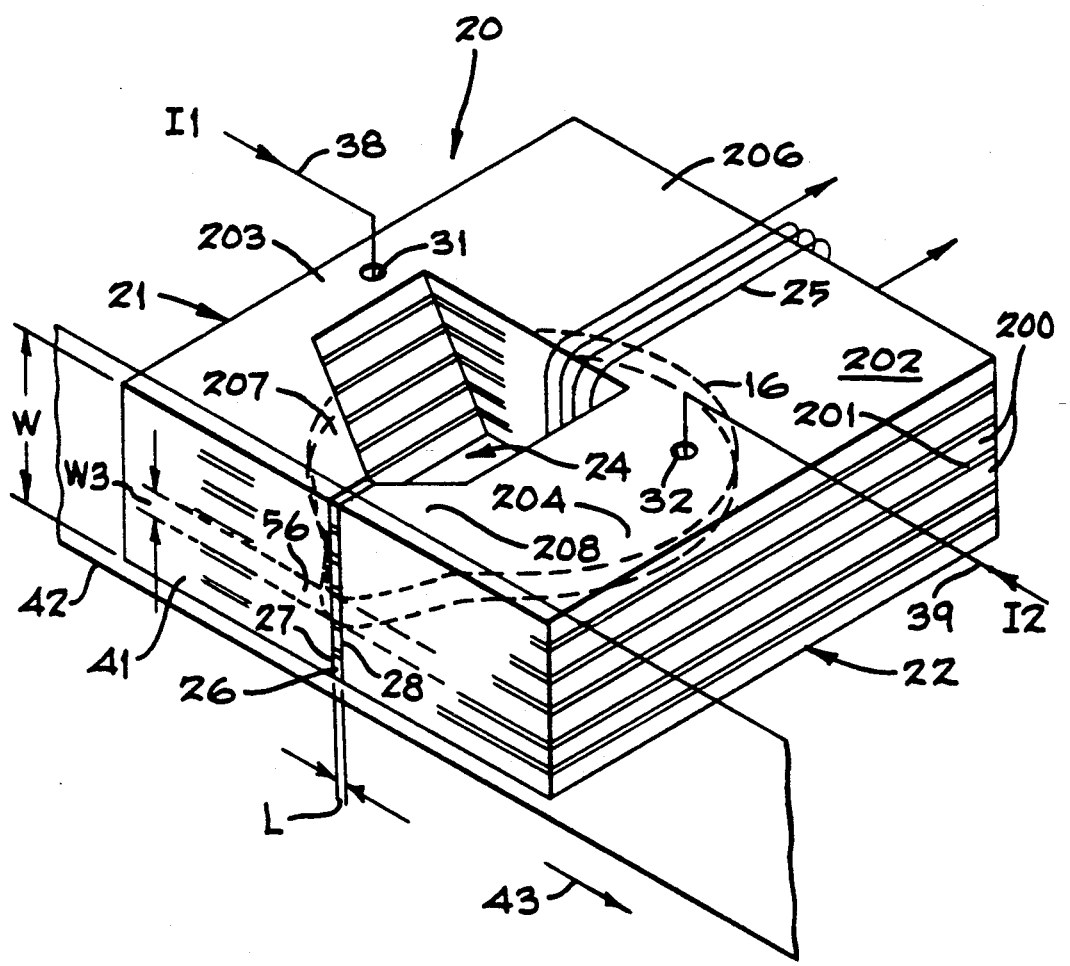
FIG_2

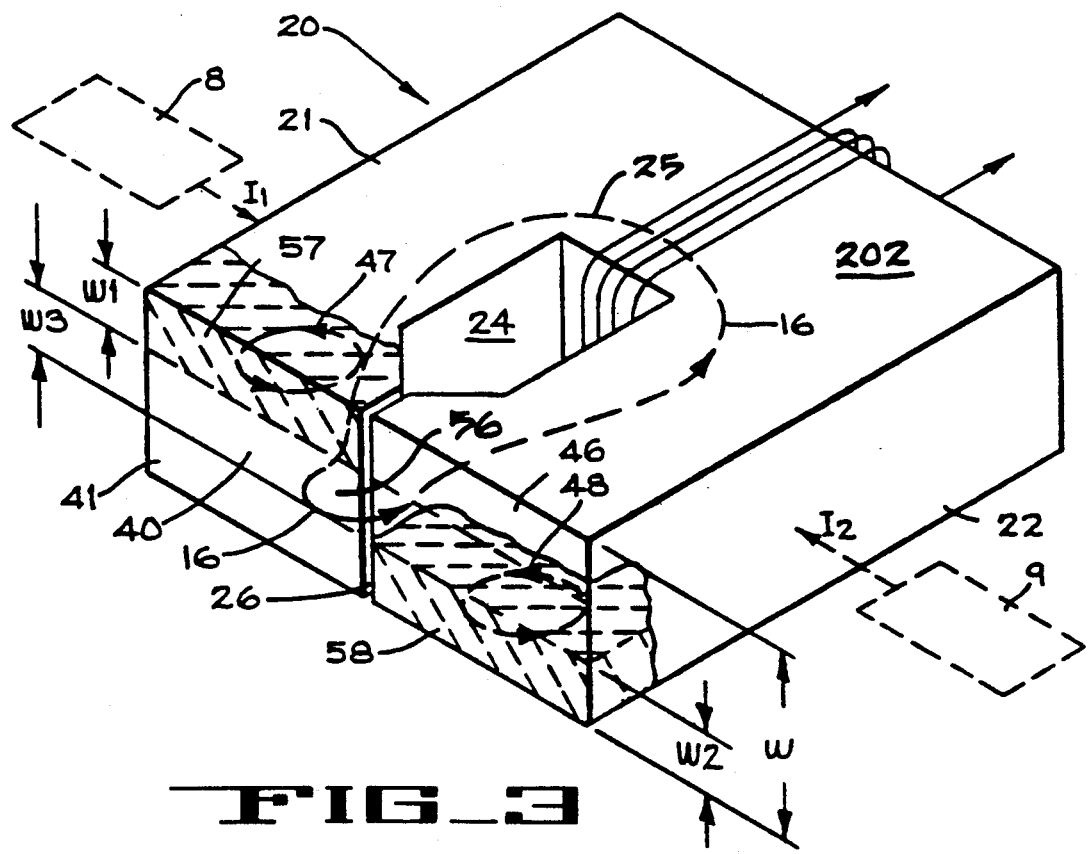
FIG_3
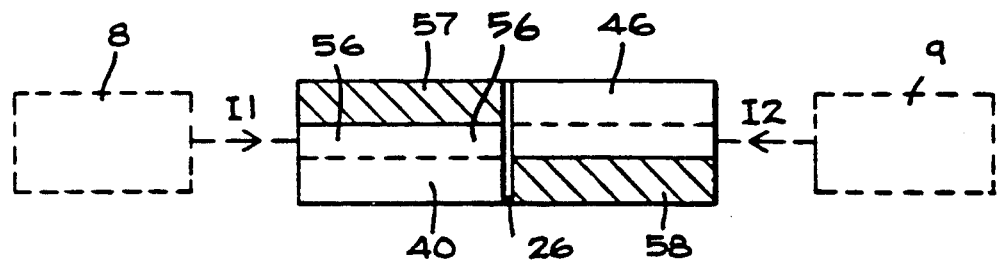
FIG_4

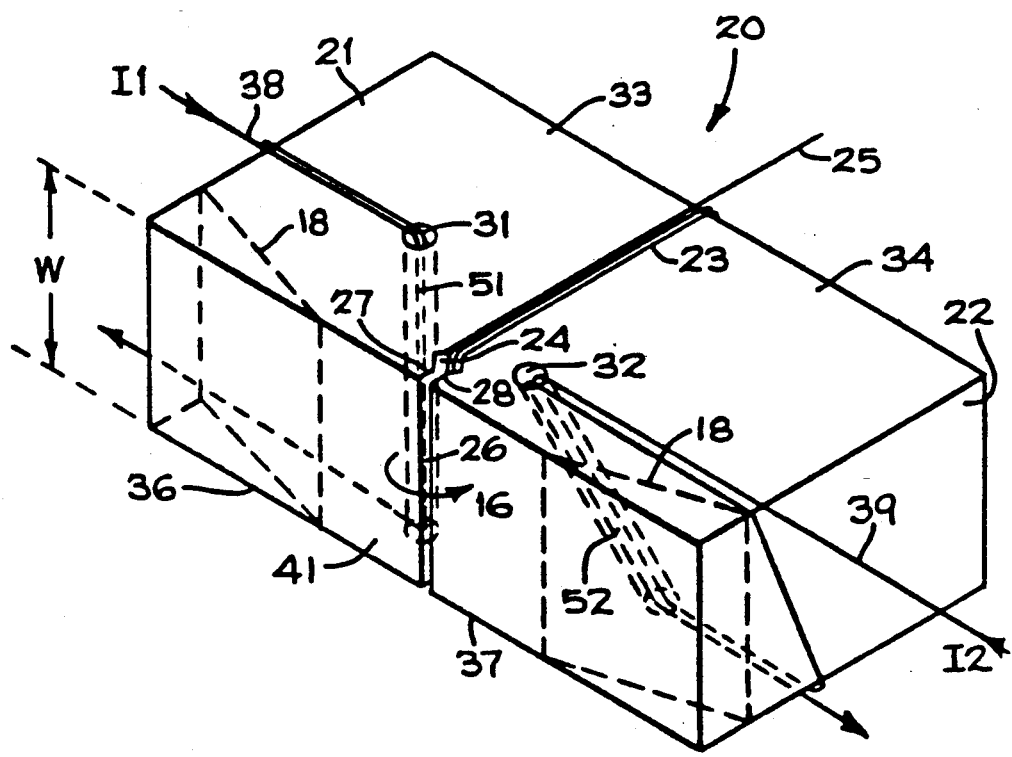
FIG_5

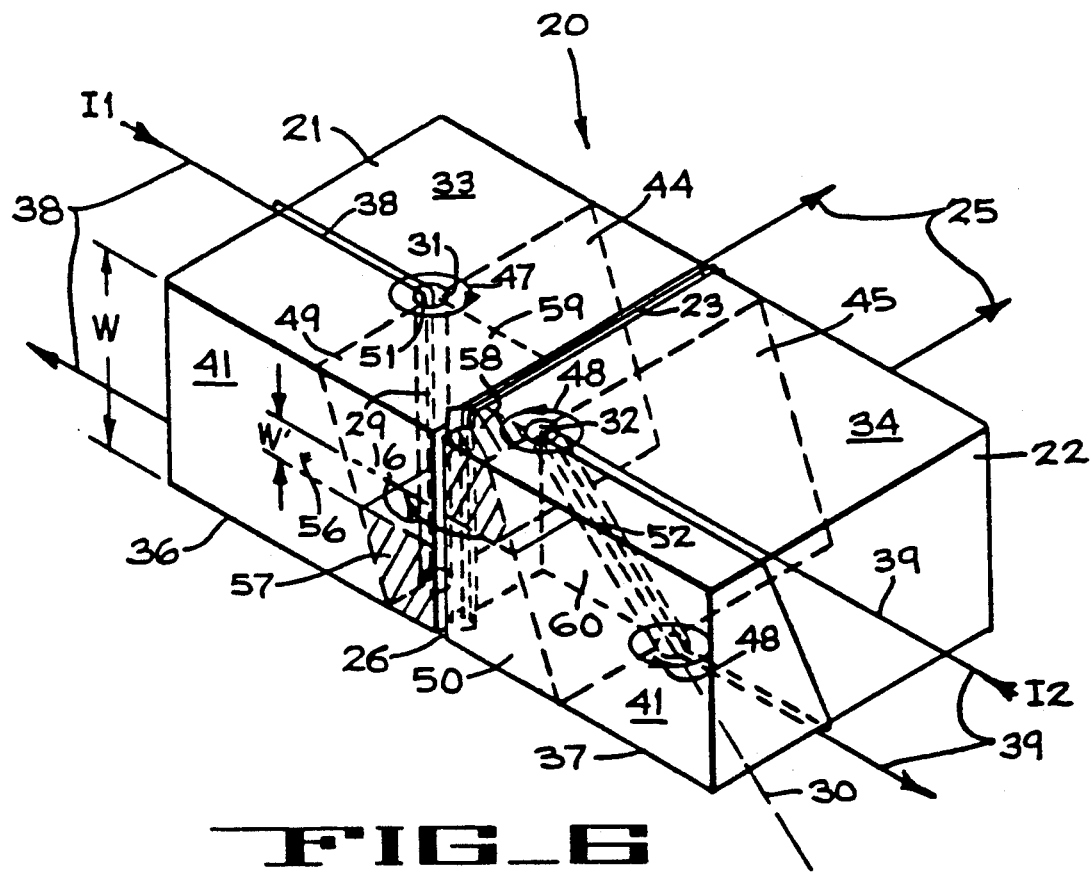
FIG_6
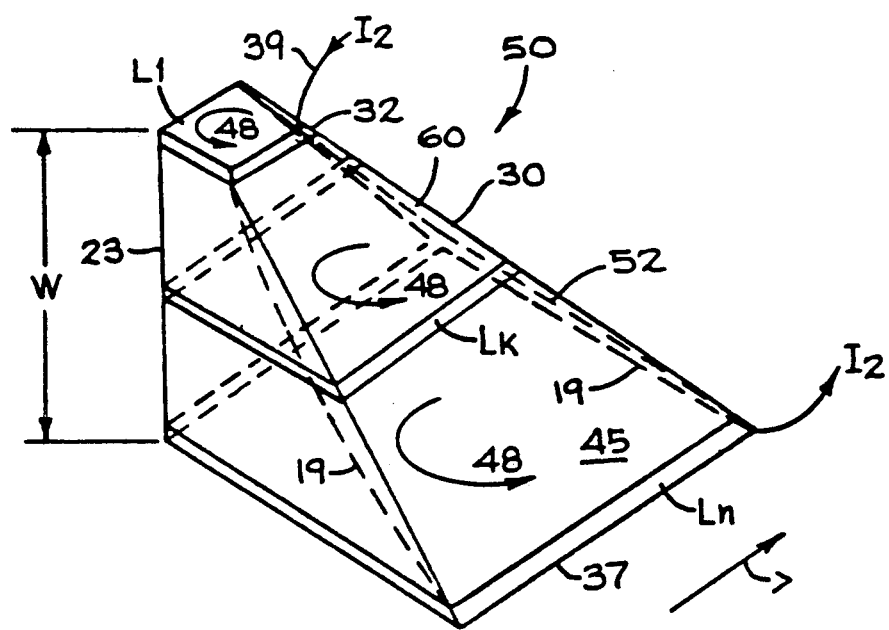
FIG_7

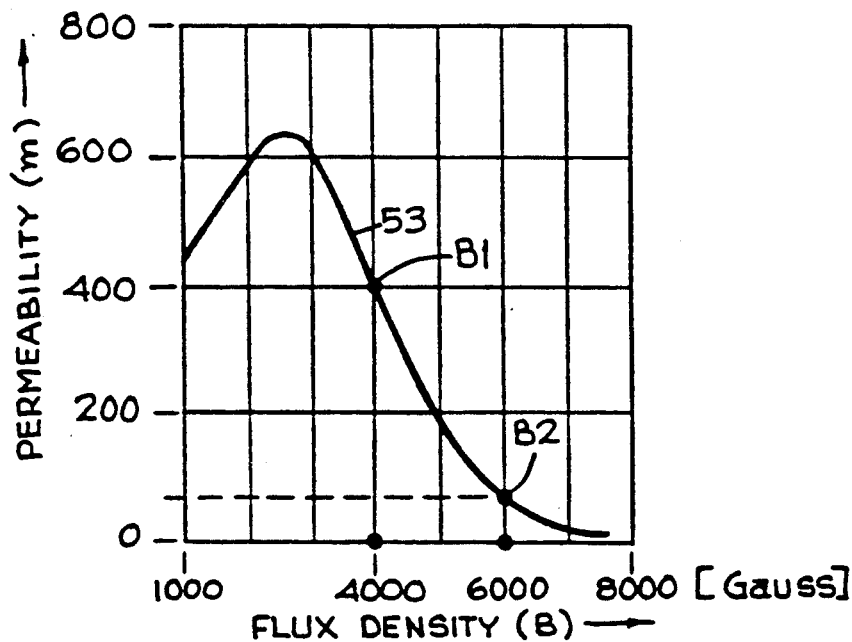
FIG_8
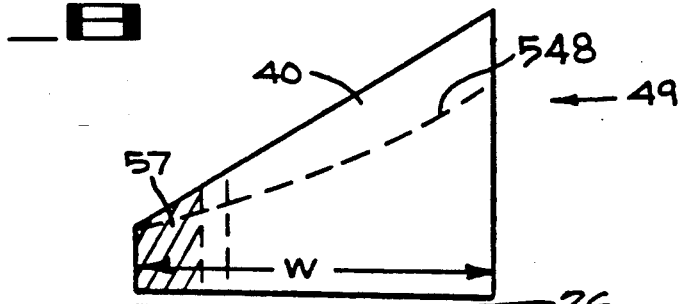
FIG_9
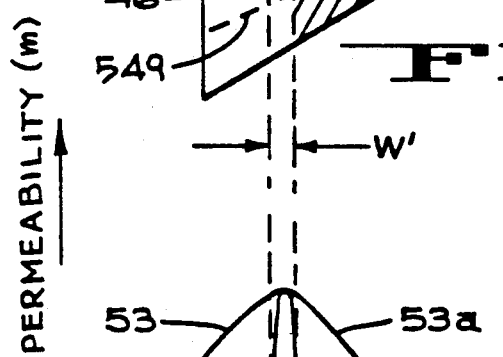
FIG_10

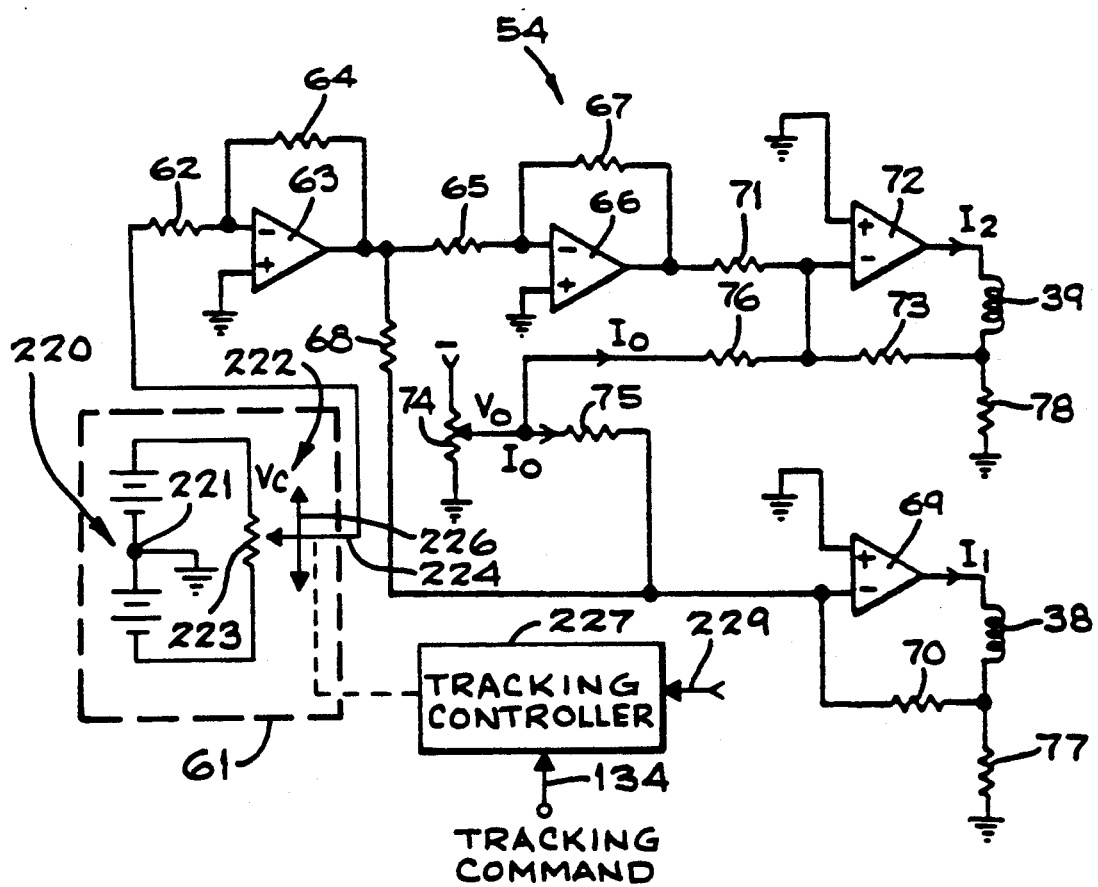
FIG_11
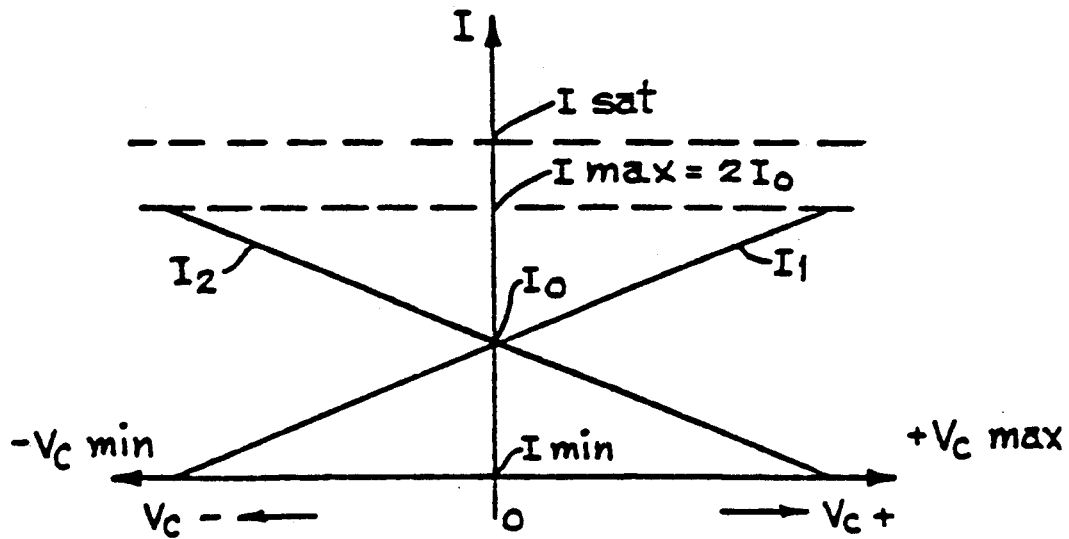
FIG_12

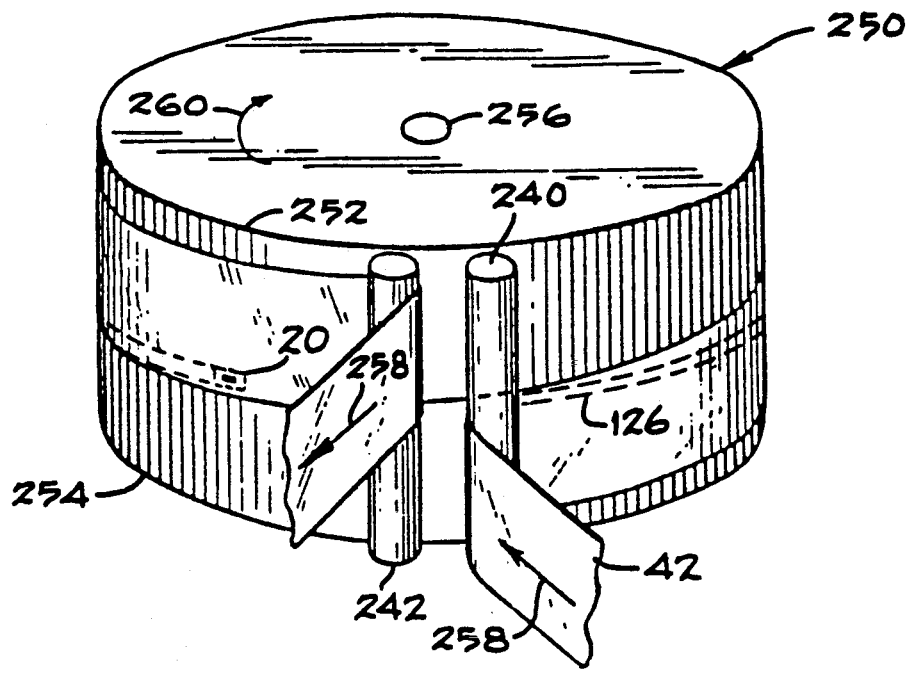
FIG_13
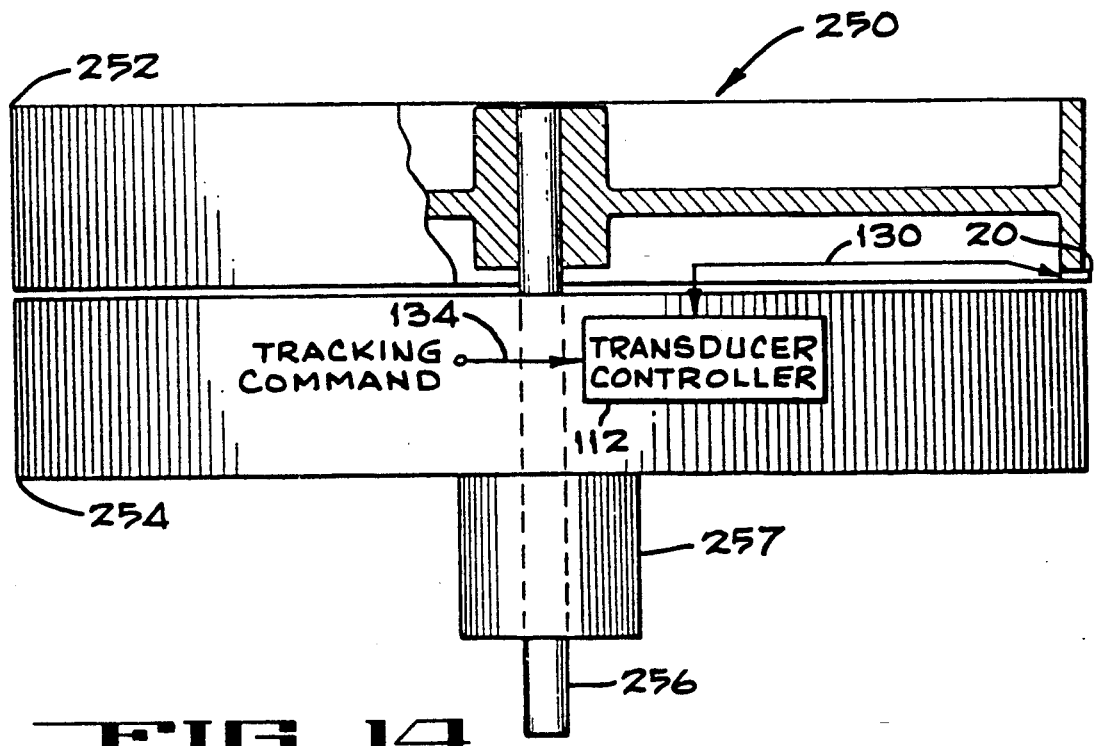
FIG_14

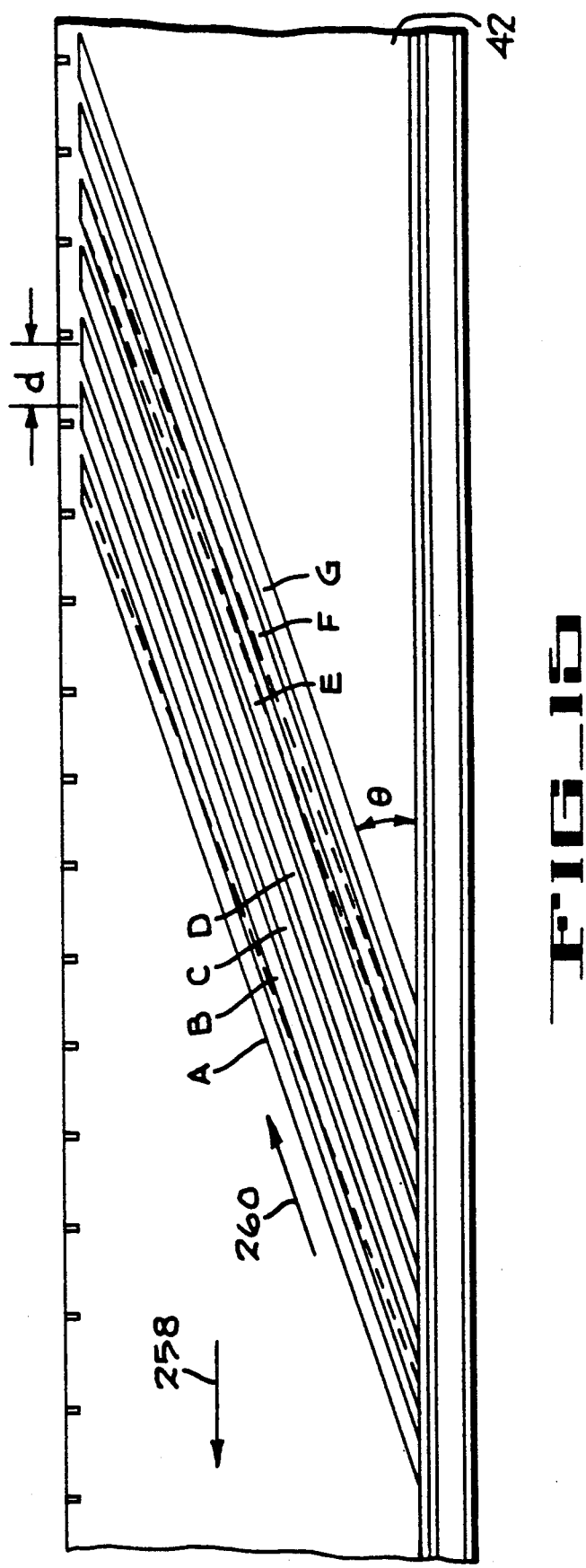

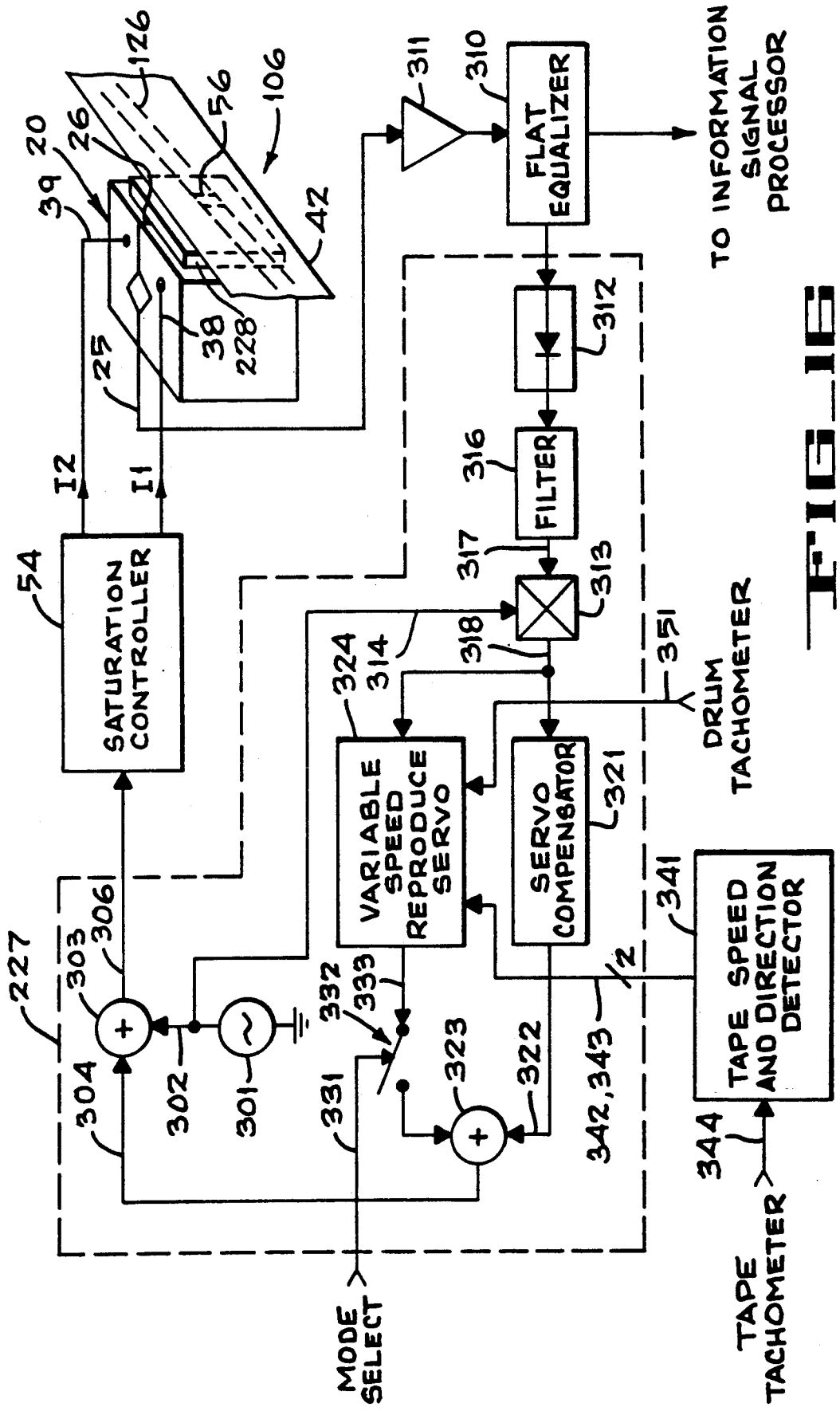
FIG_16

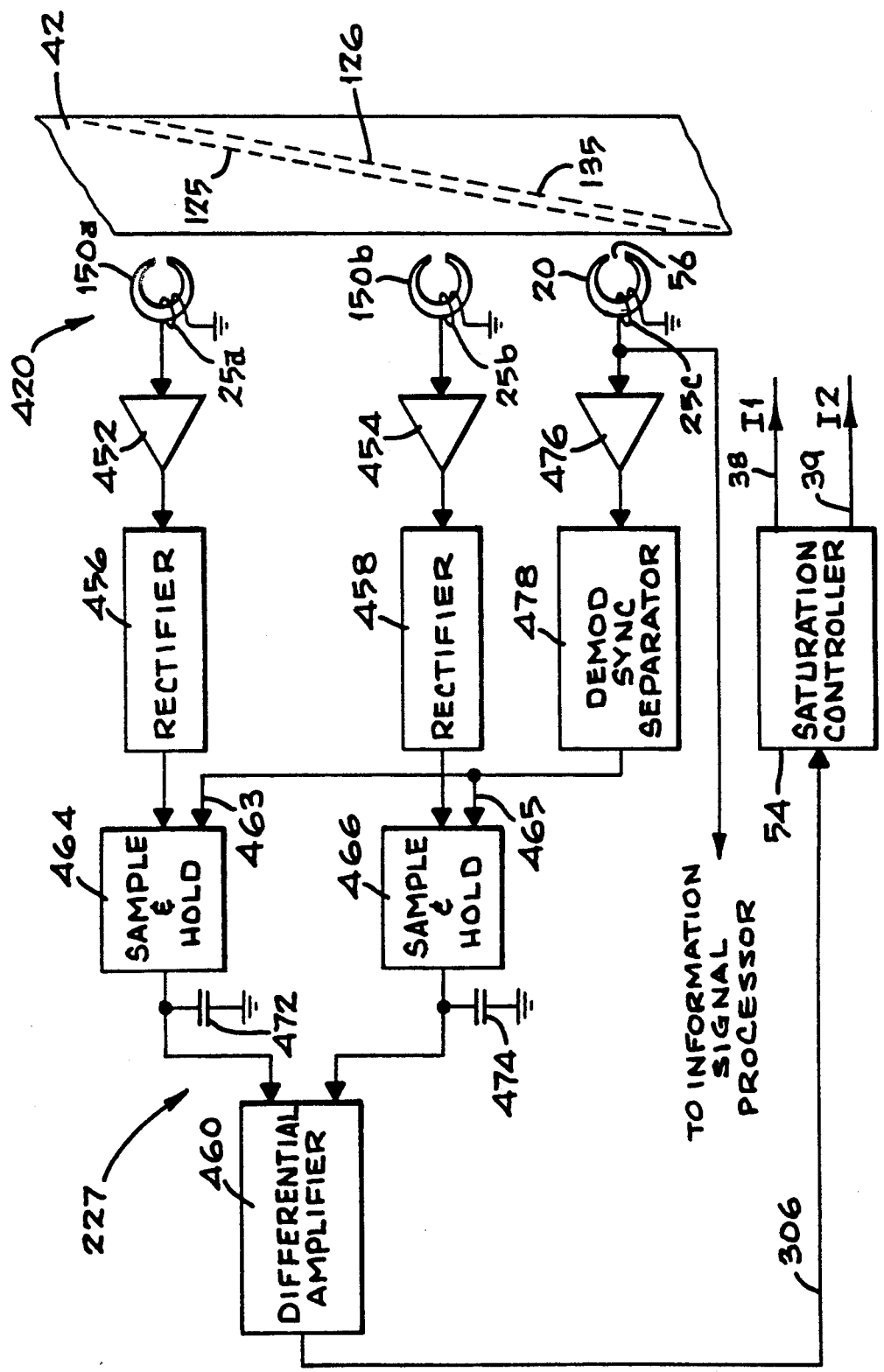

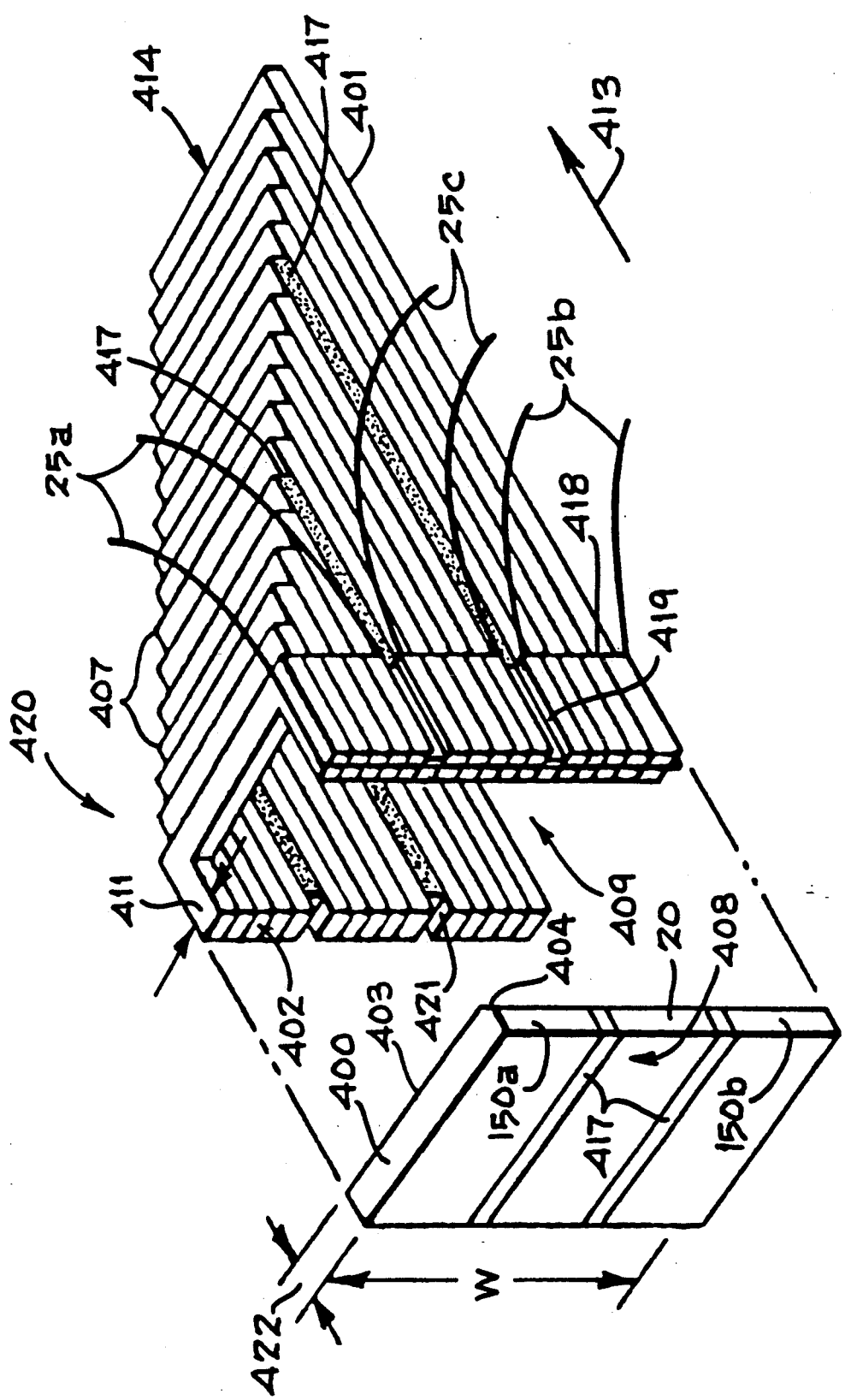
FIG_18A

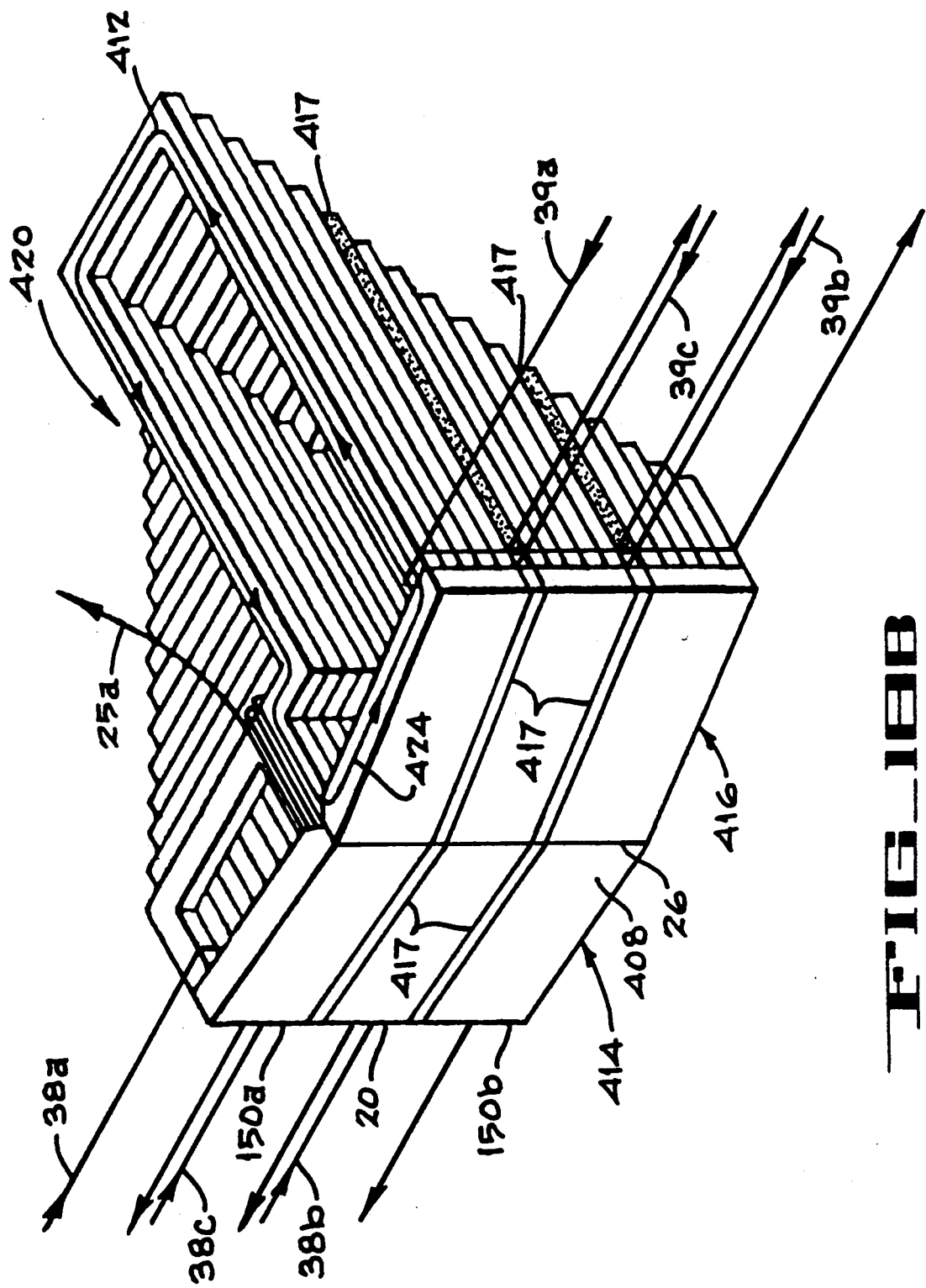
FIG_18B

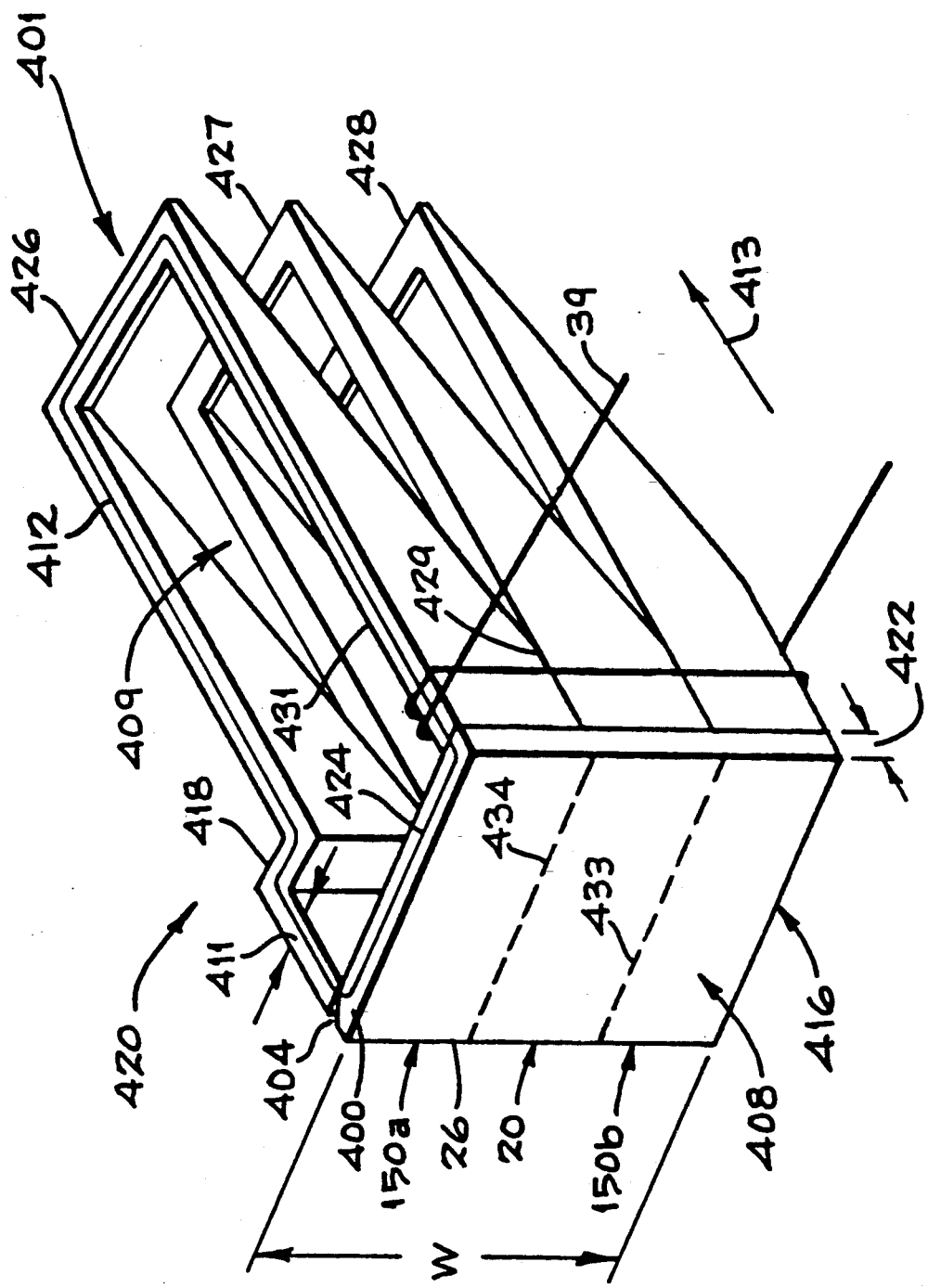
FIG_18C

FIG_20

FIG_21

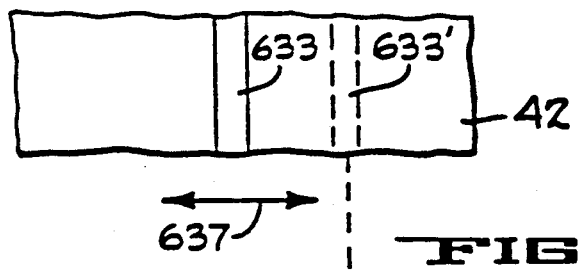
FIG_23A
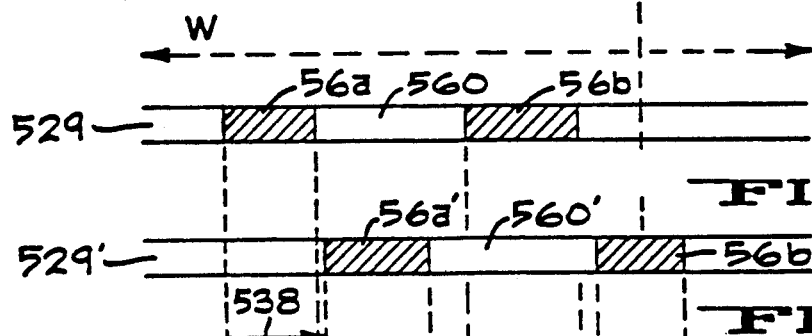
FIG_23B
FIG_23C
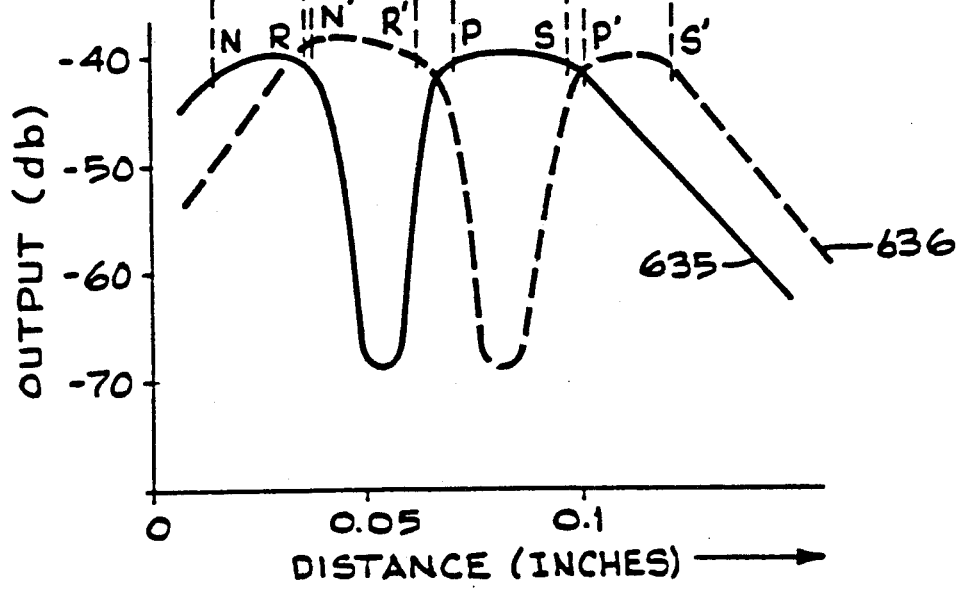
FIG_23D

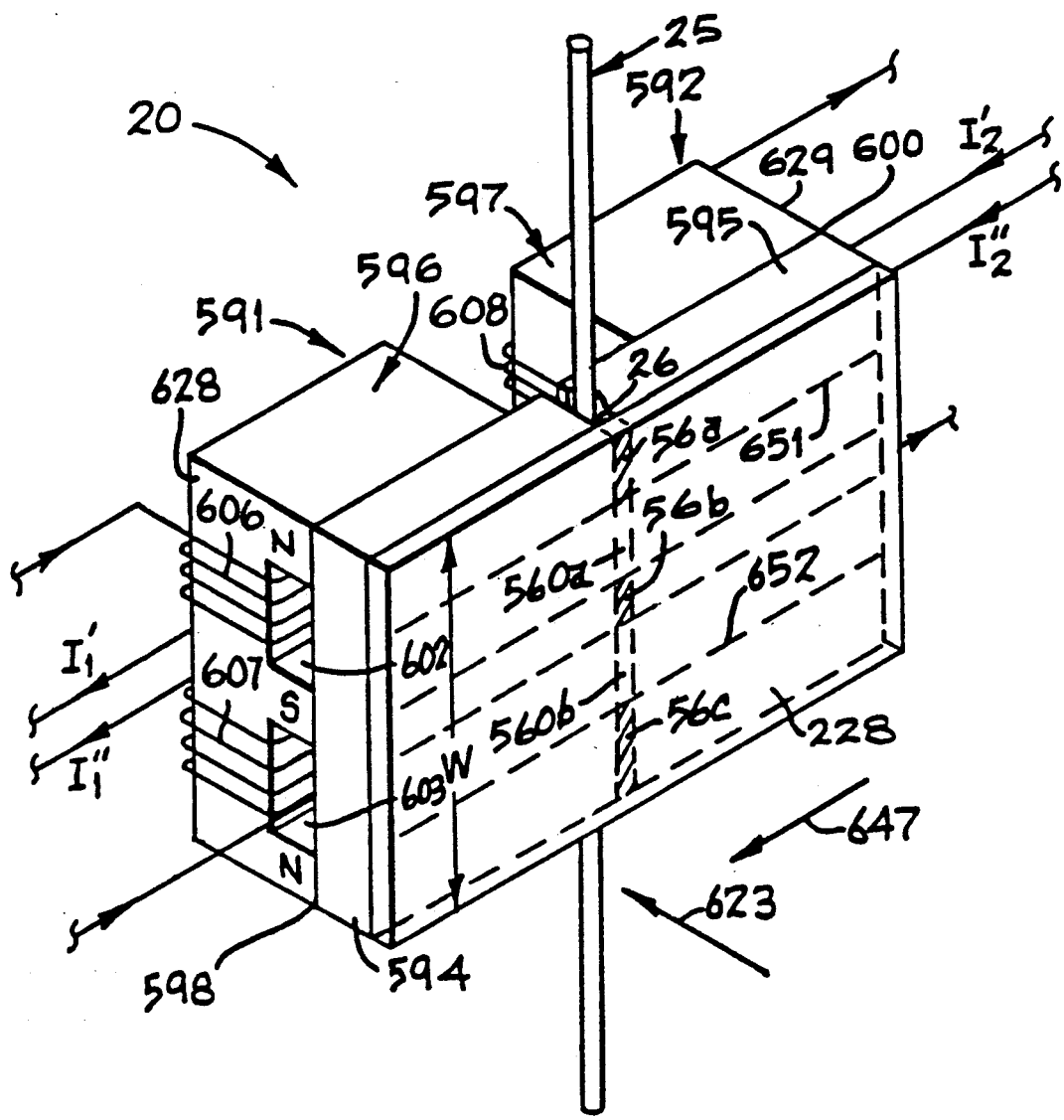
FIG_24

MAGNETIC CONTROL OF A TRANSDUCER SIGNAL TRANSFER ZONE TO EFFECT TRACKING OF A PATH ALONG A RECORD MEDIUM

This application is a continuation-in-part of my copending application Ser. No. 829,592, filed Feb. 13, 1986, now U.S. Pat. No. 5,119,255 which in turn is a continuation-in-part application of my copending application Ser. No. 641,817 filed Aug. 16, 1984, now abandoned; of my copending application Ser. No. 715,211, filed Mar. 22, 1985, abandoned in favor of continuation application Ser. No. 031,713, filed Mar. 27, 1987, my aforesaid copending application Ser. No. 715,211 is a continuation-in-part application of my aforesaid copending application Ser. No. 641,817; of my copending application Ser. No. 808,588, filed Dec. 13, 1985, abandoned in favor of continuation-in-part application Ser. No. 085,676, filed Aug. 6, 1987, which is entitled to the benefit of the effective filing date of Patent Cooperation Treaty application No. PCT/US86/02733, filed Dec. 15, 1986, my aforesaid copending application Ser. No. 808,588 a continuation-in-part application of my aforesaid copending application Ser. No. 715,211; and of my copending application Ser. No. 808,924, filed Dec. 13, 1985, abandoned in favor of continuation-in-part application Ser. No. 128,115, filed Aug. 6, 1987, now U.S. Pat. No. 4,985,795, which is entitled to the benefit of the effective filing date of Patent Cooperation Treaty application No. PCT/US86/02734, filed Dec. 15, 1986.

The present invention generally relates to magnetic recording and reproducing with a magnetic signal transducer that is controlled so that a signal transducing zone defined by the transducer is caused to trace precisely a selected path along a magnetic record medium. More particularly, the present invention relates to such magnetic recording and reproducing wherein a selectable segment of a transducing gap defined by a magnetic transducer forms a transducing zone for transferring information signals with respect to a magnetic record medium, with the location of the selected segment relative to a selected path along the magnetic record medium controlled magnetically.

Transferring information signals through recording or reproducing operations performed with respect to a magnetic record medium relies upon the interaction of a magnetic transducer and the record medium during relative motion between the transducer and record medium. The ability to achieve optimum transfers of information signals during such operations requires faithful recording and reproducing of the signals. This is influenced considerability by the ability to maintain proper registration between the transducer and tracks along the record medium with respect to which the information signals are being recorded or reproduced. Many factors can lead to loss of proper registration. Generally, loss of such registration results from record medium motion/position instabilities, magnetic transducer motion and/or position instabilities, and machine-to-machine geometric variations (which are a form of instability that affects the ability of a recording/reproducing apparatus or machine to reproduce a recording made on a magnetic record medium by a different recording apparatus or machine). Loss of proper registration between a magnetic transducer and magnetic record medium is reflected as imperfect tracking (mistracking) of the desired path along the medium by the transducer. During reproduction operations, mistracking often leads to severe degradation of the quality of the reproduced signal, commonly, either or both in amplitude and time base. Moreover, the higher the frequency of information signals to be transferred with respect to the record medium, the more adverse are the effects of signal degradation and, therefore, the more critical the need to avoid the aforementioned instabilities.

Instabilities leading to mistracking result from various forms of imperfections. For example, imperfections in record medium motion or position relative to the transducer in the direction of the track of information signals cause signal time base errors. Similarly, time base errors result from imperfections in magnetic transducer motion or position in the direction of the track of information signals. Variations in record medium and rotating transducer velocities are examples of imperfections that lead to signal time base errors. In addition, imperfections in relative transducer to record medium motion or position across the track with respect to which information signals are transferred cause signal amplitude errors, and even signal loss. Improper tape record medium guiding and tape slitting errors are examples of imperfections that lead to signal amplitude errors.

Rotary segmented scan magnetic tape record and/or reproduce apparatus are the least forgiving of such instabilities. In such apparatus, a rotating magnetic transducer records and reproduces information signals with respect to parallel tracks extending laterally of the magnetic tape at an angle to the tape's length dimension. The rotary scan apparatus most sensitive to instabilities that cause mistracking is the rotary helical scan tape apparatus, wherein imperfections in tape or rotating transducer velocity translate directly into gross time base errors. Furthermore, in early helical scan tape apparatus, attempts to reproduce recorded information signals at other than normal relative transducer to tape speeds was accompanied by gross mistracking by the transducer in the form of track crossings. In helical scan tape apparatus for television signals, this cross-tracking results in the appearance of visually disturbing noise bars in the displayed video picture. Even when such helical scan tape apparatus are operated at normal relative transducer to tape velocities, mistrackings commonly occur that produce objectionable degradations of the information signals. Such apparatus are characterized by relatively long tracks with respect to which the information signals are transferred. This has impeded maintenance of proper registration between the transducer and tracks along the entire extent of the tracks on the tape. Even minute machine-to-machine geometric variations result in sufficient variation in the characteristic transducer tracking footprint from machine to machine to cause objectionable mistracking when a helical scan tape apparatus is employed to reproduce a recording made on a magnetic tape by a different apparatus.

Various techniques have been proposed to maintain proper registration between a magnetic transducer and magnetic record medium so that information signals are optimally transferred with respect to a track along the record medium. Among these are: (1) multiple magnetic transducers that are electronically switched at various points along the scan of a track; (2) movable record medium guides that are adjusted in position to move the magnetic record medium relative to the magnetic transducer; (3) in rotary segmented scan tape apparatus, movable rotating tape guide sections carrying the rotating transducer that are axially moved to control the position of the transducer relative to the tape record medium; and (4) in rotary helical scan tape apparatus, transducers that are appended to a rotatable member for movement relative to the tape record medium.

In accordance with one such technique, tracking reference signals are provided along the tape to identify the beginning of each track extending laterally of a tape record medium. These signals are sensed to identify the beginning of each scan of the track by a transducer for use by a servo mechanism to compensate for a mistracking condition. This compensation is achieved by controlling a tape capstan drive motor to adjust the magnetic tape position relative to the tracking transducer. Such a system can correctly locate the transducer relative to the track at the beginning of the scan of the track. But, if the track is not perfectly straight or does not follow a predictable path, the transducer will deviate from the optimum transducing position as it scans the tape. Consequently, such systems are not suitable for use in applications, such as rotary helical scan tape apparatus, where tracking corrections must be made during the entire scan of a track to insure maintenance of optimum transducing position throughout the scan.

In some of these medium transport control systems, a control track information signal recorded along the medium separate from the information signals is reproduced to obtain control signals for adjusting the tension of the record medium to maintain proper tracking by the transducer. In others of these medium transport control systems, information signals reproduced from the record medium is monitored to provide a control signal for adjusting the transport of the record medium to maintain proper tracking by the transducer. Altering the speed of transport of the record medium has the undesirable tendency of altering the time base of information signals reproduced from tracks recorded in the direction of the transport of the record medium. Furthermore, techniques which rely upon the control of the transport of the record medium to maintain proper tracking by the transducer are not suitable for precise control of the transducer position relative to paths along the record medium, particularly, where large displacements of transducer/record medium position may be required at high rates to maintain proper tracking by the transducer.

In one system which relies on moving a magnetic transducer to position it optimally with respect to a track along a record medium, a track positioning reproduce transducer is positioned over a track prior to reproducing recorded signals therefrom. This is accomplished by a transducer structure composed of two magnetic elements, each formed by a separate magnetic body. The multiple element transducer is moved until equal signals are reproduced by each element of the transducer. At the occurrence of this condition, the transducer is properly positioned and the transducer positioner relinquishes control to allow normal reproduction of recorded signals. Other systems using control tracks and reproduce head vibration have been employed for tracking purposes. However, until recently, none of these moving transducer positioning systems have been capable of maintaining adequate registration between the transducer and tracks along the record medium, particularly, for the entire length of long tracks. Nor are such systems particularly suited for transferring a continuous signal with respect to a series of discrete track segments along a magnetic tape, where the track segments are scanned by a transducer rotating at a substantial speed relative to the tape record medium.

Recently, rotary segmented scan magnetic tape record and/or reproduce apparatus have employed rotating magnetic transducers appended by a deflectable member to a rotating member to permit movement of the rotating transducers across the width dimensions of the record tracks and, thereby, maintain proper registration between the transducer and record tracks during transfers of information signals. The most common arrangement employs a piezoelectric member cantilevered at a rotating cylindrical tape guide that guides a magnetic tape in the direction of its length dimension along a helical path for the transfer of information signals with respect to record tracks extending diagonally along the length of the tape. A magnetic transducer is carried at the free end of the piezoelectric member opposite its cantilevered end and the piezoelectric member is appended to the rotating guide so that the position of the transducer can be moved in a direction generally normal to the plane of its rotation, which direction also is normal to the direction along the length of the record tracks. Tracking control signals are supplied to the cantilevered piezoelectric member that cause it to deflect and, thereby, move the carried magnetic transducer to cause it to remain registered with the record track with respect to which information signals are being transferred. With the cooperation of servomechanisms that detect tracking errors and responsively generate tracking correction control signals, such apparatus are capable of maintaining transducer to record track registration over a wide range of relative transducer to tape velocities, and even when the tape is transported in a direction that is the reverse of the normal direction of tape transport.

While such apparatus represents a considerable improvement over earlier attempts at controlling transducer to record track registration, even that apparatus is characterized by transducer to record track instabilities that are particularly objectionable under certain operating conditions. For example, the transducer carrying deflectable members employed in such apparatus are mechanical devices and, like most all such devices, are characterized by dynamic parameters that are non-linear, in nature. Furthermore, as transducer carrying devices, they the are subjected to extreme external forces, some of which often are transient in nature. To minimize objectionable mistracking that can result from the non-linear nature of deflectable members and of encountered external forces, complicated servomechanisms and deflectable member structures are commonly employed. Even with these precautions, objectionable mistrackings frequently occur in many of these apparatus, particularly, those employing cantilevered piezoelectric members. A simple cantilevered deflectable member displaces or bends to cause its free end to trace a pure segment of a circle. Consequently, the face of a transducer rigidly secured at the free end will trace a comparable path, causing a variance in its position (both distance and facing angle) relative to the surface of the magnetic record medium. This mistracking is especially annoying when a cantilevered deflectable member is displaced an extreme amount from its normal or undeflected position. At the extremes, the increased spacing between the transducer and record medium results in objectional loss of signal transfer, which is commonly referred to as zenith error. During reproduce operations, such spacing losses are reflected as decreases in amplitude of the reproduced signal. This reproduce spacing loss effect is signal wavelength dependent, i.e., at shorter signal wavelengths the amplitude decrease of the reproduced signal is more pronounced.

As will be appreciated from the foregoing, all previous magnetic transducer to magnetic record medium tracking control techniques depend in some manner on the use and control of mechanical displacement, which may reduce to some extent the adverse consequences of mistracking. However, even the best of the previous tracking control techniques do not eliminate all objectionable mistracking. For broadcast television signal applications such mistracking is most objectionable, inasmuch as the slightest mistracking causes objectionable effects in the displayed television signal. In other applications, less than accurate tracking may be tolerable because some loss of information signal is not particularly harmful. But, complete recovery of information signals is still preferred, and to such extent the present invention is useful in any application involving the transfer of information signals between a magnetic transducer and a magnetic record medium. Therefore, it would be desirable to effect the control of tracking of a magnetic transducer relative to a magnetic record medium, especially during information signal transfers therebetween, without reliance on mechanical displacement.

In accordance with the present invention, such control is achieved by a combination of a magnetic transducer having a transducing zone (or gap) of a dimension which is larger than that required for effecting the transfer of information signals with respect to a track along a record medium and a controller that enables a selected segment of the larger gap dimension to effect the transfer. The controller is responsive to control signals that determine the segment within the enlarged gap dimension selected for effecting the transfer so that the enablement of the selected segment is moved within the enlarged gap dimension to maintain registration between the selected segment and a selected path along a record medium. Definition and selection of the enabled segment is achieved by selectively magnetically saturating a region of the body of magnetic material of the transducer to leave a region, encompassing the transducing zone segment, magnetically unsaturated for effecting transfers of information signals with respect to the record medium. Preferred forms of such magnetic transducer utilized for achieving this are of the kind described in my aforementioned copending applications, of which this application is a continuation-in-part. For purposes of the present invention, however, it is preferred that such magnetic transducer be disposed relative to the magnetic record medium in a particular way so that optimum transfers occur with respect to the record medium as the relative transducer to record medium tracking is controlled. More specifically, the transducing is supported relative to the record medium so that the length dimension of the gap is generally oriented in a direction corresponding to the direction of the path traced along the record medium by the selected segment. This positions the width dimension of the gap in an orientation that is generally in a direction corresponding to the width of the traced path. This orientation of the gap has the advantage of enabling avoidance of the introduction of time base perturbations in the transferred information signal when the selected segment is moved along the enlarged gap dimension, which for such applications is the gap's width dimension.

For effecting control of location of the segment within the enlarged gap dimension, particularly, continuously and in response to sensed deviations of the selected segment relative to the track being followed during transfers of information signals, the controller need only be arranged to deal with the location of the selected segment within the enlarged gap dimension, which is determined by the relative location of the magnetically saturated and unsaturated regions within the magnetic transducer. The controller need not be concerned with the control of mechanical displacement of the magnetic transducer to effect control of the location of the selected segment relative to the record medium. Movement of the selected segment within the enlarged gap to effect alteration of the path it traces relative to the record medium only requires relative displacement or movement of the magnetically saturated and unsaturated regions within the magnetic transducer relative to the record medium. Consequently, the transducer to record medium tracking control in accordance with the present invention is achieved without necessary reliance on mechanical displacement. As a result, exercising tracking control in accordance with the present invention permits maintenance of proper registration between the transducer and tracks along the record medium without suffering the deleterious effects characterizing tracking control techniques previously employed in magnetic record and/or reproduce apparatus.

Other features and advantages of the present invention will become more apparent upon consideration of the following description of preferred embodiments of the present invention and the claims in connection with the accompanying drawings, in which:

FIG. 1 is a schematic block diagram of a magnetic record and/or reproduce apparatus in accordance with the present invention;

FIG. 2 is a schematic perspective view of one embodiment of a magnetic, transducer having a transducing zone that is magnetically movable within the transducer;

FIG. 3 is a schematic perspective view illustrating the operation principle of another embodiment of a magnetic transducer having a transducing zone that is movable within the transducer in accordance with the present invention;

FIG. 4 is a front elevation view of the transducer of FIG. 3;

FIG. 5 is a simplified perspective view of a magnetic transducer having a transducing zone that is movable electromagnetically within the transducer in accordance with the operation principle illustrated by the embodiment of FIG. 3;

FIG. 6 is a more detailed representation of the transducer shown in FIG. 5;

FIG. 7 is an enlarged perspective view of a saturable wedge section of the transducer of FIG. 6;

FIG. 8 is an example of a flux density versus permeability characteristic of a well known magnetic material;

FIG. 9 shows a front elevation view of oppositely oriented saturable wedge sections of the transducer of FIG. 6 rotated by 90 degrees;

FIG. 10 shows two superposed flux density versus permeability characteristics of FIG. 8, each corresponding to one saturable wedge section of FIG. 9;

FIG. 11 is a schematic diagram of a saturation control circuit utilized to control the width and location of the transducing zone of the transducer of FIG. 6;

FIG. 12 is a control voltage versus control current characteristic obtained by the circuit of FIG. 11;

FIG. 13 is a perspective view of a tape guide drum and transducer assembly portion of an omega wrap rotary helical scan tape record and/or reproduce apparatus, which is simplified for the sake of clarity;

FIG. 14 is a side elevation view of the tape guide drum and transducer assembly of FIG. 1, with portions removed and partially in cross section;

FIG. 15 is an enlarged segment of magnetic tape illustrating tracks of information signals recorded therealong;

FIG. 16 is an electrical block diagram illustrating the tracking control circuitry for a rotary helical scan tape record and reproduce apparatus;

FIG. 17 is an electrical block diagram illustrating another embodiment of tracking control circuitry for a rotary helical scan tape record and reproduce apparatus;

FIGS. 18A, 18B and 18C are various perspective views of magnetic transducer structures having a plurality of transducing zones that are movable electromagnetically within the transducer structures in accordance with a preferred embodiment of the invention;

FIGS. 23A, 23B, 23C and 23D illustrate track profile characteristics of the transducer embodiment of FIG. 22;

FIG. 24 is a simplified perspective view of another embodiment of a magnetic transducer of the kind illustrated in FIG. 22.

Figure 19:
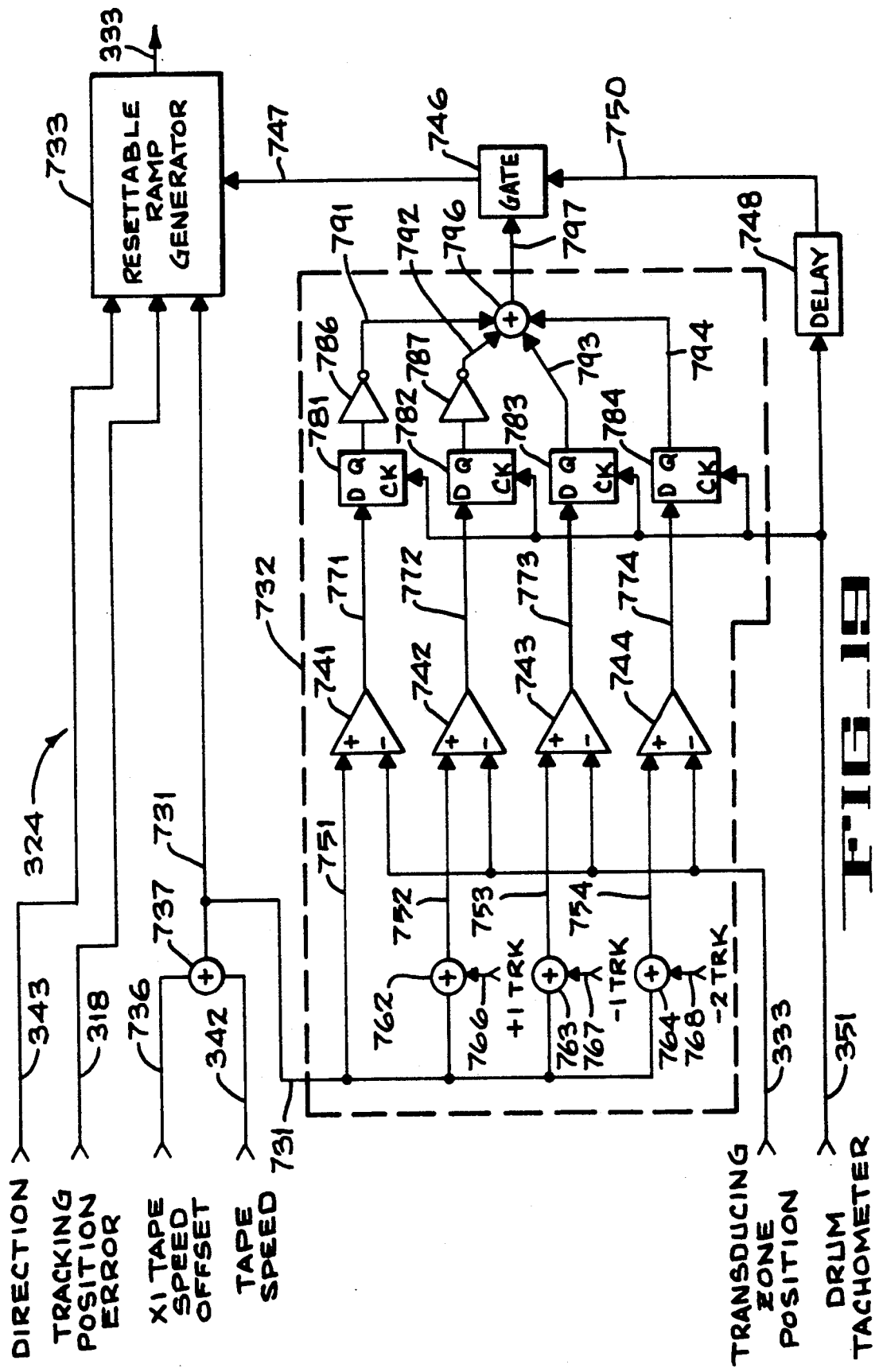
FIG. 19 is an electrical block diagram illustrating an embodiment of a portion of the tracking control circuitry of FIG. 17, which effects correction of tracking geometry errors.

In the following description of embodiments of the present invention, like elements will be designated by like reference numerals, and the description of similar elements and circuit portions may not be repeated with reference to subsequent drawing figures related to the various embodiments of the invention.

Broadly stated, the present invention is directed to a method and apparatus for transferring information with respect to a magnetic record medium in which a segment of a transducing gap defined by a magnetic transducer is enabled selectively and is displaceable along the gap to maintain registration between the selected enabled segment and a selected path along the record medium as information signals are transferred by the transducer with respect to the selected path. The method and apparatus can take various forms depending upon the footprint of the selected path or record track desired on the magnetic record medium. Record track footprints (or formats) fall into four general classes: (1) tracks extending longitudinally along a major dimension, commonly the length of the record medium; (2) tracks extending along circular paths, commonly, either a spiral or a set of concentric circles on the record medium, which typically is discoidal; (3) tracks extending along arcuate paths across a major dimension, commonly, the width dimension of the record medium; and (4) track segments extending along generally straight paths laterally to a major dimension, commonly the length of the record medium. The track format determines the transducer-to-record medium geometric interface required at the station where information signals are transferred between the transducer and record medium. The geometric interface, in turn, determines the nature of relative motion required between the transducer and record medium, and, therefore, the nature of the magnetic record medium handling apparatus and of the transducer handling apparatus. While the method and apparatus of the present invention offers advantages in transferring information signals with respect to any track format, it has the advantage of curing many of the deficiencies currently characteristic of recording and reproducing with rotating magnetic transducers, particularly, when satisfying the requirements of the fourth of the above-listed track formats.

In general, and with reference to FIG. 1, the system 100 for transferring information signals with respect to a magnetic record medium 42 in accordance with the present invention includes a magnetic transducer 20 disposed for magnetic coupling with the record medium 42 at a station 106 where transfers of the information signals are performed. Relative motion between the transducer 20 and record medium 42 is established by a suitable means 108, typically, a record medium transport controller 110 and a cooperating transducer controller 112. The character of each of the controllers depends upon the record track format desired. Some, such as segmented track formats, require motion by both the transducer 20 and record medium 42, while others, such as longitudinal track formats require motion by only one of them, usually, the record medium 42.

For apparatus wherein both the transducer 20 and the record medium 42 are in motion during normal signal transfers, each of the controllers is arranged to provide drive signals to an operatively associated transport mechanism 114 or 116 that establishes the desired motion of the transported device at the information signal transfer station 106. For example, in rotary segmented scan magnetic tape record and/or reproduce apparatus, the transport mechanism 114 includes a pair of tape storage reels 118 and 120 between which a tape record medium 42 is moved under the control of a tape transport drive signal provided by the transport controller 110. The drive signal determines the speed and direction at which the tape is moved through the transfer station 106 as information signals are transferred by the transducer 20 between the tape 42 and an information signal processor 122. Most commonly, such apparatus includes a rotatable transducer transport mechanism 116 that carries the transducer 20 at a high velocity relative to the transported tape 42 to have the transducing zone 56 defined by the transducer trace a desired path 126 laterally of the direction of the length dimension of the tape at the signal transfer station 106. (To facilitate an understanding of the relationships between the tape 42, the transducing zone 56 and the laterally extending desired path 126, the latter two are illustrated by dashed lines on the tape medium.) As in the case of the transport of the tape 42, the rotatable transducer transport mechanism 116 is driven under the control of a drive signal provided by the rotating transducer controller 112 that determines the speed and direction of rotation of the transducer 20, hence, movement of the transducing zone 56 relative to the tape.

Ordinarily, the relative motion of the record medium 42 and transducing zone 56 is regulated against motion disturbances within the signal transfer station 106. This regulation is achieved through servomechanisms that obey one or more command signals to maintain the desired relative motion within the transfer station Most often, the regulation is accomplished through a closed-loop control system wherein the actual condition of the controlled variable, which is relative motion of the transducing zone 56 and record medium 42 at the transfer station 106, is measured and a corresponding signal fed back for comparison with the commanded or desired condition. This comparison is used to produce a signal proportional to the difference between the measured and commanded conditions, which is employed to alter the relative motion determining drive or drives provided to the motion producing means 108 in a manner that corrects deviations of the actual motion condition from the commanded condition.

In apparatus of the kind generally described with reference to FIG. 1, the regulation is accomplished by providing communication bidirectionally between the controllers 110 and 112 via signal communication links 128 and 130, respectively, whereby commanded drive signals are coupled to the record medium transport mechanism 114 and transducer transport mechanism 116 and feedback signals indicative of the measured condition of relative motion returned thereby to the controllers 110 and 112. The controllers are responsive to the received feedback signals and command signals provided by a system controller 132 over a system control bidirectional communication link 134 to correct deviations of the actual relative motion condition from the commanded condition represented by command signals.

In rotary segmented scan magnetic tape record and/or reproduce apparatus, maintenance of precise registration between the transducing zone 56 and a desired path 126 along the tape 42 requires precise synchronous control of their relative positions and velocities of motion. Such control is usually achieved through the use of feedback control signal information derived from recordings along the record medium 42, and position and rate feedback information derived from tachometers operatively associated with the record medium 42 and rotating transducer 20. More specifically, a track 136 of control information is typically recorded along the tape 42 to identify the location of the paths or tracks 126 laterally extending along the tape, and provide a measure of the speed and direction of the transport of the tape record medium through the signal transfer station 106. This information is reproduced by a control track transducer 138 to synchronize the rotation of the transducer 20 and transport of the tape 42 relative to the transfer station 106 so that the transducing zone 56 commences tracing a path laterally along the tape at the proper location along the tape at the proper time determined by a controlling reference. Higher rate tape speed and tape transport direction feedback information is provided by a tape tachometer 140 that engages the tape 42 to be responsive to the rate and direction of tape motion through the signal transfer station 106. The rotational position of the rotating transducer 20 is determined from a tachometer 142 linked to the rotating transducer to provide signals indicative of the angular position of the transducing zone 56 along its path of rotation relative to the transfer station 106. Common tachometers employed with rotating transducers provide a once-around tachometer signal that identifies when the transducing zone 56 of the transducer passes a known, predetermined angular position in its path of rotation. In addition, these tachometers provide feedback signals from which the velocity of rotation of the transducer is determined. Synchronization of the tape position with the transducing zone position at the transfer station 106 is achieved by comparison logic included within the motion producing means 108 that receives the motion feedback information provided over communication links 128 and 130 and commanded position information supplied by the system controller 132 in response to operator controlled inputs provided over a control input 144.

Control of the relative velocities of transport of the tape 42 and rotating transducer 20 is accomplished by comparison of velocity information provided by tachometers with velocity commands received from the system controller 132 in response to operator controlled inputs provided at the control input 144. Generally, the velocity of rotation of the transducer 20 is effected through comparison of tachometer rate information derived from the tachometer signal provided by the tachometer 142 and a transducer rotation velocity command input provided by the system controller 132. Appropriate comparison logic included in the transducer controller 112 is responsive to these inputs to provide rotational drive to the transducer transport mechanism 116 to maintain the velocity of rotation of the transducer 20 at the desired commanded velocity. Similarly, comparison logic included in the transport controller 110 functions to maintain the velocity of transport of tape 42 at the desired command velocity determined by comparison of a tape transport velocity command input provided by the system controller 132 with a tachometer rate signal provided by the tape tachometer 140. Any deviation of the velocity of transport of the tape 42 is corrected by the transport controller 110 adjusting the drive provided to the tape transport mechanism 114 to bring the velocity of tape transport into agreement with the commanded velocity.

In the foregoing manner, relative motion between the transducer 20 and record medium 42 is controlled to maintain registration between the transducing zone 56 and the desired path 126 along the record medium as information signals are transferred between the record medium 42 and transducer 20. For example, during a recording operation, information signals received from an external signal source 146 are processed into the proper channel code by the information signal processor 122 and thereafter coupled by the communication link 129 to the transducer 20 for recording on the record medium 42. During a reproducing operation, recorded information signals are reproduced from the record medium by the transducer and coupled by the communication link 129 to the information signal processor 122 for processing into the channel code required by an external signal utilization device 146. Faithful transfers of information signals will be performed by the aforedescribed apparatus, as long as transducing zone to desired path registration is not lost as a result of the occurrence of instabilities in relative motion that exceed the capabilities of the position and velocity servomechanisms associated with the transport mechanisms 114 and 116 to correct deviations of the actual relative motion condition from the command condition. However, such servomechanisms depend on the use and control of mechanical displacements of the record medium 42 and/or rotating transducer 20 to effect such corrections. As described generally hereinbefore, such tracking control techniques are unable to eliminate all objectionable mistracking.

In accordance with a particularly salient feature of the present invention, reliance on the control of mechanical displacement to achieve transducer to record medium tracking control is avoided through the use of a magnetic transducer 20 which enables magnetic control of the location of the transducing zone 56 relative to the desired path 126 along the record medium 42. More specifically, and with reference to FIG. 2, the transducer 20 has a body 202 of magnetically permeable material including magnetic core portions 21 and 22 with confronting poles 27, 28 thereof defining a transducing gap 26 therebetween of selected length, L, and selected width, W, dimensions. Pursuant to the present invention, the width dimension, W, is made longer than the desired width dimension, W3, of the transducing zone 56 to permit magnetically controlled movement of the transducing zone along the gap 26 for transducer to record medium controlled tracking. As will be described in further detail hereinafter, the controlled movement is effected through selective magnetic saturation of a region within the body 202 of magnetically permeable material that enables a selected segment or zone 56 of the gap to transfer information signals between the record medium 42 and a transducing signal winding 25. A transducing winding window 24 is provided within the body 202 to accommodate the winding 25 so that it is allowed to interact with magnetic flux supportable by the body and thereby convert information signals represented by the same into electrical signals, and vice versa.

The transducing gap 26 is defined by a spacer of nonmagnetic material, for example, silicon dioxide or glass, sandwiched between the confronting surfaces of poles 27, 28 in a manner conventional in the art. When an electrical signal representative of desired information is applied to the transducing winding 25, for example, from a signal source coupled to the winding by the communication link 129 (FIG. 1), for recording such information on a magnetic storage or record medium, such as tape 42, a magnetic field is formed within the transducer body as represented by flux lines 16 containing the information. The magnetic field is emitted from the faces of the core portions adjacent the enabled transducing zone 56 within the transducing gap 26, in the form of a fringing flux which engages the tape 42. The tape is shown in FIG. 2 as transparent to reveal a portion 41 of the transducer 20 which confronts the tape and which portion will be further referred to as face 41. It is this face of the transducer body which is sufficiently close to the medium 42 to interact magnetically with the same under typical operating conditions, although, of course, most interaction occurs at the edge of the core portion immediately adjacent gap 26 at the downstream side of the gap relative to the direction of relative motion between the transducer 20 and record medium 42. While in the arrangement being described, this face is rectangular in shape, other shapes can be effective under the same or different conditions. Moreover, although the boundaries of face 41 coincide with physical transducer edges, it is possible that the "face" of a transducer which will interact magnetically with a record medium may be different in size or shape from the transducer surface(s) which directly or indirectly confront such medium. The fringing flux impresses on tape 42 a magnetic pattern corresponding to the signal in the winding 25. By advancing the magnetic tape 42 past the transducing gap 26, for example, in the direction of arrow 43, a changing magnetic signal pattern will be recorded along the tape.

When transducer 20 is utilized to reproduce a signal previously recorded on tape 42, the flux emanating or fringing from the moving tape 42 engages the gap 26 and is picked up by the enabled transducing zone 56 for coupling to the transducing signal windings 25. The transducer 20 changes the magnetic flux 16 traversing the transducing windings 25 into an electric signal that is proportional to the recorded flux.

In accordance with the present invention, the selected segment or transducing zone 56 is obtained through controlled saturation of portions within the magnetic cores 21 and 22 that leaves a selected segment of the transducing gap 26 capable of magnetically coupling the record medium 42 and transducing signal winding 25 through unsaturated portions within the cores. To enable such control, the magnetic transducer 20 is configured to form a magnetic circuit extending between the signal winding 25 and the transducing gap 26 having a reluctance gradient extending in the direction of the width dimension, W, of the transducing gap. This reluctance gradient is established by progressively varying one or more of the following characteristics of the transducer in the direction of the width, W, of the transducing gap: the saturation flux density of the core material; the area of the cross section through which the control flux flows; and the length of the path through which the flux flows. Each of the latter two of the characteristics determines the permeability of the core material. Embodiments of the magnetic transducer 20 utilizing variance of each of these characteristics to obtain the desired reluctance gradient will be described in the following. Regardless of how the desired reluctance gradient is established, however, the magnetic transducer 20 is coupled to a saturation control means included within the transducer controller 112 (FIG. 1) for establishing a selected control flux within the magnetic circuit between the signal winding 25 and the transducing gap 26 that saturates portions of the magnetic circuit while leaving other selected portions unsaturated to enable a selected segment or zone 56 of the gap to magnetically couple the signal winding 25 and record medium 42. Embodiments of the saturation control means will be described in detail hereinafter with reference to the control of the location of the transducing zone 56 of magnetic transducer 20 relative to the desired path to maintain tracking registration. However, any saturation control means can be employed that is able to couple magnetic flux selectively to the magnetic circuit extending between the signal winding 25 and transducing gap 26 and is capable of varying the coupled flux in a manner that effects movement of the transducing zone 56 along the gap 26.

In the embodiment of the magnetic transducer 20 illustrated in FIG. 2, the desired reluctance gradient is established by varying the width dimension along a length of each of the magnetic cores 21, 22. This variation is in the direction corresponding to the width, W, of the gap 26, with the gradients defined by the varying width dimensions of the two magnetic cores 21, 22 extending in opposite directions in the two cores. The varying width dimensions are conveniently obtained by constructing the magnetic transducer 20 from a plurality of magnetically permeable planar laminations 200 stacked together in planar juxtaposed alignment, with non-magnetic conductive layers 201 interposed between adjacent magnetic laminations. The stacked magnetic laminations 200 and non-magnetic conductive layers 201 are joined together, for example, by conventional bonding techniques to form a unitary body or structure 202. The stacked magnetic laminations 200 and non-magnetic conductive layers 201 define a magnetic circuit that includes a plurality of magnetically isolated flux paths defined by the magnetic laminations between the transducing gap 26 and signal winding 25. Magnetic isolation is provided by virtue of the presence of the non-magnetic conductive layers 201 interposed between the magnetic laminations 20 that define high reluctance paths between adjacent magnetic laminations. Being conductive, the layers 201 also serve to reduce eddy current effects Each magnetic lamination 200 has two side core portions 203 and 204 joined at one of their ends by a back core portion 206, about which is wound the signal winding 25. The opposite ends of the side core portions are joined to front core portions 207 and 208, respectively, that are separated at the transducing gap 26. Each magnetic isolation layer 201, on the other hand, preferably extends through the transducing gap 26 without interruption to maintain magnetic isolation between the magnetic flux paths defined by adjacent magnetic laminations 200 In other respects, however, each layer 201 has a configuration corresponding to that of the adjacent magnetic laminations. As can be appreciated by reference to FIG. 2, the plurality of magnetic laminations are stacked with the separations at their front core portions 207 and 208 aligned along the width, W, of the gap 26 to form a separate transducing zone for the magnetic circuit defined by each magnetic lamination 200.

The desired reluctance gradient is conveniently obtained in the construction of the embodiment of FIG. 2 by varying the widths of the two side core portions 203 and 204 of the magnetic laminations 200 in a complementary manner in the direction corresponding to the width, W, of the gap 26. More specifically, the side core portions 203 at one side of the gap 26 progressively change in size of width through a selected range in one direction through the core portion 21 formed thereby, while the side core portions 204 at the other side of the gap progressively change in size of width through the range in the opposite direction through the core portion 22 formed thereby. In the illustration of the embodiment in FIG. 2, the side core portions 203 of the magnetic laminations progressively increase through the core portion 21 from a minimum width to a maximum width while the associated side core portions 204 of the magnetic laminations progressively decrease through the core portion 22 from the maximum width to the minimum width. In this manner, the side core portions 203 and 204 of the stacked magnetic laminations 200 define oppositely extending reluctance gradients through the two core portions 21 and 22, respectively. Magnetic saturation of a body of magnetic material is an inverse function of its reluctance. Therefore, constructing the magnetic transducer 20 to have reluctance gradients extending through its two core portions 21 and 22 in the direction of the width, W, of the gap 26 permits selective saturation along the width dimension of the magnetic transducer by the appropriate application of magnetic control flux to the core portions 21 and 22. Moreover, by varying the level of control flux applied, the number of adjacent side core portions 203 and 204 saturated can be varied selectively, with the side core portions of smaller width saturating at lower levels of applied control flux. For example, increasing the control flux progressively from a level that saturates the side core portion of smallest width causes progressive saturation of side core portions of progressively increasing width. Because the reluctance gradients extend in opposite directions through the two core portions 21 and 22, the application of progressively changing levels of magnetic control flux to the core portions causes the magnetic saturation of the stacked side core portions 203 and 204 to progress in opposite directions through the two core portions in the direction of the width, W, of the gap 26, with the direction of changing control flux level determining the direction of saturation progression through the core portions.

To define a selected transducing zone 56 for coupling the magnetic transducer 20 to the magnetic record medium 42, the magnetic saturation of the core portions is controlled so that only side core portions 203 and 204 within a selected width segment of each of the core portions 21 and 22 are saturated while other side core portions outside the selected width segment remain unsaturated. Magnetic saturation of a side core portion of a magnetic lamination 200 increases the reluctance of the magnetic circuit defined by the lamination, because the saturated side core portion is incapable of conducting additional magnetic flux. Consequently, all laminations 200 within the selected width segment of each of the core portions 21 and 22 that are saturated are prevented from coupling magnetic flux between the signal winding 25 and the width segments of the transducing gap 26 formed between the front core portions 207 and 208 of the saturated laminations 200. However, control of the magnetic saturation is exercised so that at least both side core portions 203 and 204 of at least one of the magnetic laminations 200 remain unsaturated and, thereby, define a low reluctance magnetic circuit path between the signal winding 25 and, for example, the segment 56 of the gap 26 illustrated in FIG. 2. As a result, a particular width segment of the transducing gap 26 is enabled to form a transducing zone 56 for transferring information signals between the magnetic record medium 42 and the signal winding 25. Moreover, as will be described in further detail hereinafter, the enablement of a particular width segment of the transducing gap 26 can be controlled through appropriate controlled manipulation of the magnetic saturation of the two core portions 21 and 22 to effect movement of the enabled width segment along the width, W, of the transducing gap 26 and, thereby, maintain registration between the transducing zone 56 and a selected path 126 (FIG. 1) along the magnetic record medium 42.

In the magnetic transducer embodiment of FIG. 2, controlled saturation of the core portions 21 and 22 is achieved electromagnetically by applying control currents I1 and I2 to a pair of control windings 38 and 39, respectively, threaded through the stacked side core portions 203 and 204 via respective winding apertures 31 and 32 provided therein. Because of the varying widths of the side core portions 203 and 204, the side core portions of each core portion 21 and 22 present a correspondingly varying reluctance gradient defining cross section area to the magnetic control flux induced in them by the passage of the control currents I1 and I2 through the control windings 38 and 39.

Each of the control windings 38 and 39 is coupled to a current source type saturation control means included within the transducer controller 112 (FIG. 1). Upon application of current to a control winding 38 or 39, magnetic control flux is induced in each side core portion 203 or 204 through which the winding is threaded. The magnitude of the applied control current determines the amount of control flux induced in each of the threaded side core portions, and for a stack of side core portions of a given range of widths, a range of control current magnitudes is selected to effect selective saturation of the stack of side core portions 203 or 204 threaded by the same control winding 38 or 39 carrying the control current. The range is selected so that the smallest control current magnitude within the range does not cause magnetic saturation of any of the side core portions of the stack, whereas the largest control current magnitude causes magnetic saturation of all side core portions within the stack.

Selective enablement of a particular width segment of the transducing gap 26 for effecting the transfer of information signals between the signal winding 25 and the magnetic record medium 42 is accomplished by coupling a first control current I1 of selected magnitude to one of the control windings 38 or 39. The magnitude is selected to effect magnetic saturation of the side core portions 203 or 204 within a selected width segment of the core portion 21 or 22 threaded by the winding. A second control current I2 is coupled to the other of the control windings and has a magnitude selected to effect magnetic saturation of the side core portions within a selected width segment of the other of the core portions threaded by the other winding. The magnitudes of the two control currents I1 and I2 are selected so as to leave side core portions 203 and 204 of at least one of the stacked magnetic laminations 200 magnetically unsaturated. Each magnetic lamination or laminations 200 having side core portions 203 and 204 remaining magnetically unsaturated defines a low reluctance magnetic circuit path through the unsaturated side core portions between the signal winding 25 and a width segment of the gap 26 formed between the front core portions 207 and 208 of each such lamination. In effect, this establishes a transducing zone 56 and associated magnetic circuit that is able to couple information signals between the magnetic record medium 42 and the signal winding 25.

To move the width segment or transducing zone 56 in the direction of the width, W, of the gap 26, the saturation control means changes the magnitudes of the two control currents I1 and I2 inversely. This inverse change in the magnitudes of the two control currents I1 and I2 changes the number of saturated side core portions, 203 and 204 in each of the core portions 21 and 22 hence, the widths (in the direction of the dimension W) of saturated regions within the respective core portions. Moreover, because the control current magnitudes are changed inversely, the widths of the saturated segments within the core portions 21 and 22 are changed in opposite directions in the direction of the width, W, of the gap 26. To maintain the width, W3, of the transducing zone 56 constant, the sum of the magnitudes of the two control currents I1 and I2 is maintained constant, although their individual magnitudes are changed.

As will be described in further detail hereinbelow, changing the magnitudes of the control currents I1 and I2 is exercised in accordance with the present invention to move the transducing zone 56 according to deviations of the zone from the selected path 126 (FIG. 1) and, thereby, maintain registration between the zone and the selected path. Furthermore, in accordance with a particularly salient feature of the present invention, this change in the magnitudes of the control currents is controlled in response to sensed deviations of the transducing zone 56 relative to the selected path 126. To effect such control, a sensing means 150 is operatively linked to the transducer 20 to detect deviations of the transducing zone 56 from the selected path 126. Representations of the detected deviations are coupled to the saturation control means included in the transducer controller 112, which responsively changes the magnitudes of the control currents I1 and I2 provided to the control windings 38 and 39 of the transducer 20 to effect movement of the transducing zone 56 in a direction along the width, W, of the transducing gap 26 productive of correcting the detected deviations and, thereby, maintain registration between the transducing zone 56 and the selected path 126. As should be appreciated from the description of FIGS. 1 and 2, maintenance of proper transducer to record medium tracking registration is achieved in accordance with the present invention by the cooperation of a transducer 20 defining a transducing zone 56 that is moveable along a transducing gap 26 by magnetic control means and a transducer controller that effects control of such movement to correct deviations in the tracking registration Furthermore, this cooperation achieves maintenance of proper tracking registration without reliance on mechanical displacement of control mechanisms. As a result, the deleterious effects characteristic of tracking control techniques previously employed in magnetic record and/or reproduce apparatus are avoided.

While the method and apparatus of the present invention has been thus far described with reference to a particular embodiment of transducer 20 and an electromagnetic technique of selecting and controlling the location of the transducing zone 56 therein, other embodiments of transducer 20 and control may be used. For example, the electromagnetic saturation control means can be replaced by a magnetic saturation control means. In a magnetic saturation control means, control flux is coupled to the transducer 20 by a magnet, which provides a controlled magnitude of flux that is directable to saturate selected regions, such as side core portions 203 and 204 (FIG. 2) of the transducer 20. Also, the preferred reluctance gradient of the body of magnetically permeable material of the transducer 20 can be established at other locations within the body between the transducing gap 26 and signal winding 25 besides at the side core portions as in the transducer embodiment of FIG. 2, and by variation of other magnetic characteristics of the body besides the magnetic flux threading cross section area as in the transducer embodiment of FIG. 2. As will be described further with reference to other embodiments of the transducer 20, the preferred reluctance gradient can be established through variation of the saturation flux density of the body of magnetically permeable material forming the transducer 20 or variation of the magnetic flux path length of the body. Furthermore, constructing the magnetic transducer 20 and arranging the saturation control means to enable selected saturation of regions or portions at the face 41 (FIG. 2) of the transducer, rather than at locations away from the face as in the transducer embodiment of FIG. 2, has the advantage of avoiding objectionable cross talk effects possible in the transducer embodiment of FIG. 2. Such cross talk is made possible in the transducer embodiment of FIG. 2 by virtue of the unsaturated face 41 portions of laminations 200 having saturated side core portions 203 and 204. During recording operations, for example, these face portions are susceptible to being linked by stray magnetic flux originating at portions of face 41 associated with laminations 200 having selected unsaturated side core portions 203 and 204, which stray flux is coupled to and recorded on the record medium 42 at locations other than the selected path 126. Of course, the recording of such stray flux can introduce noise to or otherwise degrade information signals recorded at the other locations. Also, such face portions can lead to degrading of information signals being reproduced by the selected transducing zone 56. Such degrading results because the unsaturated face portions at locations other than those at either side of the selected transducing zone 56 are able to link to the selected transducing zone fringing flux that originates at locations on the record medium 42 other than the selected path 126.

The laminated construction of the embodiment of the transducer 20 illustrated in FIG. 2 imposes an additional limitation in its use for tracking registration control in accordance with the present invention, namely, being able to effect movement of the transducing zone 56 in increments along the width, W, of the transducing gap 26 determined by the thicknesses of the magnetic laminations 200 and interposed nonmagnetic conductive layers 201. As will be described further hereinafter, other embodiments of the transducer 20 not susceptible to the aforementioned objectionable cross talk effects permit use of unlaminated, continuous bodies of magnetically permeable material that enable the transducing zone 56 to be moved and located anywhere along the width, W, of the transducing gap 26. This feature has the advantage of enabling maintenance of precise registration between the transducing zone 56 and the selected path 126 (FIG. 1) along the magnetic record medium 42. This advantage is particularly important in applications involving the recording and reproducing of high frequency, wideband information signals with respect to narrow tracks along the record medium An embodiment of transducer 20 that avoids objectionable cross talk and enables the transducing zone 56 to be located and moved anywhere along the width, W, of its transducing gap 26 will now be described with reference to FIGS. 3-7. More particularly, the construction of the transducer embodiment illustrated in FIGS. 3-7 permits the transducer face 41 to be selectively saturated adjacent the transducing gap 26 on opposite sides of the same, as is shown by cross-hatched saturated regions 57, 58 in FIGS. 3 and 4. The saturated regions 57, 58 define respective adjacent highly permeable unsaturated portions or regions 40, 46 on opposite sides of the transducing gap 26. At least parts of each of the portions 40, 46 are opposite one another at the gap to define a highly permeable transducing zone or segment 56 of a width, W3, extending across the gap 26. (It is seen from FIG. 3 that the width, W, of the entire transducing gap 26, W1+W2+W3, equals a constant.)

Saturation of regions 57, 58 while retaining regions 40 and 46 unsaturated, preferably is achieved by controlling several interdependent factors. These factors include the core material and the make-up (material, configuration, etc.) of the transducer body 202, and the means of coupling magnetic control flux to effect selective saturation of the body 202. This coupling means is represented schematically in phantom at 8 and 9, each coupling respectively to one core portion 21, 22 magnetic control flux in a manner which will be further described in more detail. In embodiments employing electromagnetic techniques to effect the selective saturation, the coupling means are in the form of current carrying windings 8 and 9 linked to the core portions 21 and 22. Each of these windings 8, 9 carry a control current I1, I2 to induce a control flux 47, 48 in each core portion 21, 22. The locations of the windings and the magnitudes of the control currents I1, I2 are selected such that the flux induced thereby saturates the regions 57, 58 in each core half or portion as mentioned previously and as shown by cross-hatched areas in FIGS. 3 and 4, while retaining regions 40 and 46 unsaturated. Preferably, the control currents are selected to prevent control flux from crossing the transducing gap 26 or otherwise flowing from one core portion to the other.

By increasing the magnitude of one control current, for example I1, while proportionally decreasing the magnitude of the other control current I2, the respective widths W1, W2, are changed proportionally and the transducing segment or zone 56 selectively moved along the width, W, of the transducing gap 26. For example, to move the transducing segment 56 at a high speed along the transducer width, W, a saturation control circuit is utilized which changes inversely the magnitudes of both currents I1, I2, thereby changing the widths W1, W2 of the saturated portions 57, 58. To maintain a constant width W3 during such movement, a constant sum of the changing control currents is maintained, that is I1+I2 equals a constant.

As seen from FIG. 3, the transducing flux path 16 extends around the winding window 24 and intercepts the transducing winding 25. The control flux preferably should not magnetically couple to the transducing winding. If the control flux lines 47, 48 extend generally in parallel planes with respect to the transducing flux 16 as shown, the respective magnitudes of the control currents are selected such that the resulting control fluxes 47, 48 are confined to their respective core portions 21, 22 and, thereby, do not link with the transducing winding 25. Through appropriate control of the widths W1, W2, various modes of operation can be achieved. For example, the location of the transducing zone 56 can be repositioned with a desired high accuracy to predetermined discrete locations relative to a desired path 126 (FIG. 1) along the magnetic medium 42 to maintain registration between the transducing zone 56 and the desired path.

It should be understood from the above description, one region of the face of the transducer 20 is saturated adjacent the transducer gap 26 while another region in proximity of the transducing gap is retained unsaturated. Consequently, susceptibility to pick-up at the face of crosstalk or stray flux by the face 41 of the transducer 20 is virtually eliminated.

To obtain high quality performance by a transducer 20 embodiment of the kind illustrated in FIGS. 3-7, a well defined boundary between adjacent saturated and nonsaturated areas of the cores 21, 22 is desirable. The foregoing is obtained by selecting an appropriate material for the transducer body 202 as discussed below, and by arranging and configuring the confronting magnetic core portions and control windings in such a way that a maximum rate of change in permeability between adjacent cross-sectional areas of each transducer core portion is obtainable across the transducer width, W. The foregoing assures that while a selected area at the face of each core portion is saturated by a control current so that no appreciable flux passes therethrough, an immediately adjacent contiguous area remains sufficiently permeable to transfer information signals. Consequently, the performance of the transducer 20 depends on the steepness of a permeability versus control flux density gradient between the adjacent saturated and non-saturated regions within each core portion.

As an example, FIG. 8 shows a well known permeability, m, versus flux density, B, characteristic of a suitable magnetic core body material, for example, ferrite PS52B made by Ampex Corporation. As seen in FIG. 8, a relatively high permeability, m, greater than 400, is obtainable with a flux density, B, below $B1=4000$ Gauss, which high permeability is sufficient for a desired transducing operation. The saturation flux density of that material is approximately $B2=6000$ Gauss, corresponding to a permeability below 100, as shown in FIG. 8. Essentially, no transducing, cross-talk or stray flux can be picked up by the material when it is at such low permeability, or high reluctance level. Consequently, to obtain a desired rapid transition between a highly permeable, or unsaturated region and an adjacent saturated region within the transducer core, the permeability must change rapidly from below 100 to over 400 in either direction, as seen in FIG. 8.

Now, a preferred embodiment of the magnetic transducer 20 in which the locations of the saturated and unsaturated portions 57, 58 and 40, 46, respectively, are controlled electromagnetically will be described in detail with reference to FIG. 5. A magnetic transducer 20 has two corresponding magnetic core portions 21, 22 having confronting poles 27, 28 abutting at smoothly lapped and polished surfaces defining transducing gap plane 23. A winding window 24 is provided in one or each core portion 21, 22 to accommodate transducing windings 25. A suitable nonmagnetic spacer material is provided between the pole faces 27, 28 to obtain a transducing gap 26, utilizing conventional transducing gap forming techniques. A transducer face 41, facing a magnetic record medium, for example tape 42 (FIG. 1), extends in a plane substantially perpendicular to the gap plane 23. The transducer may be contoured, if desired, as shown by dashed lines 18, to obtain a desired contour and transducing gap depth respectively, utilizing well known contouring techniques.

In accordance with an important feature of the embodiment of FIG. 5, apertures 31, 32 are provided in each corresponding core portion 21, 22, respectively. These apertures extend across the entire width, W, of transducer 20 at respective selected angles to both the transducing gap plane 23 and to the face 41 of the transducer. Control windings 38, 39 are threaded through the apertures of the core portions 21, 22 whereby control winding parts 51, 52 extend through core portions at the angle defined by the control winding apertures 31, 32.

In the preferred embodiment of FIG. 5, core portions 21, 22 are manufactured as two identical core halves, for example, from a block of magnetic ferrite material such as ferrite PS52B or single crystal ferrite. The apertures 31, 32 are obtained by diamond drilling through the width of each core half, that is, from upper lateral surfaces 33, 34 to the opposite lower surfaces 36, 37, respectively. The surfaces of each core half 21, 22 defining the gap plane 23 are smoothly lapped and polished. A suitable nonmagnetic transducing gap forming spacer material, such as glass, is provided on the surface of one or both core portions coincident with the gap plane 23 by, for example, sputtering in a vacuum. The thusly prepared core halves 21, 22 are assembled by rotating one core half with respect to the other by 180° so that the upper and lower surfaces thereof are reversed, to obtain confronting core portions with an inversely symmetrical arrangement of control winding paths through the core portions provided by the winding apertures 31, 32 with respect to intersecting gap and transducer face planes 23 and 41, respectively. Thus, in the assembled transducer 20, the control winding apertures 31, 32, hence, the control windings themselves extend in an oppositely oriented angular relationship with respect to both the transducing gap plane 23 and the transducer face plane 41. Utilizing well known bonding techniques, the assembled core halves are glass-bonded together at the transducing gap plane 23 to obtain the transducing gap 26.

Alternatively, confronting core portions 21, 22 could be provided by a common solid block of magnetic material. In that case, a slot of a desired width corresponding to transducing gap length is provided inwardly of face 41 by, for example, grinding into the solid block. The slot is subsequently filled with a suitable nonmagnetic gap spacer material to form a well defined transducing gap 26. The winding window 24 and control winding apertures 31, 32 are then obtained by drilling across the transducer width utilizing known drilling techniques.

As will be described in more detail below, control windings 38, 39 serve to carry control currents I1, I2 for differentially saturating selected portions of each core portion 21, 22 at the transducer face 41 to obtain magnetically saturated face regions and an unsaturated highly permeable transducing zone 56 extending along a segment of the transducing gap 26, as has been described before with respect to FIGS. 3 and 4. In the preferred embodiment, the control currents I1, I2 are varied differentially to effect the movement of a transducing zone or segment 56 of a constant width, W3, along the width, W, of the transducing gap 26. In this manner, registration between the transducing zone 56 and a selected path 126 along a record medium 42 (FIG. 1) is maintained as information signals are recorded or reproduced with respect to the selected path.

FIG. 6 shows a more detailed schematic representation of the embodiment of the transducer 20 described with reference to FIGS. 3-5. Two pairs of imaginary planes 44, 45 and 59, 60 are shown as being respectively superposed with the longitudinal axis of the winding apertures 31, 32, respectively. Planes 44, 45 are parallel and intersect upper and lower lateral surfaces 33, 34 and 36, 37, respectively, along lines parallel with the transducing gap plane 23. Planes 59, 60 intersect these lateral surfaces along lines perpendicular to the transducing gap plane 23.

It is seen from FIG. 6 that the imaginary planes 44, 45, 59, 60, lateral surfaces 33, 34, 36, 37, gap plane 23 and the plane defined by transducer face 41 form two oppositely oriented wedge sections 49, 50, on opposite sides of the transducing gap 26. These wedge sections represent portions of magnetic cores 21, 22 to be selectively saturated differentially by the control currents I1, I2 to thereby define a desired transducing zone 56.

FIG. 7 is an enlarged perspective view of one wedge section 50. Since both oppositely oriented wedge sections are substantially identical, the following description related to wedge section 50 also generally applies to wedge section 49. It is seen from FIG. 6 that edge 30 of wedge section 50 in FIG. 7 is defined as an intersection of imaginary planes 45, 60. For a given width, W, of the transducing gap 26, wedge section 50 can be imagined as being divided into parallel cross-sectional areas L1 to Ln, which extend perpendicularly to both planes defined by the transducing gap plane 23 and the face 41 of the transducer 20 and have gradually increasing surface areas along the width, W, of the transducing gap 26. It is understood that the oppositely oriented wedge section 49 (not separately shown) of transducer 20 will have corresponding cross-sectional areas gradually increasing in the opposite direction.

With further reference to FIGS. 6 and 7, when a control current I2 is applied to the control winding 39, it induces in the core portion 22 a corresponding magnetic control flux represented by flux lines 48 extending around the winding portion 52. Because the highly permeable core portions 21, 22 have a low reluctance relative to that of the transducing gap 26, control flux lines 48 tend to be confined within the bodies forming the core portions and do not extend across the transducing gap 26 to link the transducing windings 25. This minimizes interference between the control flux and the transducing signal flux within the transducer 20.

To assure proper movement of the transducing zone 56 along the width of the transducer 20, the values of the oppositely changing control currents I1, I2 are selected such that the control fluxes 47, 48 induced thereby saturate in succession the continuously changing cross sectional areas L1 to Ln of the respective oppositely oriented wedge sections 49, 50 within each magnetic core half 21, 22. For example, when a gradually increasing control current I2 is applied to the control winding 39, the cross-sectional areas L1 to Ln shown in FIG. 7 become gradually saturated from the smallest to the largest area, in direct proportion to the increasing amplitude of the control current I2. By increasing the control current in one control winding while decreasing the control current in the other control winding by a corresponding amount, different respective portions of the oppositely oriented wedge sections 49, 50 become differentially saturated and unsaturated, which results in the movement of the transducing zone 56 along the gap 26. By changing the control currents in accordance with deviations in the path traced by the transducing zone 56 relative to a selected path 126 along the record medium 42 (FIG. 1), the transducing zone 56 is moved along the width of the transducing gap 26 to effect compensation for the deviations and, thereby, maintain the transducing zone 56 of the transducer registered with the selected path. In the preferred embodiment of FIG. 6, the sum of the differentially changing currents I1+I2 is maintained constant to obtain a constant width W' of the transducing zone 56 at the transducer face 41, as previously described. It is understood from the foregoing description that the permeability of the saturated regions is approximately equal to that of air, therefore providing a high reluctance, while the overlapping unsaturated portions have a relatively high permeability desired for transferring information signals with respect to the record medium.

FIG. 10 shows an example of two superposed flux density versus permeability characteristics 53, 53a, each corresponding to the characteristic of FIG. 8 and each pertaining to one of the oppositely oriented wedge sections 49 and 50 (FIG. 6). FIG. 9 is a schematic front view representation of wedge sections 49, 50 of FIG. 6 rotated by 90 degrees. The cross-hatched areas 57, 58 represent the saturated regions, that is, core portions having a permeability less than 100 and, therefore, a high reluctance. The other core portions in FIG. 9 represent unsaturated highly permeable areas 40, 46 having a permeability over 400, consequently a desired low reluctance. The magnetically permeable zone which extends across the transducing gap 26 to define the transducing zone 56 and which is formed by the overlapping unsaturated highly permeable regions 40, 46, corresponds to overlapping portions of superposed characteristics 53, 53a, which portions indicate a permeability change between 100 and 400. From FIGS. 9 and 10, it is seen that a well defined transducing zone 56 preferably has a permeability versus flux density gradient as sharp as possible. This can be obtained by selecting a transducer core material with a steep characteristic curve and by designing the wedge section such that large flux density changes are achievable between adjacent cross-sectional areas along the entire width, W, of the transducing gap 26. To further increase the permeability gradient, a magnetic core material is preferably used having a magnetic anisotropy and oriented with an easy axis of magnetization perpendicular to the transducing gap plane. Such materials provide a difference in reluctance through the body formed therefrom that facilitates the formation of preferred magnetic circuit paths between the transducing gap 26 and signal winding 25.

To facilitate the formation of a well defined transducing zone 56, it is preferred the apertures 31, 32 within core halves 21, 22 be arranged such that substantially square cross-sectional areas L1 to Ln are obtained throughout the wedge sections 49 and 50 (FIGS. 6 and 7). The foregoing assures that the wedge sections, including at the face 41 of the transducer 20, will be saturated without saturation of core portions which are remote from the face regions. Also, this minimizes control current values necessary to obtain saturation.

To further maximize the flux density gradient between two adjacent cross-sectional areas, it is preferable to approximate the shape of the wedge sections to that of the negative slope portion of the permeability versus flux density characteristic illustrated in FIG. 8, that is, to obtain exponentially increasing cross sectional areas L1 to Ln of the wedge sections 49, 50. The foregoing can be obtained with apertures 31, 32 that extend through the cores 21, 22 along exponential paths.

FIG. 11 is a schematic diagram of an embodiment of a saturation control means 54 utilized to drive the control windings 38, 39 of transducer 20 to control the position of a transducing zone 56 at face 41 along the width W of the transducer 20 and, thereby, to compensate for deviations in the path traced by the transducing zone 56 relative to the selected path 126 of the record medium 42 (FIG. 1). The saturation control means of FIG. 11 is an electrical circuit that utilizes a controllable voltage source 61 generating an adjustable control voltage Vc. Voltage Vc is converted by the circuit of FIG. 11 into differentially changing control currents I1, I2 as follows. The adjustable output voltage Vc provided by voltage source 61 is applied via a resistor 62 to an inverting input of a first operational amplifier 63, which has a feedback resistor 64 and is arranged as a voltage follower. The output of amplifier 63 is connected via a further resistor 65 to an inverting input of a second operational amplifier 66 which has a feedback resistor 67. Amplifier 66 inverts the output signal of amplifier 63. The output of first amplifier 63 is also connected via a resistor 68 to an inverting input of a third operational amplifier 69 having a feedback resistor 70. The output of second amplifier 66 is connected via a resistor 71 to an inverting input of a fourth amplifier 72 having a feedback resistor 73. An adjustable potentiometer 74 is connected between a source of negative DC voltage and ground to obtain a control current offset Io. The output of potentiometer 74 is connected via a resistor 75 to the inverting input of third amplifier 69 and via a resistor 76 to the inverting input of fourth amplifier 72, respectively.

The output of the third amplifier 69 is connected to the previously described first control winding 38 of transducer 20, which in turn is connected via feedback resistor 70 to the inverting input of amplifier 69. Similarly, the output of the fourth amplifier 72 is connected to the previously described second control winding 39 of transducer 20, whose second terminal is connected via feedback resistor 73, to the inverting input of amplifier 72. The connection between control winding 38 and resistor 70 is grounded via a resistor 77. Similarly, the connection between control winding 39 and resistor 73 is grounded via a resistor 78. The respective non-inverting inputs of all four operational amplifiers 63, 66, 69 and 72 are grounded. The amplifiers 69, 72 and respective resistors 70, 77 and 73, 78 represent first and second current sources, respectively.

In operation, the output voltage Vc provided by the source 61 is applied via voltage follower 63, 64 to a first current source 69, 70, 77, which applies to the first control winding 38 a control current I1 directly proportional to the output voltage Vc provided by the source 61. The voltage obtained at the output of amplifier 63 and inverted by the inverter 66, 67 is further applied to the second current source 72, 73, 78, which applies to the second control winding 39 a control current I2 inversely proportional to the voltage Vc provided by source 61. The potentiometer 74 connected to a negative DC voltage sets a desired control current offset Io, which in the presently described embodiment is half way between the minimum and maximum control current values, that is Io=(Imax+Imin)/2, as will be described below in more detail with reference to FIG. 12.

It follows from the foregoing description that when the amplitude of the output voltage Vc provided by the source 61 is changed within the range of Vcmin and Vcmax as shown in the diagram of FIG. 12, circuit 54 converts the thusly changed control voltage into correspondingly changed control currents I1, I2 obtained at the respective outputs of the first and second current sources, respectively. In the saturation control circuit embodiment illustrated in FIG. 11, the output currents I1, I2 change linearly. The control currents I1, I2, thus change differentially, that is in opposite sense with respect to each other, while changing substantially in linear proportion to the voltage Vc, as depicted in FIG. 12 and defined by the following equations:

$$I1 = KVc + Io \quad (1)$$

$$I2 = -KVc + Io \quad (2)$$

where K and Io are constants dependent on the parameters of the circuit of FIG. 11 and can be derived therefrom.

With further reference to the previously described preferred embodiment of the transducer 20 illustrated in FIG. 6, currents I1, I2 induce magnetic flux in the magnetic core portions surrounding the control winding portions 51, 52 extending therethrough. The control currents I1, I2 are utilized to saturate selected volumes of the magnetic core portions 21, 22 containing their respective face portions 41 to obtain the saturated face regions (such as region 57 and 58 shown in FIG. 9) and an unsaturated highly permeable transducing zone (such as zone 56 shown in FIG. 9) in accordance with the present invention, as described below.

It is seen from the characteristic of FIG. 12, that by changing the control voltage from −Vcmin to +Vcmax, the control current value I1 changes from Imin to Imax, where Imax is selected below the saturation current level Isat. With reference to FIGS. 6, 7 and 12, Isat corresponds to a current value which is sufficient to saturate all the cross-sectional areas L1 to Ln, that is an entire wedge section 49 or 50 (FIGS. 6 and 7), without leaving an unsaturated area therein. Since it is necessary to assure that an unsaturated area will remain for obtaining a transducing zone 56 (FIG. 6), the maximum control current Imax is selected below the saturation current level Isat.

Referring now to FIGS. 1 and 11, the voltage source 61 is controllable to enable controlled movement of the transducing zone 56 along the width of the transducing gap 26 and, thereby, maintain registration between the transducing zone 56 and the selected path 126 along the record medium 42 in the presence of instabilities that tend to cause a deviation between the path traced by the transducing zone and the selected path. More specifically, the voltage source 61 includes a voltage supply 220 capable of furnishing a voltage equal to the sum of the magnitudes of Vcmax and Vcmin, i.e., |Vcmax|+|Vcmin|. The voltage supply 220 is referenced to ground potential at a center tap 221. This enables provision to the saturation control circuitry of a voltage, Vc, within the range defined by negative voltage, −Vcmin, and positive voltage +Vcmax, centered about a voltage of zero and, thereby, generation of the control currents I1, I2 that determine the location of the transducing zone 56 along the width of the transducing gap 26. Control of the voltage, Vc, provided to the saturation control circuitry is determined by a means 222 for selectively coupling to the circuitry a desired voltage within the range −Vcmin to +Vcmax available from the voltage supply 220. In the embodiment of FIG. 11, this means 222 is a variable resistance or potentiometer including a resistive element 223 having its end terminals electrically connected to opposite poles of the voltage supply 220 so that the resistive element bridges the supply. The potentiometer 222 also includes a contact 224 that is movable along the resistive element 223 as indicated by arrows 226 so as to couple a voltage Vc to the input of the voltage follower 63 determined by the location of the movable contact along the resistive element.

In accordance with the present invention, the location of the moveable contact 224 is controlled, hence, the control currents I1, I2 provided to the transducer 20, to compensate for deviations between the path traced by the transducing zone 56 of the transducer 20 and a selected path 126 along the magnetic record medium 42. This control can be exercised in an open loop predictive manner by causing movement of the contact 224 in accordance with a command function predictive of the anticipated deviation between the traced and selected paths. An open loop servomechanism provides this kind of control, and is useful in applications, for example, where the path traced by the transducing zone 56 must be adjusted from the normal path traced to maintain registration relative to a selected path 126 that does not coincide with the normal path traced. In such applications, the location of the movable contact 224 along the resistive element 223 is determined by a tracking controller 227 included in the transducer controller 112. The tracking controller 227 is operatively linked to the movable contact to effect movement of it along the resistive element 223 in response to a tracking command provided by the system controller 132 (FIG. 1) on an input line 134. This tracking command is provided by the system controller 132 in response to an operator selected control input provided at the control input 144 to the system controller. For a given predicted deviation of the normal path traced by the transducing zone 56 from the selected path 126, the control input provided to the system controller 132 is selected by the operator so that the tracking controller 227 receives a tracking command at its input line 134 which causes it to adjust the location of the movable contact 224 along the resistive element 223 to effect compensation of the predicted deviation. If, for example, the desired path 126 extends laterally along the magnetic record medium 42 at an angle relative to the length dimension of the medium that is different from the normal angle of the path traced over the medium by the transducing zone 56, the tracking controller 227 effects movement of the contact 224 along the resistive element 223 so that the control voltage, Vc, provided to the saturation control circuitry varies in the required direction and by the required amount to effect the desired compensation. Assuming the angular deviation between the normal path traced by the transducing zone 56 and the desired path 126 along magnetic record medium 42 is constant, the tracking controller 227 causes the movable contact 224 to be moved at a linear rate over the resistive element 223 to produce a linearly varying control voltage, Vc, for the saturation control circuitry.

In any case, the saturation control circuitry is responsive to the varying control voltage, Vc, coupled by the movable contact 224 to the input of the voltage follower 63 to generate correspondingly varying control currents I1, I2. These varying control currents are coupled to the control windings 38, 39 of the transducer 20 to vary the locations of the saturation regions 57, 58 (FIGS. 6 and 9) of the transducer 20 and, thereby, move the transducing zone 56 along the width, W, of the transducing gap 26 in accordance with the tracking command received by the tracking controller 227. In this manner, the transducing zone 56 is caused to trace a predicted path along the magnetic record medium 42 determined by the tracking command resulting from the operator selected control input provided at the control input 144 of the system controller 132. Causing the transducing zone 56 to trace the predicted path maintains the transducing zone 56 registered with the selected path 126 along the magnetic record medium 42.

Most desirably, the control of the location or position of the transducing zone 56 relative to the selected path 126 along the magnetic record medium 42 is accomplished through a closed-loop control system. In such a control system arrangement, the actual position of the transducing zone 56 along the width, W, of the transducing gap 126 is measured or sensed and a corresponding position signal provided to the tracking controller 227 to effect generation of the control voltage, Vc, required to maintain the transducing zone 56 registered with the selected path 126. More specifically, and again referring to FIGS. 1 and 11, a sensing means 150 is operatively linked to the transducer 20 to detect deviations of the transducing zone 56 from the selected path 126 and responsively provide a signal representative of detected position deviations over the communication link 130 extending to the transducer controller 112. This signal is coupled by the communication link 130 to an input line 229 of the tracking controller 227 included in the transducer controller 112. For closed-loop control systems, the tracking controller 227 compares the position deviation signal on its input line 229 to a reference tracking command signal received over its input line 134 representative of the desired condition of tracking registration of the transducing zone 56 relative to the selected path 126. This comparison results in the generation of a tracking position error signal that is indicative of the extent of deviation of the transducing zone 56 from the selected path 126, which causes the tracking controller 227 to adjust the location of the movable contact 224 along the resistive element 223 to vary the control voltage, Vc, provided to the saturation control circuitry. The adjustment of location of the movable contact 224, hence, control voltage, Vc, is in a direction and by an amount that effects an adjustment of the location of the transducing zone 56 along the width, W, of the transducing gap 26 that corrects the sensed position deviation to maintain the transducing zone 56 registered over the selected path 126.

The closed-loop form of control system offers the advantage of more certain assurance of maintaining registration between the transducing zone 56 and the selected path 126 along the record medium 42. This is particularly important in applications where the transducer 20 is operated to reproduce information signals previously recorded on the magnetic record medium 42 along tracks coinciding with the selected path 126. In such applications, faithful reproduction of the recorded information signals is dependent upon the ability to maintain the transducing zone 56 continuously registered over the tracks of recorded information signals. Often, even slight deviations of the position of the transducing zone 56 from the recorded tracks will cause severe degradation of the reproduced information signals. A closed-loop control system can be arranged to maintain precise registration of the transducing zone 56 over the recorded tracks, even in the presence of predictable instabilities in relative motion of the transducing zone 56 and the magnetic record medium 42.

On the other hand, such precise control often is unnecessary during the recording of information signals on a magnetic record medium 42. Such control is made unnecessary because transducer and record medium transport control systems used during the reproduction of the recorded information signals often are able to compensate minor deviations in relative transducer to record medium position occasioned by the lack of precise control of the path traced by the transducer over the record medium during the recording of the information signals. In such cases, an open loop form of control system can be employed during recording operations to control the location of the transducing zone 56 along the width, W, of the transducing gap of the transducer 20 so that it traces a predicted path along the magnetic record medium 42 that coincides with the selected path 126. As will become apparent from the following description of other embodiments of the saturation control means 54 and the transducer 20, various sensing means 150 can be used to detect deviations of the transducing zone 56 relative to the selected path 126 along the magnetic record medium 42. In one embodiment, the transducing zone 56 is intentionally oscillated along the width, W, of the transducing gap 26 a small distance about a nominal width location as information signals are reproduced from the magnetic record medium 42 by the transducing zone. This oscillation causes an amplitude modulation of the envelope of the reproduced information signal at the frequency of the oscillation from which the nominal location of the transducing zone 56 relative to the record medium 42 can be determined. The reproduced amplitude modulated information signal is processed by the transducer controller 112 to yield a transducing zone position deviation signal that is coupled to the input line 229 of the tracking controller 227 for use as previously described to correct deviations of the transducing zone 56 from the selected path 126, i.e., adjusting the control voltage, Vc, to effect corrective adjustment of the location of the transducing zone 56 along the width, W, of the transducing gap 26 of the transducer 20.

In another embodiment, the transducer 20 is constructed to define a plurality of transducing zones, at least one of which serves as a tracking transducing zone and is employed to reproduce signals previously recorded along the magnetic record medium 42 as another of the transducing zones is operated to effect transfers, i.e., either recording or reproducing, of information signals with respect to the magnetic record medium 42. Deviations of the tracking transducing zone from the selected path 126 is reflected as a change in the amplitude of the reproduced signal. Since the plurality of transducing zones are formed within the same transducer structure, deviations of transducing zone 56 relative to the selected path 126 will be the same as the deviations of the tracking transducing zone relative to the track of previously recorded signals. Thus, the signals reproduced by the tracking transducing zone are processed by the transducer controller 112 to obtain transducing zone position deviation signals that are employed by the tracking controller 227 to correct deviations of the transducing zone 56 from the selected path 126.

The particular embodiment of the saturation control means 54 illustrated in FIG. 11 employs a voltage supply 220 and a variable resistance to effect control of electric currents to achieve the desired movement of the saturation regions 57, 58 (FIGS. 6 and 9), hence, transducing zone 56 of the transducer 20. As will be described hereinafter, however, other embodiments of the saturation control means are preferred for certain applications of the present invention. Furthermore, as will be described, the various embodiments of the saturation control means are adaptable to controlling a source of magnetic control flux to achieve selected saturation regions of the core portions 21, 22 (FIG. 2) of the transducer 20 and controlled movement of saturation regions to maintain the transducing zone 56 registered over the selected path 126 along the magnetic record medium 42.

An embodiment of the present invention will now be described as arranged for use in a particular class of rotary head segmented scan magnetic tape record and/or reproduce apparatus. There are two major subclasses of rotary head segmented scan magnetic tape record and/or reproduce apparatus, each producing a different record format on magnetic tape: helical track format apparatus; and transverse track format apparatus. Rotary head segmented scan apparatus are ordinarily used to record and reproduce wideband information signals, because they are able to achieve high relative transducer to tape record medium velocities required to faithfully record and reproduce such signals at relatively modest velocities of tape transport. The predominate contributor of the high relative transducer to tape velocity is the rotatable member that supports the transducers so that they are swept in succession and repetitively across the width of the tape at high velocities. The rotatable member is in the form of a cylindrical member mounted for rotation about an axis so that its circumferential surface is located proximate the station at which information signal transfers occur with respect to the tape record medium.

In rotary head transverse scan tape record and reproduce apparatus, the transducers are typically disposed at 90° intervals about the circumference of a disc so that they pass in succession through the information signal transfer station as the tape is transported longitudinally through the transfer station. These relative motions of the transducers and tape result in the transducers tracing a path that extends transversely across the width dimension of the tape at an angle close to 90° relative to the length dimension of the tape during information signal transfers. The small departure from 90° of the angle of the traced path relative to the length of the tape is due to the passing of a small length of tape through the transfer station during the interval required for the transducer to pass over the width of the tape. The information signals are usually recorded and reproduced along a plurality of separate parallel tracks, which are relatively short in length (commonly, under 5 centimeters (cm)). Consequently, this results in considerable segmentation of continuous signals. For example, in television signal applications, as many as 15 or 16 segments may be required to record a single field of television information. While such segmentation is generally acceptable from the standpoint of preservation of faithful recording and reproducing of the information signal, rotary transverse scan tape record and/or reproduce apparatus are expensive because of complexity of design.

Rotary helical scan tape record and/or reproduce apparatus are considerably less complex, particularly, for television signal applications, because fewer transducers are required (as few as one) and the tracks along the tape can be much longer (up to about 41.5 cm in many of the current record and/or reproduce apparatus constructed for broadcast television applications). The longer tracks make it possible to avoid segmentation of the recording of television fields, which simplifies machine design. Moreover, the absence of segmentation makes it convenient to record and reproduce information signals faithfully over a wide range of relative transducer to tape velocities, and in both directions of transport of the tape through the information signal transfer station. Relative to other rotary scan tape record and reproduce apparatus, helical scan apparatus have a simple tape transport drive and control mechanism, employ less and simpler information signal processing electronics, and make more efficient use of tape, in terms of the quantity of tape that is required for recording a given amount of material. In the following description, preferred embodiments of the present invention are described as arranged for rotary helical scan tape record and/or reproduce apparatus.

Two recognized alternative helical scan apparatus are commonly used, which are generally referred to as the "alpha" and the "omega" wrap apparatus. In the alpha wrap apparatus, the tape is introduced to the helical path about a cylindrical tape guide drum for scanning by a rotating transducer from one side of the drum guide and is wrapped completely around the drum so that it exists on the opposite side. It is referred to as alpha wrap apparatus for the reason that it generally conforms to the Greek symbol alpha when one views the helical tape path about the drum in a direction along the axis of the drum. In omega wrap apparatus, the tape is introduced to the helical path about the cylindrical tape guide drum along a path extending towards the drum in a direction generally radially to the drum, passes around an entrance guide that directs the tape onto the surface of the drum, helically extends about the drum, and passes around an exit guide to be directed thereby away from the drum in a direction generally radial thereto. The tape generally conforms to the shape of the Greek symbol omega when it is viewed in a direction extending along the axis of the drum. In both of these helical apparatus, the tape is wrapped around the tape guide drum in a helical manner with the tape exiting the drum surface at a different position axially displaced along the drum surface relative to the entry position. Information signals are recorded on discrete parallel tracks that diagonally extend along the tape at an angle relative to the longitudinal direction of the tape, whereby a track length greatly in excess of the width of the tape can be achieved. For a given helical scan apparatus construction, the angular orientation of the recorded tracks is a function of both the velocity of transport of the tape about the tape guide drum, as well as the speed of rotation of the rotating transducer. The resultant angle therefore varies depending upon the relative velocities of both the rotating transducer and the transport of the tape. In most helical scan apparatus, the transducer is carried by the tape guide drum, which in turn is formed by two axially displaced cylindrical sections, one of which (usually the uppermost) rotates while the other section remains stationary.

While the present invention will be specifically described in connection with an omega wrap rotary helical scan tape record and reproduce apparatus arranged to transfer television information signals with respect to magnetic tape record media, it is equally adaptable to an alpha wrap helical tape apparatus, or other helical or non-helical magnetic record media apparatus as well. Additionally, while the present invention will be described as adapted for omega wrap apparatus in which the tape follows a helical path about the tape guide drum of almost 360° (the tape entrance and exit dimensional requirements prevent a full 360° wrap), the present invention is also adaptable to helical scan tape apparatus which utilize less than 360° wrap, such as, for example, a 180° tape wrap apparatus having more than one rotating magnetic transducer for transferring information signals with respect to the tape record medium. It should also be understood that the present invention is adaptable to arrangements in which the transducers are rotatable in either rotational direction, the tape is introduced into the helical path about the rotating transducers either above or below the exit point and the tape is transported about the helical path in either direction. The relationships of transducer rotation, tape transport direction and manner of tape guiding relative to the helical path represents a variety of different configurational relationships of which only one will be specifically described herein.

The following description of preferred embodiments of the present invention will be with respect to the implementation of the invention for the purpose of effecting reproduction of previously recorded information signals without objectionable deterioration of the quality of the reproduced signals. However, as described hereinbefore, the present invention can be arranged to maintain a signal transducer in a desired position in relation to a record medium while recording.

In helical scan tape apparatus, the path traced by a magnetic transducer as it scans the tape is likely to vary from scan to scan and, during reproduction operations, often does not precisely coincide with the track of recorded information signals. Referring now to FIGS. 13–15, there is shown a helical scan transducer and cylindrical tape guide drum assembly indicated generally at 250, with FIG. 14 showing portions broken away. The transducer-drum assembly 250 is shown to comprise a rotatable upper drum portion 252 and a stationary lower drum portion 254, the upper drum portion 252 being fixed to a shaft 256 which is rotatably journaled in a bearing 257 that is mounted on the lower drum 254, the shaft 256 being driven by a motor (not shown) operatively connected thereto in a conventional manner. The transducer-drum assembly 250 has a transducer 20 carried by the rotatable drum portion 252 and is shown to be rigidly secured to the upper rotatable drum portion.

As is best shown in FIG. 13, the transducer-drum assembly 250 is part of a rotary helical scan omega wrap tape recorder and/or reproducer apparatus which has a magnetic tape 42 advancing toward the lower drum 254 in the direction of the arrow 258, as shown. More specifically, the tape is introduced to the drum surface from the lower right and is fed around a guide post 240 which brings the tape into contact with the outer surface of the stationary lower drum portion 254. The tape travels substantially completely around the cylindrical tape guide drum until it passes around a second guide post 242, which changes the direction of the tape as it exits the transducer-drum assembly 250.

As is best shown in FIGS. 13 and 15, the configuration of the tape path is such that the tape 42 does not contact the guiding drum surface over a full 360° rotation because of the clearance or gap that is required for entrance and exit of the tape to and from the helical path about the cylindrical tape guide drum 250. This gap preferably does not exceed a drum angle of more than about 16°, which has the effect of creating a dropout interval of information. In the case of recording television signal information, the rotation of the transducer 20 and transport of the tape 42 is synchronized so that the the drop out occurs relative to the information signals being recorded so that the information signals lost do not occur during the video information portion of the television signal and so that the start of the scan of a track by the transducer 20 can be properly field synchronized to the television signal.

In accordance with the present invention, the magnetic transducer 20 has a transducing gap of a width larger than that of the width of the tracks of information signals recorded along the tape 42, such as illustrated in FIGS. 1-6. The transducer 20 is securely fastened to the rotatably mounted upper cylindrical drum portion 252 of the cylindrical tape guide drum 250 at the periphery thereof so as to be in position to transfer information signals with respect to the tape 42 as it travels in a helical path about the tape guide drum 250. As generally described hereinbefore and will be explained in further detail hereinafter, the transducer 20 cooperates with a saturation control means included in the transducer controller 112 (FIG. 1), which generates a control signal that is coupled to the transducer to magnetically saturate a selected region of the magnetically permeable body of the transducer to enable at least one selected width segment of the larger transducing gap to effect the transfer of information signals between the magnetic tape record medium 42 and a signal winding of the transducer 20 coupled by the communications link 130 to the transducer controller 112. The control system is operable to vary the control signal to effect movement of the selected width segment along the larger transducing gap and, thereby, move the path traced by a transducing zone defined by the selected width segment relative to the tape 42 as the transducer 20 is rotated by the rotatably mounted upper cylindrical drum portion 252. This is effective to move to the transducing zone associated with the transducer 20 in a plane parallel to the axis of rotation of the rotatable drum portion 252 defined by the rotatably driven shaft 256. Moreover, this can be controlled in accordance with the electrical signals that are supplied to the transducer 20 through the communication link 130 by the saturation control means included in the transducer controller 112.

If, for example, the relative transducer to the tape velocity is changed, the angle of the path traced by the gap of the transducer 20 relative to the length of the tape 42 is changed. Since the selected width segment, hence, the transducing zone of the transducer 20 is movable in either direction along the width of the gap of the transducer, the tape 42 can be transported around the tape guide drum 250 at either a faster or slower velocity, and in opposite directions while the location of the transducing zone is moved to maintain it registered with a selected path 126 along the tape 42 extending at a selected angle relative to the length dimension of the tape. As described hereinbefore, control of such registration can be effective in an open loop control manner without information indicative of the actual location of the transducing zone relative to the desired path along the tape 20. Such control can be accomplished by providing a tracking command signal to the transducer controller 112 via communication link 134 that commands a selected movement of the transducing zone predicted from knowledge of the relative transducer to tape velocity, i.e., relative speed and direction of movement. This form of control is useful under circumstances when registration between the transducing zone and the selected path 126 along the tape 42 does not need to be controlled with a high degree of precision, such as during recording operations when it usually is only necessary the transducing zone follow the selected path closely. However, when precise control of registration between the transducing zone and the selected path is required, control is preferably effected in closed loop manner by moving the transducing zone in accordance with control signals indicative of deviations of the transducing zone from the selected path, which are derived by sensing the location of the transducing zone relative to the selected path.

Referring to FIG. 15, there is illustrated a segment of magnetic tape 42 having a number of tracks A-G thereon, as may be recorded by the transducer 20 as the tape is transported about the cylindrical tape guide drum 250 shown in FIG. 13. In the track format illustrated in FIG. 15, each of the tracks are flanked by guard bands, which do not have recorded information signals, that separate each track from the adjacent tracks. The segment of tape is shown to have an arrow 258 that illustrates the direction of tape movement around the drum and an arrow 260 that shows the direction of the transducer rotation and movement relative to the tape. Thus, when the upper drum portion 252 rotates in the direction of the arrow 260 (FIG. 13), the transducer 20 moves along the tape 42 in the direction of the arrow 260 shown in FIG. 15. With the constant transport speed of the tape 42 and angular velocity of the rotating drum portion 252, the path traced by the transducing zone 56 (FIG. 1) of the transducer relative to the tape will coincide with the tracks A-G. These tracks are substantially straight and parallel to one another at an angle $\theta$ (of about 3°, for example) relative to the longitudinal direction of the tape 42, with each rightward track shown in the drawing being successively followed during successive scans of the tape 42 by the transducer 20.

If conditions are ideal and no transducer to record medium motion or position instabilities occur, the transducing zone 56 simply traces successive paths coinciding with the adjacent tracks A-G without need of adjustment of the lateral position of the transducing zone relative to the tracks, because no mistrackings occur. Stated in other words, the transducing zone 56 is automatically in position to begin tracing a path along the subsequent track B after completing the tracing of a path along track A. It should also be appreciated that if such instabilities occur, such as when velocity of transport of the tape 42 is varied during reproducing operations relative to the velocity during recording operations, the transducing zone 56 must be moved to maintain accurate transducer to record track registration during reproduction of the track, and so that at the end of the scanning of a track being reproduced, the transducing zone is nevertheless in a position to begin reproducing the next adjacent down stream track, i.e., track B in the event reproduction of track A was completed. This can be achieved even when the tape is stopped, or is transported at a speed and in a direction different from that during the recording of the tracks.

In rotary helical scan tape record and/or reproduce apparatus, such ideal conditions are frequently interrupted by occurrence of instabilities in the relative transducer to record medium motion or position. During recording and reproducing operations in such apparatus, the tape 42 is guided under tension so that recording occurs under a known value of longitudinal tension, which induces a certain degree of stretching of the tape. If tension variations occur because of faults in the tensioning mechanism, or because of unavoidable geometric variations in the mechanisms of different tape record and/or reproduce apparatus, the length, straightness and inclination of the diagonal track relative to the plane of rotation of the transducing zone 56 will be different. Under such circumstances, the transducing zone 56 will not trace a defined track path relative to the tape 42, which during reproduction operations leads to undesirable variations in the strength of the reproduced signal, such as variations in the amplitude of the envelope of the reproduced signal. Under some circumstances, a complete loss of useable signal occurs. A similar effect results if the correct tension is maintained, but the tape 42 experiences shrinkage or elongation due to changes in atmospheric or storage conditions, e.g., temperature or humidity. Also, irregular tape edges and differences in edge-guiding from machine to machine can cause irregularly wandering tracks or scans. Consequently, the path taken by the rotating transducing zone 56 as it traces a path along the tape 42 often fails to exactly coincide with the selected path 126. In actual practice, it has been found that a deviation of 0.0001 inch between the path of a recorded track on the tape 42 and the path traced by the rotating transducing zone 56 can result in significant deterioration in the quality of the reproduced information signal.

In accordance with the present invention, unintentionally occurring or intentionally caused variations in the relative transducer to tape position are permitted and registration between the transducing zone and the selected path is maintained without mechanical displacement of the transducer relative to the magnetic tape record medium. Moreover, such registration is maintained through simple servomechanisms that need not be compensated for dynamic mechanical system parameters that characterize prior art automatic head position tracking servomechanisms having mechanically displaceable transducers. FIG. 16 illustrates a preferred embodiment of circuitry forming the tracking controller 227 that electronically controls the saturation control circuitry 54 to vary the control currents I1, I2 provided to the transducer 20 to compensate for deviations between the path traced by the transducing zone 56 of the transducer and the selected path 126 along the magnetic tape record medium 42. The tracking control circuitry 227 of FIG. 16 is arranged to control the location of the transducing zone 56 along the width of the transducing gap 26 of the transducer 20 of a rotary scan tape record and reproduce apparatus of the type generally described hereinbefore with reference to FIGS. 13-15, as previously recorded television information signals are reproduced from the tape 42. This tracking control circuitry 227 is arranged to compensate for unintentionally occurring and intentionally caused variations in the relative transducing zone to selected path position as the transducer 20 is rotated to scan the tape 42 at the signal transfer station 106. While not illustrated in FIG. 16 to facilitate the illustration of the operation of the tracking control circuitry 227, it should be understood that the transducer 20 is mounted for rotation through the signal transfer station 106, such as by the upper rotating drum portion 252 illustrated in FIGS. 13 and 14, relative to the tape 42 directed along a helical path about the rotating transducer.

In the embodiment illustrated in FIG. 16, information indicative of the position of the transducing zone 56 relative to the selected path 126 along the tape 42 is obtained by imparting a small oscillatory motion to the transducing zone 56 in the direction of the width of the transducing gap 26 to cause the transducing zone to move laterally to the selected path, and monitoring the effect produced on the signals reproduced by the transducer 20. More specifically, a dither oscillator 301 generates a sinusoidally varying oscillatory signal at a fixed frequency fd and applies same to a line 302 extending to one input of a summing circuit 303, where it is added to a tracking position error correction signal (to be described hereinafter) present on a line 304 extending to another input of the summing circuit. To avoid objectionable signal interferences with the information signal reproduced by the transducer 20, the dither oscillator 301 is operated to provide a pure sinusoidally varying oscillatory signal at the fundamental frequency fd having a low higher order harmonic content. The output of summing circuit 303 is a tracking control signal that determines the position of the transducing zone 56 relative to the selected path 126. This signal is coupled by a line 306 to the input of the saturation controller 54 to effect complementary variations in the control currents I1 and I2 provided thereby corresponding to the tracking control signal. The varying control currents I1 and I2 are coupled to the control windings 38 and 39 of the transducer 20 to cause the position of the transducing zone 56 to move along the width of the transducing gap 26 in accordance with the variations in the control currents. The oscillatory signal component of the varying control currents is selected to impart a small peak-to-peak oscillatory motion to the transducing zone 56 laterally to the selected path 126 alternately between limits as the transducer 20 scans the tape 42 to reproduce recorded signals from the selected path 126. The oscillatory motion of the transducing zone 56 is limited to a small amount to insure that it is kept substantially within the boundaries of the selected path 126. In a helical scan video tape recorder environment in which one embodiment of the invention is constructed to operate, the recorded tracks of television information signals are 0.145 mm wide separated by guard bands of 0.076 mm. For this application, the oscillatory components of control current signals are selected to oscillate the transducing zone 56 laterally to the selected path 126 ±0.010 mm about the center line of the path traced by the transducing zone 56 as it follows the selected path 126.

The oscillatory motion imparted to the transducing zone 56 causes an amplitude modulation of the reproduced signal, which when recording television or other such high frequency signals, is in the form of an RF envelope that is formed by a frequency modulated carrier signal. If the transducing zone 56 is located at the center of the selected path 126, only even harmonic components of the dither signal appear in the reproduced signal as a result of the oscillatory motion of the transducing zone 56, because its average position is at the center of the selected path and the envelope variation caused by dithering is symmetrical about its average. The amplitude of the RF envelope reproduced from the tape 42 is maximum when the transducing zone 56 is registered at the center of the selected path 126. As the transducing zone 56 moves to either side of the center, the amplitude of the reproduced RF envelope decreases by an amount corresponding to the amount of such movement. The fundamental of the oscillatory signal is, thereby, balanced out and does not appear as a component in the reproduced RF envelope.

Therefore, imparting oscillatory motion to the transducing zone 56 laterally to the selected path 126 introduces amplitude deviations in the RF envelope only at twice the dither frequency fd when the transducing zone 56 is registered over the center of the selected path 126.

On the other hand, if the transducing zone 56 is registered slightly offset from the center of the selected path 126 to either side, the reproduced RF envelope amplitude variation will no longer be symmetrical because transducing zone excursions to one side of the selected path 126 produces a different RF envelope amplitude decrease then produced by an excursion towards the opposite side. Hence, a maximum-to-minimum envelope amplitude variation occurs once for each cycle of the oscillatory signal, or at the frequency fd, with the order of occurrence of the maximum and minimum points depending upon the side of the selected path center to which the transducing zone 56 is offset. The fundamental of the oscillatory signal frequency is no longer balanced out and the reproduced RF envelope variations will exhibit a fundamental component of the oscillatory signal frequency, with the phase of the fundamental component for an offset to one side of the center of the selected path 126 out of phase by 180° with respect to that for an offset to the other side of the selected path center. Detection of the order of occurrences of the maximum and minimum points, hence phase of the envelope amplitude variations, provides information definitive of the direction the transducing zone 56 is offset from the center of the selected path 126, and detection of the envelope amplitude variation provides information definitive of the amount of offset. This information defines a tracking position error.

To obtain this tracking position information, the modulated RF envelope signal reproduced by the transducer 20 is coupled by the signal winding 25 to detection circuitry through a video reproduce preamplifier 311 commonly found in video tape record and/or reproduce systems. The commonly employed process of frequency modulating a carrier with a television signal for recording on a magnetic recording medium gives rise to spurious amplitude modulated components in the envelopes of the reproduce signal output by the preamplifier 311. These spurious envelope modulations are in addition to those arising out of intentional oscillation of the position of the transducing zone 56 along the width of the transducing gap 26. The spurious components primarily result from the non-uniform frequency response of the record/reproduce system, and can have a significant effect on the envelope of the reproduced signal. Such spurious components will appear as false tracking position error indications, if allowed to remain in the signal that is processed to determine and correct tracking position errors. To avoid such false tracking position error indications, the input of an envelope detector 312 is coupled to the television information signal reproduce system at a circuit point at the output of a flat equalizer 310, which receives the output of an RF automatic gain control circuit commonly found in video record/reproduce systems for color television signals. The flat equalizer 310 is preferably in the form of a filter whose frequency response complements the response of the system so as to compensate for undesired amplitude variations in the RF signal resulting from the non-uniform frequency response of that part of the system which precedes the flat equalizer 310.

To an extent, the tracking position error which varies the amplitude of the reproduced RF envelope is exhibited as a double-sideband, suppressed carrier (DSB/SC) modulation of the dither oscillator fundamental frequency. Therefore, to recover the tracking position signal, the reproduced signal output by the preamplifier 311 is coupled for processing by two amplitude modulation detectors 312 and 313. The first detector 312 is a simple amplitude modulation RF envelope detector, which is constructed to recover the oscillatory signal fundamental and its sidebands. The output signal from envelope detector 312 is merely a rectified version of the reproduced signal, containing the fundamental and sideband components of the oscillatory signal frequency fd. This output signal is applied to a high pass filter 316, the bandwidth of which is sufficient to include the oscillatory signal fundamental and its sidebands, and, thereby, to pass the significant tracking position signal spectrum. The purpose of the filter 316 is to attenuate undesirable low frequency spurious signals and noise which may be present in the tracking position signal spectrum. The output of the high pass filter 316 is coupled by a line 317 to the signal input of the second detector 313, which is a synchronous amplitude modulation detector.

The synchronous detector 313 is of conventional design of the kind which operates on the principle of coherently detecting the amplitude and polarity of an unknown input signal with reference to the phase of a known reference signal of the same frequency. Such detectors provide a rectified output having an amplitude corresponding to that of the unknown input signal and being positive when the two signals are in phase and negative when the two signals are 180 degrees out of phase. To ensure the proper frequency relationship between the tracking position error signal and the reference signal, the oscillatory signal provided by the dither oscillator 301 is coupled by a line 314 to the reference input of the detector 313. Since the signal present on line 317 extending to the signal input of the synchronous detector 313 has a component at the fundamental oscillatory signal frequency fd, whenever an error occurs in the position of the transducing zone 56 relative to the selected path 126, the synchronous detector 313 provides at its output coupled to the line 318, a tracking position error signal representative of the position error of the transducing zone 56 relative to the selected path 126. The amplitude of the error signal is proportional to the amount the position of the transducing zone 56 is displaced from registration with the center of the selected path 126. The polarity of the tracking position error signal is indicative of the direction of displacement from the center.

The output of the synchronous detector 313 is coupled by the line 318 to the input of a servo loop compensator 321, which introduces some gain and phase shift to the tracking position error signal to compensate the dither oscillator servo loop response for optimum loop stability. The output provided by the compensator 321 is the tracking position error correction signal that, when applied to the saturation controller 54, causes movement of the transducing zone 56 along the transducing gap 126 to compensate for deviations between the path traced by the transducing zone 56 and the selected path 26.

This compensated tracking position error correction signal is coupled by a line 322 to one input of a summing circuit 323 for combining with a tracking geometry error correction signal generated by the variable speed reproduce servo 324. A preferred embodiment of the servo 324 is described in detail hereinafter, but in general it functions to generate correction signals that compensate for misregistrations between the transducing zone 56 and the selected path 126 when the velocity of the tape 42 is changed to a value other than the normal velocity, for example, to create slow motion and other special effects upon the reproduction of the recorded television information signals. The output of the summing circuit 323 is coupled by the line 304 to the summing circuit 303 where it is added to the oscillatory signal provided by the oscillator 301. The composite signal resulting therefrom is coupled from the output of the summing circuit 303 by the line 306 to the saturation controller 54, which generates composite control currents I1 and I2 that are applied to the control windings 38 and 39 of the transducer 20. The tracking position error correction signal component of the composite signal adjusts the position of the transducing zone 56 along the width of the transducing gap 26 in accordance with the tracking position error signal detected by the synchronous detector 313, thereby, laterally displacing the transducing zone 56 to maintain registration with respect to the selected path 126.

The circuitry for obtaining information indicative of position of the transducing zone 56 relative to the selected path 126 along the tape and generating therefrom a tracking position error correction signal for application to the saturation controller 54 is but one of various arrangements that are suitable for such purposes. For example, a trial and error technique can be employed, which involves intentionally moving the transducing zone 56 in the direction of the width of the transducing gap 26, examining the effect of the movement on the amplitude of the reproduced information signal, and altering or continuing the movement of the transducing zone depending on the examined effect. These steps are repeated until movement of the transducing zone 56 in any direction has the effect of reducing the amplitude of the information signal reproduced by the transducer 20. Another technique for obtaining such position information and generating tracking position error correction signals makes use of tracking signals pre-recorded along the record medium 42. In some applications, these tracking signals are pre-recorded along special, dedicated tracks adjacent the tracks in which information signals are to be recorded. One or more auxiliary tracking transducers linked to move with the transducer zone 56 of the signal information transducer 20 are located to detect the pre-recorded tracking signals. The detected tracking signals are processed to determine the position of the auxiliary tracking transducers, hence, the information signal transducing zone 56 relative to the record medium. In other applications, the pre-recorded tracking signals are pre-recorded along the same tracks as the information signals, but at a frequency (usually lower) outside the frequency band of the information signals. Auxiliary tracking transducers are not needed to detect tracking signals pre-recorded along the same tracks as the information signals. Instead, the signal information transducer 20 is employed to reproduce both the information signals and tracking signals, and frequency selective filters are provided for separating the two signals.

Yet another technique for obtaining information indicative of the position of the transducing zone 56 relative to the selected path 126 along the record medium 42 and generating therefrom corresponding tracking position error correction signals for application to the saturation controller 54 relies upon the detection of previously recorded information signals with auxiliary tracking transducers. The auxiliary tracking transducers are linked to move with the transducing zone 56 of the signal information transducer 20 to trace paths along the record medium 42 corresponding to the center line of the path traced by the transducing zone. As will become more apparent from the following description, use of two auxiliary tracking transducers to detect the previously recorded information signals facilitates the detection of tracking position errors and generation of corresponding error correction signals. While any auxiliary tracking transducer arrangement capable of determining the position of the information signal transducing zone 56 may be employed, the use of auxiliary tracking transducers having a movable transducing zone like that of information signal transducer 20 facilitates synchronizing the movement of the auxiliary tracking transducers with that of the information signal transducing zone 56. Synchronization is facilitated because the same tracking position error correction signal can be employed to effect movement of the transducing zones of the auxiliary tracking transducers as employed to move the transducing zone 56 of the information signal transducer 20 in compensating for deviations between the path traced by the transducing zone 56 and the selected path 126. Moreover, as will be described in detail hereinafter with reference to FIGS. 18A, 18B and 18C, preferred embodiments of a one piece transducer structure 420 defining the information signal transducer and the auxiliary tracking transducers are particularly suited for use with circuitry for obtaining transducing zone position information from information signals recorded on the record medium 42 at locations neighboring the selected path 126 along the record medium.

A preferred embodiment of circuitry for determining the tracking position error signal through use of auxiliary tracking transducers and generating a corresponding tracking position error correction signal for application to the saturation controller 54 is illustrated in FIG. 17. As will be described hereinafter with reference to FIGS. 18A, 18B and 18C, this circuitry is arranged to operate with a pair of left-offset and right-offset auxiliary tracking transducers 150a and 150b disposed at opposite sides of the transducing zone 56 of the information signal transducer 20. These auxiliary tracking transducers are employed to monitor continuously the lateral track position of the transducing zone 56 and provide information used to control the lateral position of the transducing zone. In this embodiment, one of the auxiliary tracking transducers 150a and 150b is located at each side of the transducing zone 56 so as to trace, respectively, left-offset and right-offset paths along the tape 42 relative to the selected path 126. The auxiliary tracking transducers are located relative to the information signal transducer 20 so that when the tracking zone 56 of the information signal transducer is centered with respect to the selected path 126 from which information signals are to be reproduced, the transducing zones of the auxiliary tracking transducers either overlie the edges of the selected path 126, the guard bands (if they exist) on either side of the selected path 126 or tracks of recorded information signals adjacent to the selected path 126. To maintain the transducing zone 56 in a desired position relative to the selected path 126 during recording operations the auxiliary tracking transducers are preferably arranged to reproduce information signals previously recorded in adjacent tracks by an information signal transducer, such as by locating both auxiliary tracking transducers at one side of the transducing zone 56 to reproduce previously recorded information signals as the information signal transducer 20 is recording new information signals along the selected path 126. It is desirable that the auxiliary tracking transducers be positioned relative to the transducing zone 56 in such a way that when the transducing zone 56 is properly tracing a path along the tape 42 coinciding with the center line of the selected path 126 with respect to which information signals are being transferred, the amplitudes of the signals being reproduced by the auxiliary tracking transducers are equal.

Since the auxiliary tracking transducers 150a and 150b need only provide signals from which the amplitude of the signal envelope can be determined, they need not be the same quality or type as the information signal transducer 20. But, it is preferable the auxiliary tracking transducers 150a and 150b be of good quality to insure the most accurate position information is obtained.

In the embodiments of the one piece transducer structures 420 shown in FIGS. 18A, 18B and 18C, the paths traced by the auxiliary tracking transducers 150a and 150b always overlap the edges of the path traced by transducing zone 56 of the information signal transducer 20 as it is displaced laterally to maintain registration with the selected path 126. In the event the path traced by the transducing zone 56 is a track of information signals recorded along the selected path 126, the auxiliary tracking transducers 150a and 150b reproduce information signals from the overlapped edges of the selected path 126 as they move with the transducing zone 56 of information signal transducer 20. Alternatively, the transducing zones of the auxiliary tracking transducers 150a and 150b may be of a narrower width than the width of the transducing zone 56 of the information signal transducer 20, so as to have less overlap upon the selected path 126 traced by the transducing zone 56, or even zero overlap. However, the transducing zones of the auxiliary tracking transducers 150a and 150b preferably do not extend laterally beyond the dimension of the guard bands commonly flanking the tracks of recorded information signals, when the transducing zone 56 of the information signal transducer 20 is correctly registered over the selected path 126. Thus, the auxiliary tracking transducers 150a and 150b do not ordinarily reproduce information signals from recorded tracks adjacent the selected path 126 traced by the transducing zone 56. In any case, the auxiliary and information signal transducers 150a, 150b and 20 are supported by, for example, the upper rotatable drum portion 252 of the transducer-drum assembly 250 (FIGS. 13 and 14) so they slightly project beyond the circumference of the drum assembly 250 to insure proper transducer to tape interface.

Referring now to the circuitry of FIG. 17, as the information signal transducer 20 is operated to reproduce information signals from the tape 42 having a recorded track format such as shown in FIG. 15, the transducing zones of two auxiliary tracking transducers 150a and 150b reproduce signals from opposite edges 125 and 135, respectively, of the selected path 126 from which the information signals are being reproduced by the transducing zone 56 of the transducer 20. The signal reproduced by each tracking transducer 150a and 150b is derived from the information signal recorded on the tape 42. The instantaneous amplitude of the signal reproduced by either tracking transducer depends on how closely it overlies the track of recorded information signal at any instant. If the tracking transducer completely overlies the guard band between adjacent tracks of recorded information signals, the signal amplitude will be very small; however, if it overlies a substantial portion of the track of recorded information signals, the signal amplitude will be relatively large.

Each of the tracking transducers 150a, 150b is coupled by its signal winding 25a, 25b to a preamplifier 452, 454 so that the signals reproduced by each are amplified to a suitable level required for processing by the tracking control circuitry 227. The amplitude levels of the reproduced signals provided by each of the preamplifiers 452, 454 are detected by a rectifier 456, 458. The signals reproduced by the tracking transducers 150a and 150b may contain some amplitude modulation resulting from the modulation of the carrier by the information signal, such as is commonly done when recording television information signals on a magnetic medium. Erroneous tracking position determinations can result from such modulation. To avoid such errors, the output of each rectifier 456, 458 is coupled to a sample and hold circuit 464, 466, each having an associated holding capacitor 472, 474 coupled between the output of the sample and hold circuit and ground. The operation of the sample and hold circuits 464 and 466 are controlled to periodically sample the signal received from the preamplifiers 452 and 454 at times when the effects of modulating the carrier are least likely to introduce errors in tracking position determination. In television information signals, this would be during the intervals of the horizontal synchronizing pulses that occur in such information signals. To determine the occurrences of such intervals, the output of the information signal transducer 20 provided on the signal winding 25c is coupled to a preamplifier 476, the output of which is in turn coupled to a demodulator and synchronizing signal separator 478. The separator 478 conventionally operates at the television signal horizontal line rate to separate the horizontal synchronizing pulse from the reproduced television information signal. The horizontal synchronizing pulse output by the separator 478 is applied over signal lines 463 and 465 to the control terminals of the sample and hold circuits 464, 466 to cause them to sample the signals provided by the rectifiers 456, 458 during the horizontal synchronizing pulse interval. This results in the output provided by the tracking transducers 150a and 150b being periodically sampled at the horizontal line rate during the entire interval the tracking transducers 150a and 150b trace the edges 125 and 135, respectively, of the selected path 126 traced by the transducing zone 56 of the information signal transducer 20. Sampling in this manner eliminates possible introduction of amplitude modulation interference to the tracking position error determination, because frequency modulation for recording television information signals does not effect the horizontal synchronizing pulses.

The sampled signal amplitude levels stored by the holding capacitors 472 and 474 are representative of the tracking position error of the transducing zone 56 of the transducer 20 and are coupled to separate inputs of a differential amplifier 460. The sampled signal amplitude levels stored by the capacitors are compared by the differential amplifier 460 to develop an error voltage proportional to the tracking position error represented by the two signals reproduced by the tracking transducers 150a and 150b. This voltage is in the nature of an output difference signal whose amplitude is proportional to the difference in the average amplitudes of the signals provided by the tracking transducers 150a and 150b, and its sense is representative of which of the average amplitudes is the largest. When the transducing zone 56 of the information signal transducer 20 is registered at the center of the selected path 126, the average amplitudes of the signals reproduced by the tracking transducers 150a and 150b are equal. Thus, the output signal provided by the differential amplifier 460 is zero, or corresponds to the desired position of the transducing zone 56 relative to the selected path 126. However, as the transducing zone 56 is displaced from the center of the selected path 126 in the direction of, for example, the left-offset tracking transducer 150a, the average amplitude of the signal reproduced by that transducer proportionately decreases while that reproduced by the right-offset tracking transducer 150b proportionately increases. The contrary occurs as the transducing zone 56 is displaced from the center of the selected path 126 in the direction of the right-offset tracking transducer 150b, i.e., the average amplitude of the signal reproduced by the tracking transducer 150a proportionately increases while that reproduced by the tracking transducer 150b proportionately decreases. Thus, the tracking control circuitry 227 is responsive to such proportionately changing signals to generate a difference signal whose amplitude follows the amplitude difference of the signals reproduced by the tracking transducers 150a and 150b, and whose sense is dependent upon which of the signals is the largest. This difference signal represents the tracking position error of the transducing zone 56 of the information signal transducer 20, and is inverted to form a tracking position error correction signal that is coupled to the saturation controller 54 to effect correction of any misregistrations between the transducing zone 56 and the selected path 126, as previously described with reference to the tracking control circuitry embodiment illustrated in FIG. 16.

A preferred embodiment of a one piece transducer structure 420 defining a composite information signal transducer 20 and two flanking auxiliary tracking transducers 150a and 150b is illustrated in FIGS. 18A and 18B. One half of the composite transducer structure 420 is shown in FIG. 18A and has a front core 401 and a back core 400, which are integrally joined together by, for example, epoxy bonding at confronting surfaces 403, 402 to eliminate air gaps. The front core is preferably made from, for example, a block of monolithic magnetic ferrite material such as PS52B. A groove 404 is formed at the rear surface 403 of the front core 400 inwardly of a transducing gap plane that extends in the direction of the width dimension, W, of the front core to obtain a transducing winding window. The back core 401 is conveniently formed of a plurality of individual U-shaped magnetically permeable thin laminations 407, for example, 0.0001 inch thick, having the varying boundary length dimensional relationships relative to the location of the face 408 that confronts the tape 42 (FIG. 17). If thinner laminations 407 are desired, a material deposition process, such as, for example, vacuum deposition (sputtering being a suitable one), plating and the like, can be employed to form laminations of a thickness as small as a few microinches each. In addition, a laminated structure can be avoided altogether by constructing the back core 401 from a unitary block of magnetically permeable material (or three unitary blocks of such material, if magnetic isolation is desired between adjacent ones of the three transducers as described hereinafter), and machining the block to form the back core 401. Regardless of how the back core 401 is formed, the U-shaped construction of the back core desirably defines an open winding window 409 extending inwardly of the front surface 402 defined by the back core 401. As will be described further hereinafter, the window 409 is provided for threading through the back core 401 control signal windings 38a, 38b, 38c, 39a, 39b and 39c (FIG. 18B) of the three transducers 20, 150a and 150b forming the composite transducer structure 420.

The joined front and back cores 400 and 401 form one of the the two half cores 414 and 416 (FIG. 18B) forming the composite transducer structure 420. The respective laminations of each half core 414, 416 of the composite transducer structure embodiment of FIGS. 18A and 18B have a substantially constant width 411 (FIG. 18A) in the direction perpendicular to a control flux path 412 extending in the lamination plane, as shown in FIG. 18B. The laminations 407 of adjacent half cores 414 and 416 have gradually increasing lengths in the direction indicated by arrow 413, with the lengths of half core 414 increasing in a direction relative to the width dimension, W, of the transducing gap 26 which is opposite that of half core 416. This forms oppositely increasing control flux paths lengths, thus, oppositely directed reluctance gradients, in each half core 414, 416 in the direction of the width dimension, W, of the composite transducer structure 420. That increase preferably is exponential to maximize the permeability to flux density gradient as previously described with reference to other embodiments of the transducers employed in the present invention.

If it is desired to provide a high degree of magnetic isolation between the separate information signal transducer 20 and the two flanking auxiliary tracking transducers 150a and 150b, a pair of insulating spacer laminations 417 of non-magnetic material, such as copper, are placed in the front core 400 and back core 401. The insulating spacer laminations 417 are placed in the cores to extend the length of the composite transducer structure 420 and divide the one piece transducer structure in its width dimension, W, into three equal width, magnetically isolated sections that form the information signal transducer 20 and two flanking auxiliary tracking transducers 150a and 150b. To facilitate illustration of the insulating spacer laminations 417, they are stippled in FIGS. 18A and FIG. 18B. The non-magnetic spacer laminations 417 are bonded to the adjacent magnetically permeable laminations 407 and corresponding sections of the front core 400, as the case may be, by epoxy to form unitary front and back core structures 400 and 401. As described hereinbefore with respect to the magnetically permeable laminations 407, the spacer laminations 417 can be constructed by machine forming, and thereafter processed and assembled with the magnetically permeable laminations 407 and the magnetically permeable sections of the front core 400 to form the composite transducer structure 420. However, the spacer laminations 417 also can be formed on an adjacent magnetically permeable lamination 407 and section of the front core 400 by a material deposition process.

The two half core structures 414 and 416 are assembled together such that the lengths of the control flux paths 412 in them gradually increase in opposite directions across the width dimension, W, of the composite transducer structure 420. These gradually increasing, oppositely directed flux path lengths establish corresponding gradual reluctance gradients that extend in opposite directions across the width dimension, W. The thusly assembled half cores 414 and 416 are bonded together at the gap plane with epoxy, and the resulting composite transducer core structure 420 contoured at the face 408 to obtain a transducer structure of a desired face contour and desired depth for the transducing gap 26. Thereafter, control signal windings 38a, 38b, 38c, 39a, 39b and 39c, and transducing signal windings 25a, 25b and 25c are arranged about the half cores 414, 416. One of each of the transducing signal windings 25a, 25b and 25c is wound about one stack of magnetically permeable laminations 407 forming one of the three transducers 20, 150a and 150b. These windings are located proximate the gap plane with each winding being seated in the groove 404 formed at the rear surface 403 of the front core 400 and on a shoulder 418 (FIG. 18A) formed along the width dimension of the laminated back core 401. More specifically, signal winding 25a is wound about the auxiliary tracking transducer 150a, signal winding 25b about the auxiliary tracking transducer 150b, and signal winding 25c about the information signal transducer 20. To facilitate winding the signal windings about each of the three transducers, the non-magnetic spacer laminations 417 are slotted in the direction of the length of the spacer lamination to form winding apertures 419 at the gap plane to permit the signal windings 25a, 25b and 25c to pass from the rear surface 403 side of the transducer structure 420 to the shoulder 418 side of the structure.

To effect synchronous control of the position of the transducing zones in the three transducers 20, 150a and 150b and of the movement of the zones for compensation of deviations from the selected path 126 of the transducing zone 56 (FIGS. 16 and 17) of the information signal transducer 20, separate control signal windings 38a, 38b, 38c, 39a, 39b and 39c are required in the embodiment of the transducer structure 420 illustrated in FIGS. 18A and 18B. More particularly, the two half core sections forming the auxiliary tracking transducer 150a have control signal windings 38a and 39a wound respectively about them. Similarly, the two half core sections forming the auxiliary tracking transducer 150b have control signal windings 38b and 39b wound respectively about them, and the two half core sections forming the information signal transducer 20 have control signal windings 38c and 39c wound respectively about them. To permit winding of the control signal windings about the half core sections, the non-magnetic spacer laminations 417 are slotted in the direction of the dimension 411 to form winding apertures 421 (FIG. 18A) at the surface 402 of the laminated back core 401.

While each of the three transducers 20, 150a and 150b of the composite transducer structure 420 exhibit individually the desired oppositely directed reluctance gradients in the pairs of half core sections forming them, the gradients associated with the three transducers extend over different ranges of reluctances. Therefore, different magnitudes of the control currents are required for each of the transducers 20, 150a and 150b to effect the desired selective saturation of regions of the three transducers, as well as movement of the saturated regions in them a given distance in the direction of the width dimension, W, of the transducing gap 26. The embodiment of the composite transducer structure 420 illustrated in FIGS. 18A and 18B, therefore, requires a separate source of control current, hence, saturation controller 54 (FIG. 17) for each of the three transducers. While separate saturation controllers are required, the same tracking position error correction signal provided by the tracking control circuitry 227 of FIG. 17 can be provided to each of them to effect control of the locations and synchronized movements of the transducing zones of the three transducers 20, 150a and 150a and 150b. However, as will be described hereinafter with reference to FIG. 18C, the need for a separate saturation controller 54 for each of the three transducers 20, 150a and 150b can be avoided by appropriately constructing the three sections of the two half cores 414 and 416 so that each section exhibits the same oppositely directed reluctance gradients.

In each of the three transducers 20, 150a and 150b, a substantially constant cross sectional area of the laminations is maintained in a direction perpendicular to the control flux path 412, while the lengths of the control flux paths gradually increase differentially, that is in opposite directions, in the confronting core halves. To insure that the face 408 of each transducer saturates before portions of the laminated back core 401, the width 422 (FIG. 18A) of the front core 400 defining a portion 424 of the flux path 412 (FIG. 18B) at the face 408 is preferably made slightly smaller than the width 411 of the laminations 407 forming the back core 401, which defines the rest of the flux path 412. By virtue of the constant cross-sectional area of the front core 400 perpendicular to the direction of the control flux path 424 (FIG. 18B) across the face 408 of each transducer, each region of the front core 400 aligned with a lamination of the back core 401 will saturate uniformly along its extent at the face 408 when the control signal current in its associated control winding reaches a magnitude that establishes a flux level in the flux path of the aligned lamination corresponding to the saturation flux density for the front core 400.

The embodiment of the transducer structure 420 illustrated in FIGS. 18A and 18B has the additional advantage that although each of the laminations of the back core 401 is in magnetic contact with its adjacent laminations, the junctions between the laminations necessarily render the laminated back core magnetically anisotropic, with the easy axis of magnetization parallel to the lamination plane. This enables achievement of better discrimination, i.e., a sharper boundary or transition, between saturated and unsaturated portions along transducing gap than can be obtained with an unlaminated body of corresponding structure.

FIG. 18C illustrates one half of an embodiment of a composite transducer structure 420 enabling use of a single saturation controller 54 to effect the control of the locations and synchronized movements of the transducing zones of the information signal transducer 20 and two auxiliary tracking transducers 150a and 150b of the composite transducer structure. As in the embodiment of the transducer structure 420 illustrated in FIGS. 18A and 18B, the two auxiliary tracking transducers 150a and 150b are assembled at each side of information signal transducer 20. However, this embodiment of the composite transducer structure 420 differs in a most significant respect from the embodiment illustrated in FIGS. 18A and 18B. Instead of varying the length of each of the two half cores from a minimum length at one side of each half core to a maximum length at the opposite side as in the embodiment of FIGS. 18A and 18B, in the embodiment of FIG. 18C the length of each of the three sections of each of the half cores defining one of the three transducers 20, 150a and 150b is varied from the same minimum length to the same maximum length.

More specifically and referring to FIG. 18C, half core 416 has three sections 426, 427 and 428 which cooperate with similar sections of another unillustrated half core (corresponding to half core 414 in FIG. 18B) to define the three transducers 150a, 20 and 150b, respectively. Each of the sections 426, 427 and 428 defining one of the transducers 150a, 20 and 150b has its length varied in the direction of arrow 413 from a minimum length at one side 429 of, for example, half core section 426 to a maximum length at its opposite side 431. The length of each of the sections 426, 427 and 428 is preferably varied identically so that each section has the same reluctance gradient established therein in the direction of the width dimension, W, of the composite transducer structure 420. The lengths of the two half cores joined to form the transducer structure 420 increase in opposite directions relative to the width dimension, W, of the transducing gap 26. This forms oppositely increasing control flux paths lengths, thus, oppositely directed reluctance gradients, in each of the two half cores in the direction of the width dimension, W, of the composite transducer structure 420. As in the embodiment of the transducer structure 420 of FIGS. 18A and 18B, the increase preferably is exponential to maximize the permeability to flux density gradient.

With the three sections 426, 427 and 428 of each of the two half cores forming the transducer structure 420 having the same reluctance gradient, a given control current level and variation thereof will establish the same flux condition in each of the sections. Hence, only one set of composite control currents I1 and I2 (FIG. 17), hence, saturation controller 54, is needed to control the locations and movements of the transducing zones in the three transducers 20, 150a and 150b of composite transducer structure 420. In this way, the locations and movements of the transducing zones along the width dimension, W, of the transducing gap 26 in all three transducers 20, 150a and 150b are automatically synchronized.

Since the, transducing zones of all three transducers can be controlled by a single set of control currents, each half core of the composite transducer structure 420 requires only one control signal winding. As illustrated in FIG. 18C, one control winding 39 is wound about the entire structure 420 through the open winding window 409 that extends through the three sections 426, 427 and 428 of the half core 416, and, as a result, links each of the three transducers 20, 150a and 150b. The other, unillustrated half core forming the composite transducer structure 420 is similarly wound by a single control winding 38 (FIG. 17). In operation, the two control windings are coupled to the output of a single saturation controller 54 to receive the composite control currents that determine the locations and movements of the transducing zones of the three transducers 20, 150a and 150b along the width, W, dimension of the transducing gap 26.

In other respects, the embodiment of the composite transducer structure 420 illustrated in FIG. 18C is similar to the embodiment illustrated in FIGS. 18A and 18B. Each half core is formed of a monolithic front core 400 and a back core 401, which are integrally joined together by epoxy bonding. In the embodiment illustrated in FIG. 18C, each half core section 426, 427 and 428 of the back core 401 is constructed from a unitary block of magnetically permeable material, and the three sections are joined together, as by epoxy binding, to form a rigid structure. It should be appreciated, however, each of the half core sections could be formed as a stack of magnetically permeable laminations. The embodiment of the composite transducer structure 420 of FIG. 18C is not provided with magnetic isolating layers between adjacent half core sections 426, 427 and 428, although such layers could be provided, if desired. Consequently, the front core 400 is constructed from a unitary body of magnetically permeable monolithic material. While not shown in FIG. 18C, it will be understood that separate signal windings, corresponding to signal windings 25a, 25b and 25c of the embodiment of the composite transducer structure 420 illustrated in FIGS. 18A and 18B, are provided for each of the three transducers 150a, 150b and 20, respectively, which are depicted by dotted lines 433 and 434 FIG. 18C. Like the composite transducer structure 420 of FIGS. 18A and 18B, the signal windings are wound about the front portions of the half core sections 426, 427 and 428 proximate the plane of the transducing gap 26 (appropriate winding apertures being provided in the half core sections for the purpose), and seat in the groove 404 at the rear of the front core 400 and on the shoulder 418 formed in back core 401.

The geometric dimensions of the front and back cores 400 and 401 of the embodiment of the composite transducer structure 420 illustrated in FIG. 18C are similar to those of the embodiment illustrated in FIGS. 18A and 18B. More particularly, each of the half core sections 426, 427 and 428 has a substantially constant cross sectional area in a direction perpendicular to the control flux path 412. Moreover, the width 422 of the front core 400 is preferably made slightly smaller than the width 411 of the half core sections 426, 427 and 428 forming the back core 401 to insure that the face 408 associated with each of the three transducers 150a, 150b and 20 saturates before the operatively associated half core section.

While a composite transducer structure 420 constructed in accordance with the embodiment of FIG. 18C permits a single saturation controller 54 (FIG. 17) and set of control signal windings 38 and 39 to be used to effect the control of the locations and movements of the transducing zones of all three transducers 20, 150a and 150b of the structure 420, it may be desirable in certain applications to provide for separate control of the location and movement of the transducing zone of each of the transducers 20, 150a and 150b. Such separate control, for example, enables individual phase and gain compensation of the control signal path associated with each of the three transducers. To provide such separate control of the location and movement of each transducing zone, a separate pair of control signal windings is provided for each of the three transducers. The pairs of control signal windings are distributed and wound about the back cores forming the three sections 426, 427 and 428 of the composite transducer structure 420 in the same manner as described hereinbefore with reference to the embodiment of the composite transducer structure 420 illustrated in FIGS. 18A and 18B. The aforementioned individual phase and gain compensation of the control signal path associated with each of the three transducers is achieved by placing appropriate compensation circuitry in the control signal winding extending from the saturation controller 54 (FIG. 17) to the transducer to be compensated.

Each of the embodiments of the composite transducer structure 420 illustrated in FIGS. 18A, 18B and 18C have the additional advantage that the monolithic front core 400 may be of a material different from the material of the laminated back core 401. For example, the front core material may have magnetic anisotropy with an easy axis of magnetization oriented perpendicular to the plane of the transducing gap 26 to further enhance the transducing zone definition.

Comparison of the transducer embodiments of FIGS. 18A, 18B and 18C with the transducer embodiment of FIGS. 5 and 6 demonstrates that progressive saturation of the oppositely oriented confronting core halves having gradually increasing control flux path lengths in opposite directions (embodiments of FIGS. 18A, 18B and 18C) is similar to saturating the oppositely oriented wedge sections (embodiment of FIGS. 5 and 6). Consequently, the operation of the transducer embodiments of FIGS. 18A, 18B and 18C and of FIGS. 5 and 6 is similar, in that the transducer face is differentially saturated on opposite sides of the transducing gap 26 and that a high permeability transducing zone is formed which can be moved along the transducer width dimension, W. However, the transducer embodiments of FIGS. 18A, 18B and 18C are different in that the face 408 of the transducer body is saturated along its entire length rather than only a portion of it, as in the transducer embodiment of FIGS. 5 and 6.

As briefly described hereinbefore with reference to FIG. 16, a preferred embodiment of the tracking control circuitry 227 of the present invention has modes of operation that effect control of the location and movement of transducing zone 56 so that information signals can be transferred with respect to the tape record medium 42 at different relative transducer to tape transport velocities. Such modes are commonly employed to create slow and other abnormal motion effects from television information signals reproduced from the tape 42 as it is transported at speeds and in a direction different from the normal record and/or reproduce speed and direction of transport. During such modes, the location and movement of the transducing zone 56 is controlled to account for the different tape transport velocities by the variable speed reproduce servo 324. Once a speed and direction of transport of the tape 42 is selected, the servo 324 cooperates with the other circuitry of the tracking controller 227 to control automatically the location of the transducing zone 56 along the transducing gap 26 of the transducer 20. The control is exercised so that the transducing, zone 56 is maintained in registration with the selected path 126 of recorded information as it traces the selected path from its beginning to its end, and upon completion of a tracing of the selected path the position of the transducing zone is adjusted to the beginning of the proper track of recorded information signals that subsequently is to be reproduced. The servo 324 automatically provides for the gradual transverse movement of the transducing zone 56 along the transducing gap 26 of the transducer 20 as the selected path 126 is traced and the selective transverse reset movement of transducing zone in a direction opposite the direction of gradual movement at the end of the tracing of the selected path 126. The reset movement serves to position the transducing zone 56 at a location along the transducing gap 26 corresponding to the beginning of a track of recorded information signals other than the track along the tape that would be traced next in the absence of a reset movement of the transducing zone 56. The decision to adjust the position of the transducing zone 56 along the width of the transducing gap 26 of the transducer 20 depends upon the mode of operation of the record and reproduce apparatus, and whether the amount of transverse movement is within the predetermined limits that can be achieved by the transducer 20. If the transducing zone 56 is at one of the ends of the width of the transducing gap 26 of the transducer 20, it cannot be moved further in that direction. The total range of movement of the transducing zone 56 is selected to be within the practical limits determined by the width of the transducing gap 26 of the transducer 20.

A preferred embodiment of the variable speed reproduce servo 324 will now be described with reference to FIGS. 16, 19 and 20 as arranged to control the location and movement of the transducing zone 56 as the transducer 20 reproduces recorded television information signals from the tape 42 transported at different speeds and in different directions through the signal transfer station 106. When the record and reproduce apparatus is in a stop motion reproduce mode of operation, the transport of the tape 42 is stopped. The angle of the path traced by the transducing zone 56 relative to the tape 42 when the transport of the tape is stopped is different from the angle of the tracks as recorded on the tape. Hence, the transducing zone 56 must be moved through the course of reproducing the information signal from a track to maintain it registered on the track, and after each reproduction, to reposition it for tracing the same track again. In the stop motion mode, the transducing zone 56 is typically moved along the transducing gap 26 to reset its location at the completion of each trace of the track being reproduced so that the transducing zone traces the same track repeatedly as many times as is required for the desired duration of the display of the scene depicted by the repetitively reproduced television signal information. Thus, the information signal recorded in the track is reproduced over and over as a result of the tape 42 being stationary. During each repetitive reproduction of the recorded television signal information, the transducing zone 56 is moved gradually along the transducing gap 26 in a direction corresponding to a tape transport direction that is the reverse of that for normal record and reproduce operations. The total movement in the reverse direction corresponds to the distance of one track center to track center spacing, d, (FIG. 15) of the recorded tracks. Therefore, the transducing zone 56 must be reset a corresponding distance in the opposite, or forward direction, at the completion of each trace of the track in order to be correctly positioned to re-trace the same track. Thus, as the transducing zone 56 rotates with the transducer 20, it is moved along the width of the transducing gap 26 to maintain transducer to track registry, and is reset at the end of its trace of the track essentially one track spacing distance, d, in order to be in position for beginning the retrace of the same track.

Figure 20:
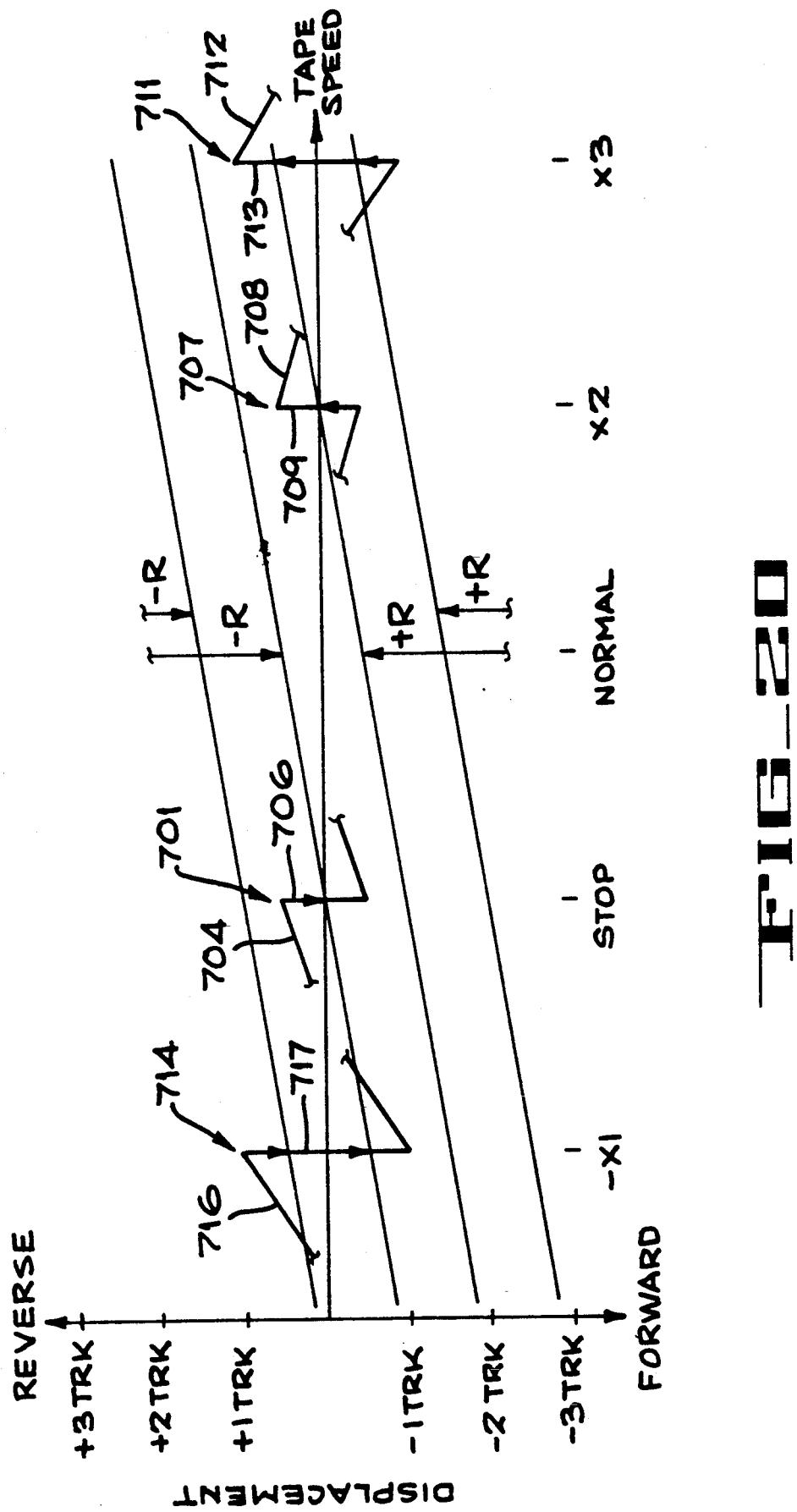
FIG. 20 is a diagram of various tracking geometry waveforms of control currents provided to a magnetic transducer for effecting electromagnetic movement of its transducing zone.

Referring now to FIG. 20, a transducing zone tracking geometry reset displacement control current waveform diagram 701 is illustrated for a stop motion mode of operation, in which a single field of television information recorded along a selected path 126 is repetitively reproduced to enable the display of a still image. This waveform includes ramp portions 704 as well as reset portions 706, and generally represents the waveform that is necessary to maintain the transducing zone 56 registered with one selected path 126 during the repetitive reproduction of television information signals from the selected path. The ramp portions 704 are provided to move the transducing zone 56 along the transducing gap 26 and, thereby, maintain the zone registered on the track of recorded information signals as it is traced to reproduce the signals. A reset portion 706 is provided at the completion of each tracing of the track to move the transducing zone 56 along the transducing gap 26 in a direction opposite that caused by the ramp portion 704 and, thereby, position the transducing zone to retrace the same track again. To effect the repetitive tracing of a track, hence repetitive reproduction of the television information signals recorded in such track, the control current waveform 701 is generated as a periodically occurring ramp signal having a period defined by the reset portions 706 corresponding to the duration of the one reproduction of the repetitively reproduced track of recorded television information signals.

A transducing zone reset displacement control current waveform for a slow motion mode of operation wherein the tape 42 is transported in the forward direction at a speed of, for example, ½ times the normal record and reproduce speed is similar to the waveform 701 for the stop motion mode of operation. However, the period of the control current ramp portion 704 is different. Instead of the reset portion 706 occurring at the completion of every trace of the tape 42 by the transducing zone 56, a reset portion occurs after every other one of such tracings by the transducing zone 56. Between consecutive resets of the location of transducing zone 56 along the transducing gap 26, the transducing zone is moved along the transducing gap according to a ramp function to account for the difference between the angle it would otherwise trace along the tape 42 and the angle of the track of recorded information signals on the tape. This allows the transducing zone 56 to trace two adjacent tracks in succession during successive rotations that occur between successive reset portions 706. By moving the transducing zone 56 along the transducing gap continuously in this manner, a sequence of recorded television is reproduced from the tape 42 in which every field is reproduced two times. Upon display, this sequence produces a slow motion effect corresponding to ½ times the normal motion represented by the recorded television information signals.

Other slow motion effects can be similarly created, with the rate of the motion effect depending how many of the recorded fields are repetitively reproduced and how many times each field is repetitively reproduced. In any event, at any slow motion mode of operation, i.e., any speed of tape transport in the forward direction between normal and stop, the applicable transducing zone reset displacement control current waveform is similar to the waveform 701. The only significant difference is the period of the control current ramp portion 704 defined by successive reset portions 706. This period is inversely proportional to the speed of transport of the tape 42.

In the two times normal fast motion mode of operation, the tape 42 is transported past the signal transfer station 106 (FIG. 16) in the forward direction at a rate that is two times the normal record and reproduce speed. Consequently, as a track of recorded information signals is traced by the transducing zone 56 during this mode, the recorded track being traced is advanced a distance in the forward direction of tape transport beyond the signal transfer station corresponding to the distance, d (FIG. 15), separating adjacent track centers. Therefore, to maintain registration between the transducing zone 56 and the track, the transducing zone must be moved along the transducing gap 26 in a direction corresponding to the forward direction of tape transport a corresponding distance during the trace of the track. Two times normal fast motion is achieved by reproducing every other recorded track at the normal field rate for the recorded television information signals, e.g., 60 Hz for television signals formatted according to the NTSC 525 line standard. By resetting the location of the transducing zone 56 along the transducing gap 26 in a direction corresponding to the reverse direction of tape transport at the conclusion of each tracing of a track a distance corresponding to the spacing distance between adjacent tracks, the transducing zone 56 skips the adjacent downstream track that it would normally trace if not reset, which contains the next field of the recorded sequence of television fields. Instead, the transducing zone 56 is positioned to trace the track that is located two recorded track positions from the track that it has just completed tracing. This track to be traced contains the second next field of the sequence. By moving the transducing zone 56 along the transducing gap 26 continuously in this manner, a sequence of every other recorded television field is reproduced from the tape 42, which upon display creates a fast motion effect corresponding to two times the normal motion represented by the recorded television information signals.

A transducing zone reset displacement control current waveform 707 for this two times normal fast motion mode of operation is illustrated in FIG. 20. As seen therein, the slope of the ramp portion 708 of the waveform 77 is opposite that for the stop and slow motion modes of operation. This occurs because the transducing zone 56 must be moved along the transducing gap 26 in a direction opposite the movement required for the stop and slow motion modes to maintain it registered on the track being traced, as previously described. For the same reason, the reset portion 709 for the waveform 707 is in a direction that is opposite that for the stop and slow motion modes of operation.

At any fast motion mode of operation wherein the tape 42 is transported in the forward direction of tape transport at a speed between the normal record and reproduce speed and two times the normal speed, the applicable transducing zone reset displacement control current waveform is similar to the waveform 707. The only significant difference is the period of the control current ramp portion 708 defined by successive reset portions 709. This period is inversely proportional to the speed of transport of the tape 42. In such fast motion modes, the rate of the fast motion effect created upon the display of the reproduce television information signal depends upon how often a recorded track is skipped by resetting the location of the transducing zone 56 along the transducing gap 26. The more frequently a track is skipped, i.e., the shorter the period between resets of the location of the transducing zone 56, the quicker the rate of the displayed fast motion effect.

FIG. 20 also illustrates a transducing zone reset displacement control current waveform 711 for an operating mode of three times normal fast motion. In this mode, the tape 42 is transported past the signal transfer station 106 (FIG. 16) in the forward direction of tape transport at a rate that is three times the normal record and reproduce speed. As a track is traced by the transducing zone 56 during this mode, the recorded track being traced is advanced a distance in the forward direction of tape transport corresponding to a distance of two times the distance, d (FIG. 15). Therefore, to maintain registration between the transducing zone 56 and the track, the transducing zone must be gradually moved along the transducing gap 26 in a direction corresponding to the forward direction of tape transport a corresponding distance during the trace of the track. Three times normal fast motion is achieved by reproducing every third recorded track at the normal field rate for television information signals. By resetting the location of the transducing zone 56 along the transducing gap 26 in a direction corresponding to the reverse direction of tape transport at the conclusion of each tracing of a track a distance corresponding to two times the track spacing distance, d, the transducing zone 56 skips the following two adjacent downstream tracks that it would normally trace if not reset. (These two downstream tracks contain the next two fields of the recorded sequence of television fields.) As a result of this resetting of the location of the transducing zone 56 along the transducing gap 26, it is positioned to reproduce the field recorded in the track that is located three recorded track positions from the track that it has just completed tracing. By moving the transducing zone 56 along the transducing gap 26 continuously in this manner, a sequence of every third recorded television field is reproduced from the tape 42, which upon display creates a fast motion effect corresponding to three times the normal motion represented by the recorded television information signals.

A transducing zone reset displacement control current waveform 711 for this three times normal fast motion mode of operation is illustrated in FIG. 20. As seen therein, the slope of the ramp portion 712 of the waveform 711 is similar to that for the two times fast motion mode of operation, differing only in being steeper, because of the higher speed of transport of the tape 42. The reset portion 713 for the waveform 711 is in the same direction as the reset portion 709 for the waveform 707, but corresponds to a distance of two times the track spacing distance, d.

At any fast motion mode of operation wherein the tape 42 is transported in the forward direction of tape transport at a speed within the range bounded by two times the normal record and reproduce speed and three times the normal speed, the applicable transducing zone reset displacement control current waveform is a composite of waveform 707 and waveform 711. At speeds of tape transport within this range, a sequence of resets will occur that is in the form of a pattern of both resets corresponding to one times the track spacing distance, d, and resets corresponding to two times the track spacing distance, d. The particular pattern of such resets is dependent on the particular speed at which the tape 42 is transported through the signal transfer station 106 (FIG. 16). Generally, at the higher speeds of tape transport within this range, the pattern of the reset sequence will include more resets corresponding to two times the track spacing distance, d. In such fast motion modes, the rate of the fast motion effect created upon the display of the reproduce television information signal depends upon how often a single recorded track is skipped and two recorded tracks are skipped b resetting the location of the transducing zone 56 along the transducing gap 26.

The more frequently a track is skipped only once in comparison to the skipping of two tracks, the less quick the rate of the displayed fast motion effect. Of course, quicker displayed fast motion effects will result as two tracks are skipped more frequently.

The preferred embodiment of the variable speed reproduce servo 324 (FIGS. 16 and 19) of the tracking control circuitry 227 also is capable of controlling the location and movement of the transducing zone 56 along the width of the transducing gap 26 to create reverse motion effects upon the display of television information signals reproduced from the tape 42 as it is transported in a direction the reverse of that of normal record and reproduce modes of operation. FIG. 20 illustrates a transducing zone reset displacement control current waveform 714 for a reverse motion mode of operation at a rate corresponding to the normal field rate for the recorded television information signals. In this mode, the tape 42 is transported past the signal transfer station 106 (FIG. 16) in the reverse direction of tape transport at a rate that is one times the normal record and reproduce speed. As a track is traced by the transducing zone 56 during this mode, the recorded track being traced is advanced a distance in the reverse direction of normal tape transport corresponding to a distance of one times the distance, d (FIG. 15). However, in this reverse motion mode of operation, the tracks of recorded television information signals must be reproduced in the reverse sequential order relative to the order in which they were recorded. Consequently, at the completion of the tracing of a track, the transducing zone 56 is at a location along the transducing gap 26 that is displaced a distance of two times the track spacing distance, d, from the location along the transducing gap that would register the transducing zone on the next track to be traced. A displacement of one of the two track spacing distances, d, results from the gradual movement of the transducing zone 56 along the transducing gap 26 in a direction corresponding to the direction in which the tape 42 is transported through the signal transfer station 106. The displacement of the second of the two track spacing distances, d, results from the location of the next track to be traced. This track was recorded earlier in the sequence of recorded tracks than the track whose tracing has just been completed. Thus, it is located downstream from the location on the tape 42 where the transducing zone 56 is registered at the completion of a tracing of a track a distance equal to two times the track spacing distance, d.

Therefore, to maintain registration between the transducing zone 56 and the track in the reverse motion mode, the transducing zone must be gradually moved along the transducing gap 26 in a direction corresponding to the reverse direction of tape transport a distance corresponding to one track spacing distance, d, during the trace of the track. One times reverse motion is achieved by reproducing every recorded track at the normal field rate for television information signals, but in the reverse order of the sequence in which they were recorded. By resetting the location of the transducing zone 56 along the transducing gap 26 in a direction opposite to that corresponding to the reverse direction of tape transport at the conclusion of each tracing of a track a distance corresponding to two times the track spacing distance, d, transducing zone 56 is positioned to reproduce an earlier recorded field in the track that is located adjacent and downstream relative to the track that it has just completed tracing. By moving the transducing zone 56 along the transducing gap 26 continuously in this manner, successive television fields are reproduced from the tape 42 in a sequence that is the reverse of that in which they were recorded. Upon display of this reverse sequence of reproduced television fields, a reverse motion effect is created.

The transducing zone reset displacement control current waveform 714 for this reverse motion mode of operation is illustrated in FIG. 20. As seen therein, the slope of the ramp portion 716 of the waveform 714 is similar to that for the stop motion mode of operation, differing only in being steeper, because of the transport of the tape 42 in the reverse direction. The reset portion 717 for the waveform 714 is in the same direction as the reset portion 706 for the waveform 701, but corresponds to a distance of two times the track spacing distance, d.

At any reverse motion mode of operation wherein the tape 42 is transported in the reverse direction of tape transport at a speed within the range bounded by one times the normal record and reproduce speed and zero speed, the applicable transducing zone reset displacement control current waveform is a composite of waveform 714 and waveform 701. At speeds of tape transport within this range, a sequence of resets will occur that is in the form of a pattern of both resets corresponding to one times the track spacing distance, d, and resets corresponding to two times the track spacing distance, d. The particular pattern of such resets is dependent on the particular speed at which the tape 42 is transported in the reverse direction through the signal transfer station 106 (FIG. 16). Generally, at the higher reverse direction speeds of tape transport within this range, the pattern of the reset sequence will include more resets corresponding to two times the track spacing distance, d.

FIG. 19 illustrates circuitry of a preferred embodiment of the variable speed reproduce servo 324 for carrying out the operations required to control the transducing zone 56 in accordance with the waveforms described hereinbefore with reference to FIG. 20. The particular mode of operation of the servo 324, hence, of the related record and reproduce apparatus is determined by an operator controlled mode select command provided by the system controller 132 (FIG. 1) on line 134, which extends to a mode select line 331 (FIG. 16). The mode select command controls the state of a two state switch 332 in the tracking control circuitry 227. When the record and reproduce apparatus is to be placed in the normal record and reproduce operating mode, the operator causes a mode select command to be placed on the line 331 that causes the switch 332 to be set in its open state. This disconnects the variable speed reproduce servo 324 from the summing circuit 323. As described hereinbefore, the tracking control circuitry 227 functions in this mode to control the location and movement of the transducing zone 56 along the width, W, of the transducing gap 26 so that the transducing zone is maintained in registration with the selected path 126 that is to be traced.

However, if the record and reproduce apparatus is to be placed in special motion effects operating modes, the operator causes a mode select command to be placed on the line 331 that sets the switch 332 in a state that couples the output line 333 to the input of the summing circuit 323. This results in combining the tracking geometry error correction signal generated by the variable speed reproduce servo 324 with the tracking position error correction signal output by the synchronous detector 313 over the line 322 that extends to the other input of the summing circuit 323. As previously described, the combined signal provided at the output of the summing circuit 323 is further processed in the tracking control circuitry 227. The combined signal is thereafter coupled to the saturation controller 54 to effect control of the control currents I1 and I2 provided to the transducer 20 in accordance with the combined signals, and thereby control the location and movement of the transducing zone 56 along the width, W, of the transducing gap 26 so as to reproduce the recorded television information signals in accordance with the commanded special motion effect.

The reset strategy executed by the variable speed reproduce servo 324 is determined by a reset signal generator 732. Depending on the operating mode of the record and reproduce apparatus and the tape speed and direction of transport, the reset signal generator issues appropriate reset signals and couples them to a resettable ramp generator 733. The resettable ramp generator 733 responds to reset the location of the transducing zone 56 (FIG. 16) along the transducing gap 26 upon completion of the tracing of the selected path 126 to position the transducing zone at the beginning of the next track of recorded television information signals to be reproduced. During the interval between successive reset signals, the ramp generator 733 provides a ramp signal on its output line 333 to move the transducing zone 56 gradually along the transducing gap and, thereby, maintain the transducing zone registered with the selected path 126 as it traces a path along the tape record medium 42. As will be appreciated from the foregoing, the reset signal generator 732 and ramp generator 733 cooperate to effect the generation of the tracking geometry error correction signal for controlling the location and movement of the transducing zone 56 along the transducing gap 26 in accordance with a waveform pattern described previously with reference to FIG. 20 as the tape 42 is transported through the signal transfer station 106 at a speed and/or in a direction other than the normal speed and direction for transferring television information signals with respect to the tape.

To effect the generation of the tracking geometry error correction signal, the ramp generator 733 is coupled to receive the tracking position error signal from the synchronous detector 313 (FIG. 16) via the line 318 and a signal provided over line 731 indicative of the speed at which the tape 42 is transported through the signal transfer station 106. In the preferred embodiment, the ramp generator 733 is in the form of an integrator which responds to the speed indicative signal placed on line 731 to generate a ramp signal that has a slope which is determined by the speed of transport of the tape 42 and an average value that is determined by the tracking position error signal that is present on line 318. Thus, the tracking position error modulates the average level of the ramp signal as the transducing zone tracking position error changes. The tape speed indicative signal placed on line 731 is derived from the detected tape speed signal provided by a tape speed and direction detector 341 (FIG. 16), which is coupled by a line 342 to one input of a summing circuit 737. The other input of the summing circuit 737 receives a negative X1 tape speed offset reference signal over a line 736 for combining with the detected tape speed indicative signal on line 342. The offset reference signal normalizes the tape speed indicative signal provided to the ramp generator to the normal X1 record and reproduce speed of tape transport. In the preferred embodiment of the tracking control circuitry 227, the detected tape speed signal is conveniently obtained from a tachometer 140 (FIG. 1) operatively linked to the transported tape 42. However, the speed of transport of the tape 42 through the signal transfer station 106 can be detected in other ways, if desired. Timing signals recorded in the direction of the length dimension of the tape 42 contain information from which the tape speed can be detected. In helical scan record and reproduce apparatus, the frequency of the horizontal synchronizing signals included in the reproduced television information signals varies as the speed of transport of the tape 42, because the tracks along which the television information signals are recorded extend substantially in the direction of transport of the tape. Consequently, the speed of tape transport can be detected by separating the horizontal synchronizing pulses from the reproduced television information signals and measuring their frequency. Recorded control track signals are another type of signal that contain information from which the speed of transport of the tape 42 through the signal transfer station 106 can be detected.

When a tape tachometer is employed to detect the speed of transport of the tape 42, typically, a conventional capstan or idler tachometer is used. Such devices provide a train of pulses whose rate is proportional to the tape speed. Regardless of the source of the tape speed related signal, the signal is coupled to the input of the tape speed and direction detector 341 over a line 344, and the detector 341 responsively generates the detected tape speed signal that is coupled by the line 342 to the summing circuit 737.

The ramp generator 733 is responsive to the tape speed indicative signal provided on line 731 to generate a ramp signal at its output extending to the line 333 whose slope is proportional to the indicated tape speed. However, as described generally hereinbefore with reference to FIG. 20, the variable speed reproduce servo 324 is capable of controlling the location and movement of the transducing zone 56 along the transducing 26 as the tape 42 is transported in reverse direction, as well as in the normal forward direction of tape transport. To distinguish between the opposite directions of possible transport of the tape 42 through the signal transfer station 106, the ramp generator 733 is coupled by a line 343 to the output of the tape speed and direction detector 341 (FIG. 16). A tape transport direction signal is provided on this line by the detector 341, which is arranged to detect the direction of tape transport in a conventional manner from the tape tachometer pulses received over line 344.

In the preferred embodiment of the variable speed reproduce servo 324, level detectors 741, 742, 743 and 744 are employed to determine if reset signals are to be provided by the reset signal generator 732 to effect the resetting of the transducing zone 56 along the width, W, of the transducing gap 26 upon completion of the tracing of a selected path 126. In this regard, in helical scan record and reproduce apparatus using one transducer 20 for recording and reproducing television information signals along the tape 42 as it is transported in a helical path around a cylindrical tape guide drum 250, such as illustrated in FIGS. 13 and 14, each time the transducer rotates, a drop out interval occurs in the reproduced television information signals. The occurrence of the dropout interval is synchronous with the rotation of the transducer 20, and occurs each rotation while the transducer traverses the space between the two tape guide posts 240 and 242. The timing of each reset signal is advantageously set, in the exemplary embodiment of the present invention, to occur during the dropout interval, and the amplitude of the reset signal effecting the resetting of the transducing zone 56, depicted by the reset portions 706, 709, 713 and 717 in the displacement control current waveforms in FIG. 20, is shown to be that which produces a transverse movement of the transducing zone 56 that is equal to one or two track spacing distances, d, depending on the speed and direction of transport of the tape 42. It is advantageous to time the resetting of the transducing zone 56 with the occurrence of the dropout interval, because that interval typically occurs during the vertical blanking period of the television information signal, which provides more than sufficient time to reposition the transducing zone 56 properly along the transducing gap 26 before the video image portion of the recorded television information signal is positioned to be reproduced by the transducing zone. However, it is not a requirement of the present invention that the resetting of the transducing zone 56 be timed to occur during a dropout interval. For example, in record and reproduce apparatus characterized by recording formats without dropout intervals or with the vertical blanking period not aligned with the end of the recorded track, or in data recording apparatus for signals other than television information signals, the resetting of the position of the transducing zone 56 may be selected to occur during the intermediate portion of a track being traced while a segment of information is transferred with respect to the tape 42 by another transducer that traces portions of adjacent tracks. In such embodiments, the transducing zone 56 is reset between intermediate locations of adjacent tracks to, for example, retrace portions of the adjacent tracks.

However, in the exemplary embodiment of the present invention, resetting of the transducing zone 56 is synchronized to occur during dropout intervals that occur at the completion of the tracing of recorded tracks. In this regard, the reset signals are generated in response to a processed drum once around tachometer signal that activates a gate circuit 746 to couple them to a line 747 that extends to the ramp generator 733. The processed once around tachometer signal is derived from a pulse generated by a tachometer 142 (FIG. 1) operatively associated with the rotating upper drum portion 252 of the transducer-drum assembly 240 (FIGS. 13 and 14), one pulse being provided for each revolution of the rotating drum portion 252, hence, the transducing zone 56. Conventional tachometer processing circuitry provides the pulse at the desired system time and of selected width on a line 351 extending to the tracking control circuitry 227. For reasons that will become more apparent upon consideration of the following description of the reset signal generator 732, the processed once around tachometer signals are coupled to the gate circuit 746 through a delay circuitry 748. When the gate circuitry 746 is activated by a delayed once around tachometer signal, a predetermined pulse of current appears on line 747 and is applied to the integrator of the ramp generator 733 for the purpose of resetting the signal level at the output on line 333. The activation of the gate circuit 746 produces a reset step in the output provided by the ramp generator 733 of predetermined value that will correspond to the proper amplitude reset step required to move the transducing zone 56 along the transducing gap 26 at the completion of the tracing of a selected path 126 the distance required to locate it at the desired position along the transducing gap for tracing the next selected path during the revolution of the transducer 20.

The amplitude of the pulse of current provided by the gate circuit 746 will be one of two values, and in one of two directions, depending on the speed and direction of tape transport. The various amplitudes and directions of the pulse of current are exemplified by the displacement control current waveforms illustrated in FIG. 20. The particular pulse of current provided by the gate circuit 746 is determined by level detectors 741, 742, 743 and 744. More specifically, the output of the ramp generator 733 is coupled by the line 333 to one input of each of the four level detectors 741, 742, 743 and 744, each of which effectively monitors the instantaneous amplitude value of the signal on line 333 to determine the position of the transducing zone 56 along the transducing gap 26, and, thereby, if reset pulses are to be generated for resetting the position of the transducing zone. Each level detector 741, 742, 743 and 744 has its other input coupled to one of the lines 751, 752, 753 and 754, respectively, which is provided with a threshold signal value that corresponds to one of a plurality of locations of the transducing zone 56 along the transducing gap 26 that will result in a resetting of the transducing zone. In the exemplary embodiment of the variable speed reproduce servo 324 of FIG. 19, level detector 741 receives a threshold signal value on its control input 751 corresponding to the transducing zone 56 being positioned along the transducing gap 26 beyond its nominal, undisplaced location in a direction which is opposite the forward direction of tape transport for the normal record and reproduce mode of operation. Thus, if the instantaneous level of the ramp signal on line 333 exceeds the value of the threshold signal on line 751, i.e., the transducing zone 56 is displaced beyond its nominal location in the direction opposite the forward direction of tape transport, the level detector 741 provides an output signal that is coupled to activate the gate circuit 746. If this condition occurs at the time of the occurrence of a once around tachometer signal on line 351, the output signal provided by the level detector 741 activates the gate circuit 746 to issue a reset step signal that effects displacement of the transducing zone 56 along the transducing gap 26 in the forward direction a distance corresponding to one track spacing distance, d. The tracking geometry or displacement waveform diagram 701 in FIG. 20 depicts this operation. (In the following description, the terms "forward" and "reverse" will be used in the context of forward and reverse directions of tape movement, with the forward direction being the direction of transport of the tape 42 during the normal record and reproduce operating mode.)

The level detector 742 has its control input 752 coupled to receive a threshold signal value corresponding to the transducing zone 56 being positioned along the transducing gap 26 beyond a location displaced in the reverse direction from its nominal undisplaced location a distance corresponding to one track spacing distance, d. If the instantaneous voltage level of the ramp signal on line 333 exceeds the value of the threshold signal on line 752, i.e., the transducing zone 56 is displaced beyond its nominal location in the reverse direction a distance greater than one track spacing distance, d, the level detector 742 provides an output signal that is coupled to activate the gate circuit 746. If this condition occurs at the time of the occurrence of a once around tachometer signal on line 351, both level detectors 741 and 742 provide output signals. This activates the gate circuit 746 to issue a reset step signal that effects displacement of the transducing zone 56 along the transducing gap 26 in the forward direction a distance corresponding to two times the track spacing distance, d. The tracking geometry or displacement waveform diagram 714 in FIG. 20 depicts this operation.

The level detector 743 has its control input 753 coupled to receive a threshold signal value corresponding to the transducing zone 56 being positioned along the transducing gap 26 beyond a location displaced in the forward direction from its nominal undisplaced location a distance corresponding to one track spacing distance, d. Should the instantaneous level of the ramp signal on line 333 be less than the value of the threshold signal on line 753, i.e., the transducing zone 56 is displaced beyond its nominal location in the forward direction of tape transport, the level detector 743 provides an output signal that is coupled to activate the gate circuit 746. If this condition occurs at the time of the occurrence of a once around tachometer signal on line 351, the output signal provided by the level detector 743 activates the gate circuit 746 to issue a reset step signal that effects displacement of the transducing zone 56 along the transducing gap 26 in the reverse direction a distance corresponding to one track spacing distance, d. The tracking geometry or displacement waveform diagram 707 in FIG. 20 depicts this operation.

The fourth level detector 744 has its control input 754 coupled to receive a threshold signal value corresponding to the transducing zone 56 being positioned along the transducing gap 26 beyond a location displaced in the forward direction from its nominal undisplaced location a distance corresponding to one track spacing distance, d. If the instantaneous level of the ramp signal on line 333 is less than the value of the threshold signal on line 754, i.e., the transducing zone 56 is displaced beyond its nominal location in the forward direction of tape transport a distance greater than one track spacing distance, d, the level detector 744 provides an output signal that is coupled to activate the gate circuit 746. If this condition occurs at the time of the occurrence of a once around tachometer signal on line 351, both level detectors 743 and 744 provide output signals. This activates the gate circuit 746 to issue a reset step signal that effects displacement of the transducing zone 56 along the transducing gap 26 in the reverse direction a distance corresponding to two times the track spacing distance, d. The tracking geometry or displacement waveform diagram 711 in FIG. 20 depicts this operation.

If the level detectors 741, 742, 743 and 744 are provided fixed threshold signal values, it is possible the average position of the transducing zone 56 along the transducing gap 26 will not always be centered relative to its nominal undisplaced position along the transducing gap as it is caused to be moved in accordance with a tracking geometry waveform generated by the variable speed reproduce servo 324. To avoid the generation of tracking geometry waveforms that, on the average, do not maintain the transducing zone 56 centered relative to its nominal undisplaced position along the transducing gap 26, threshold signal values are provided to the level detectors that vary according to the speed of transport of the tape 42. More particularly, the control inputs 751, 752, 753 and 754 of the level detectors 741, 742, 743 and 744, respectively, are coupled to receive the normalized tape speed indicative signal present on line 731. If necessary because of the relationships required of the various circuits included in the variable speed reproduce servo 324, the normalized tape speed indicative signal present on line 731 is further processed so that, as coupled to the control inputs of the level detectors 741, 742, 743 and 744, it effects generation of tracking geometry waveforms that result in the desired centering of the transducing zone 56.

To account for the various threshold signal values necessary to effect the generation of the various tracking geometry waveforms described hereinbefore, the normalized tape speed indicative signal is biased to selected voltage levels before coupling to the control input lines 751, 752, 753 and 754 of the level detectors. These voltage levels are selected to correspond to the reset activating values described hereinbefore. Because the level detector 741 is activated to cause the generation of a reset step whenever the transducing zone 56 is positioned along the transducing gap 26 beyond its nominal undisplaced position, a bias of zero is selected for the level detector 741. Consequently, the normalized tape speed indicative signal can be coupled directly to the control input line 751.

However, the level detectors 742, 743 and 744 require a bias other than zero. To apply the appropriate bias to the normalized tape speed indicative signal, one input of each of the summing circuits 762, 763 and 764 is coupled between the line 731 and one of the control input lines 752, 753 and 754, respectively. The summing circuit 762 receives a bias over its other input 766 corresponding to a displacement of the transducing zone 56 beyond its nominal undisplaced position in the reverse direction a distance of one track spacing distance, d. The summing circuit 763 receives a bias over its input 767 corresponding to a displacement of the transducing zone 56 beyond its nominal undisplaced position in the forward direction a distance of one track spacing distance, d. The summing circuit 764 receives a bias over its input 768 corresponding to a two track spacing distance, d, displacement of the transducing zone 56 beyond its nominal undisplaced position. The respective summing circuits combine these biases with the received normalized tape speed indicative signal to generate the tape speed dependent threshold signal levels that are applied to the control input lines 752, 753 and 754, which extend to the control inputs of the level detectors 742, 743 and 744, respectively. With the thusly generated tape speed dependent threshold signal levels, the reset generator 732 is controlled by the level detectors 741, 742, 743 and 744 to cause the variable speed reproduce servo 324 to generate tracking geometry waveforms that maintain the transducing zone 56 centered relative to its nominal undisplaced position as it is moved along the transducing gap 26 to maintain registration with tracks along the tape 42 as it is rotated to trace a path along the tape.

To generate the reset pulses, each of the level detectors 741, 742, 743 and 744 has respective output lines 771, 772, 773 and 774 respectively coupled to the D input of latches 781, 782, 783 and 784. The Q outputs of the respective latches are coupled via lines 791, 792, 793 and 794 to the input of a summing circuit 796. Inverters 786 and 787 are placed between the latches 781 and 782 respectively, and the summing circuit 796 to account for the different reset direction to be executed by the transducing zone 56 in response to the outputs of the level detectors 741 and 742 in contrast to that executed in response to the outputs of the level detectors 743 and 744. The summing circuit 796 functions to combine the reset step signals present on lines 791, 792, 793 and 794 and, thereby form the reset portion of the transducing zone displacement waveforms depicted in FIG. 20. The combined reset step signal formed by the summing circuit 796 is coupled by its output line 797 to the signal input of the gate circuit 746, which couples the level of the signal present on its signal input to the ramp generator 733 at the occurrence of the delayed once around tachometer signal, as generally described hereinbefore.

To effect the generation and coupling to the ramp generator 733 of the reset step signal, the line 351 receiving the processed once around tachometer signal is coupled to the clock, CK, inputs of the latches 781, 782, 783 and 784 and to the delay circuit 748. The delay circuit 748 has an output line 750 coupled to the control input of the gate circuit 746. The processed once around tachometer signal is used to clock the latches 781, 782, 783 and 784 and, thereby, latch the condition of each of the outputs of the level detectors 741, 742, 743 and 744, respectively. This latching results in determining whether a step reset of the transducing zone 56 is required before the gate circuit 746 is enabled by the delayed tachometer signal to couple the reset step signal to the ramp generator 733. Following a suitable interval after this latching of the outputs of the level detectors, the delayed tachometer signal is placed on line 750 extending to the control input of the gate circuit 746 to enable it to couple to the ramp generator 733 the reset step signal formed by the summing circuit 796.

In operation, if the instantaneous level of the ramp signal on line 333 at the occurrence of the processed once around tachometer signal on line 351 exceeds a particular value of the threshold signal level applied at the input of one or more of the level detectors 741, 742, 743 and 744, the output line associated with each output of a level detector whose threshold signal level is exceeded will be active, and its condition is latched into the associated latch by the clocking action of the processed once around tachometer signal on line 351. At the occurrence of the delayed processed once around tachometer signal on line 750, the gate circuit 746 is enabled and the contents of the latches holding active condition status combined by the summing circuit 796 are coupled as a reset step signal to the line 747 that extends to the reset input of the ramp generator 733. This signal causes a resetting of the level of the ramp signal. For convenience, the delay circuit 748 is arranged to delay the processed once around tachometer signal so that it appears on the line 750 an interval after the unprocessed tachometer signal was generated corresponding to the period of the once around tachometer signal. This times the occurrence of the delayed tachometer signal on line 750 at the following dropout interval. Because of this, the once around tachometer signal is processed so that it is placed on the line 351 extending to the clock inputs of the latches 781, 782, 783 and 784 a short time following the actual occurrence of the dropout giving rise to its generation.

As a result of the aforedescribed operation of the reset generator 732 and ramp generator 733, the variable speed reproduce servo 324 generates a tracking geometry error correction signal that is combined at the summing circuit 323 (FIG. 16) with the tracking position error signal provided by the servo compensator 321 to form the composite tracking error signal. As previously described, this composite signal is coupled to the saturation controller 54 to effect adjustment of the location of the transducing zone 56 along the transducing gap 26 to maintain the transducing zone registered on the selected path 126.

The variable speed reproduce servo 324 can take various forms to effect the desired control of the location and movement of the transducing zone 56 along the transducing gap 26. For example, the preferred embodiment described herein monitors the level of the ramp signal present on the output line 333 of the ramp generator 733 to detect the location of the transducing zone 56 along the width, W, of the transducing gap 26 in order to determine when the location of the transducing zone must be reset. However, other techniques of detecting the location of the transducing zone 56 can be used as well. The vertical synchronizing signal contained in the reproduced television information signal can be separated conventionally therefrom and employed for this purpose by measuring the time of its occurrence against a stable reference. The occurrence of the vertical synchronizing signal will vary relative to a stable reference with the variation of the speed and direction of transport of the tape 42. If this technique is employed, it is unnecessary to provide the ramp generator 733 information concerning the tracking position error. The vertical synchronizing signal included in the reproduced television information signal also can be employed to time the operation of the gate circuit 746 and the latches 781, 782, 783 and 784. In such embodiments, the separated vertical synchronizing signal is employed much in same way as the once around tachometer signal. Embodiments of the resettable ramp generator 733 also can be arranged to generate a ramp from the tracking position error signal 318 provided by the synchronous detector 313. In such embodiments, the ramp generator 733 relies on the action of the servo loop around the movable transducing zone 56 in forcing the generation of a ramp signal of an appropriate slope to compensate for misregistrations between the transducing zone 56 and the selected path 126 at speeds and direction of tape transport other than the normal record and reproduce speed and direction of transport.

The previously described embodiments of the present invention are arranged to employ magnetic signal transducers in which the transducing zone 56 that transfers information signals with respect to a magnetic record medium is within the same magnetically permeable body as the transducing gap 26 that defines the location of the transducing zone. FIGS. 21 through 25 illustrate embodiments of a magnetic signal transducer 20 having a core 500 of magnetically permeable material that defines the transducing gap 26 and an associated body 228 of magnetically permeable material, having the same characteristics as a keeper, provided as an intermediary between the magnetic recording medium (not shown in FIGS. 21-25) and the transducer core 500. Upon magnetic saturation of the transducer core 500 in the manner described hereinbefore with respect to the other embodiments of the transducer, an image of the physical transducer gap 26 is established in the keeper body 228. The magnetic control flux that establishes the saturated regions in transducer core 500 fringes from the physical transducing gap 26, and is shunted by the keeper 228 to form an image of the transducing gap therein. The keeper 228 is selected to have a thickness in the direction of the depth dimension of the physical transducing gap 26 so as not to be saturated by the flux established in it by the information signal being transferred between the transducer 20 and the magnetic record medium, but yet not thick enough that the control flux has to be so strong that it unintentionally erases or otherwise undesirably influences the recorded flux on the magnetic record medium. In general, the thickness of the keeper 228 is determined by the same criteria that determines the depth of the physical transducer gap 26 in the transducer core 500. The position of the keeper 228 relative to the core 500, and the desired level of the magnetic control field to create saturation must also be taken into consideration. Moreover, the reluctance provided by the keeper 228 to magnetic flux is selected relative to the reluctance through the transducer core 500 to assure a desired transmission of information signals between the transducer 20 and the magnetic record medium. The relative reluctances are achieved through the selection of an appropriate combination of keeper thickness, keeper material, size of area of transducer pole faces, width of saturated keeper region, thickness of any air gap separating the transducer 20 and the magnetic record medium during signal transfers and other parameters determinative of the relative reluctances of the keeper 228 and the transducer core 500.

Figure 21:
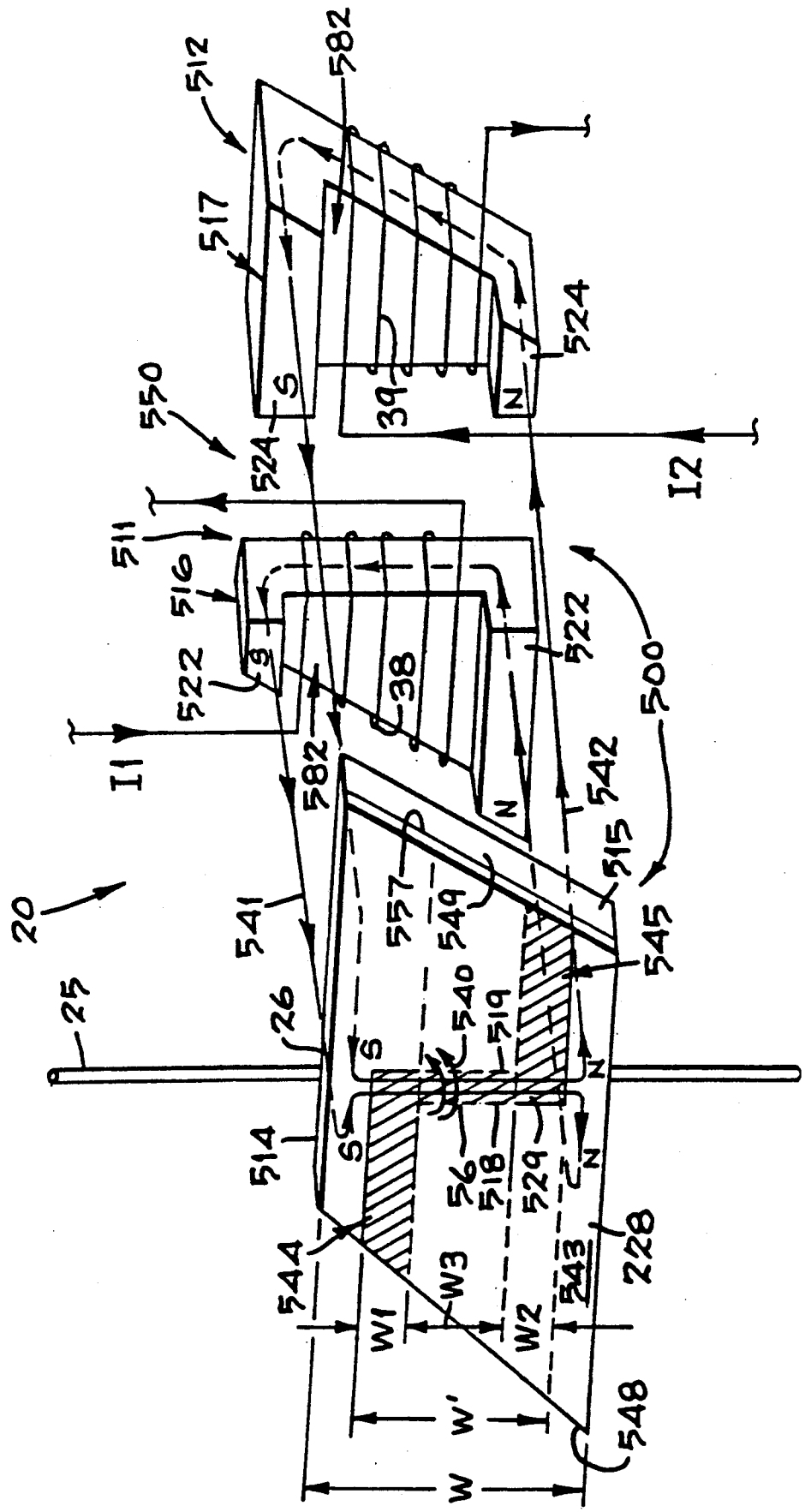
FIG. 21 is a simplified, exploded perspective view of another embodiment of a magnetic transducer having a transducing zone that is movable electromagnetically within the transducer having an associated magnetically permeable body into which the transducing zone is imaged to effect the transfers of information signals between the transducer and magnetic record medium.

FIG. 21 illustrates an arrangement in which the keeper 228 is physically located between the transducer core 500 and the magnetic record medium 42 (see FIGS. 1 and 16). However, it should be understood that while in FIG. 21 the keeper 228 is illustrated as being in physical contact with the transducer core 500, it may be positioned spaced from the transducer core 500 in physical contact with the magnetic record medium 42, or it may be spaced both from the magnetic medium and the transducer core. The keeper 228 can even be physically separated from the transducer core 500 by the magnetic record medium. In any case, the general flux flow between the transducer core 500, the keeper 228 and record medium 42 will be the same. This location of the keeper 228 between the magnetic record medium and the core 500 is preferred in those instances in which it is desired to physically separate the medium and core, such as when it is desired to prevent head wear.

The foregoing will be better understood and appreciated by reference to the specific implementation of the same in the embodiments of the invention described below.

Referring now to FIG. 21, transducer 20 has two confronting half cores 511, 512 made of a magnetic material, for example ferrite. Each half core 511, 512 has a front core 514, 515 and a back core 516, 517 abutting respectively at confronting surfaces 522 and 524. The front cores 514, 515 are made in the form of oppositely oriented wedge sections, confronting at the plane defined by the transducing gap 26. The oppositely oriented wedge sections of each confronting half core 511, 512 have cross sectional areas gradually increasing in opposite directions across the width W of the transducer 20.

The confronting front cores 514, 515 are preferably smoothly lapped and polished at the plane of the transducing gap 26 to obtain confronting magnetic pole faces 518, 519. A winding window (not seen in FIG. 21) is provided in a well known manner in one or both front cores 514, 515 across the width W of transducer 20 to accommodate a transducing signal winding 25. As an example, the winding 25 is shown as a single turn winding in the form of a conductive rod. However, a conventional multiturn winding may be utilized instead.

A suitable nonmagnetic material is placed between the front cores 514 and 515 at locations corresponding to the pole faces 518, 519 to obtain a transducing gap 26, utilizing conventional transducing gap forming techniques. For example, a layer of silicon dioxide or glass may be deposited on the confronting surfaces of the front cores 514 and 515, which surfaces then may be bonded together in a well known manner. Further reference to gap 26 will be as a "physical" gap to better distinguish it from a magnetically formed "virtual" gap in the keeper 228, as will be described below in detail.

In the embodiment shown in FIG. 21, respective grooves 582 are provided in the back cores 516, 517 inwardly of the lateral surfaces 522, 524. Grooves 582 serve to accommodate the control windings 38, 39 of each back core 516, 517 respectively. By placing the control windings 38, 39 in recesses provided by grooves 582 the confronting lateral surfaces of the front and back cores at 522 and 524 are in intimate contact with each other. Air gaps between the front and back cores are thereby substantially eliminated while a desired tight, low reluctance magnetic coupling between these cores is obtained.

Alternatively, other back core designs may be provided, which differ from that shown in FIG. 21, for example, as described and shown in my above-identified copending application Ser. No. 715,211.

A keeper 228 of thin magnetic material, is arranged over front surfaces 557 of the front cores 514, 515 in direct contact therewith and bridging the physical gap 26. The keeper 228 is preferably made of a soft magnetic material having a substantially square hysteresis loop, that is, low coercivity and high permeability values, such as permalloy, Sendust, ferrite or amorphous metal. The keeper 228 preferably has a very small thickness, t, in the direction of the depth of the transducing gap 26, preferably between 0.00025 and 0.002 inch.

In the embodiment of FIG. 21, the overall size of the planar surface of the keeper 228 matches that of the underlying surface 557 of the front cores. Alternatively, the keeper may differ in size, while it bridges the physical transducing gap 26 provided between the confronting surfaces of the front cores 14, 15.

In this embodiment, the back cores 516, 517 are also formed as oppositely oriented wedge sections similar to the front cores 514, 515. Alternatively, the back cores may be of a rectangular or any other convenient shape suitable to provide a control flux for selectively saturating the front cores 514, 515. The control windings 38, 39 are wound around each back core 516, 517 at right angles to the direction in which the transducing signal winding 25 passes through the front cores. By the foregoing arrangement of the signal and control windings, a respective signal (transducing) flux 540 and control fluxes 541, 542 are induced in the transducer ores. The control fluxes 541, 542 extend substantially in a perpendicular direction to the signal flux 540 and they flow substantially in parallel to the width W of gap 26, thereby substantially reducing their influence on the signal flux.

Preferably the keeper 228 is deposited by vacuum sputtering or plating directly on the surface 557 of front cores 514, 515 utilizing well known material deposition techniques.

The combined cross sectional areas of each front core 514, 515 and keeper 228 in a plane perpendicular to the control flux paths 541, 542 are selected smaller with respect to corresponding cross sectional areas of the back cores 516, 517, to assure that the back cores will not be saturated by the control fluxes. Also, the material of the back cores may be selected to have a greater saturation density than the material of the front cores, to avoid saturation of the back cores before the front cores.

With further reference to FIG. 21 respective control currents I1, I2 generated by the saturation controller 54 (FIG. 16) are applied to the control windings 38, 39. A magnetic control flux is thereby induced in each back core 516, 517 in a direction perpendicular to the direction of the control current flow, as illustrated by control flux lines 541, 542. The control flux from the back cores 516, 517 is coupled into the closely spaced front cores 514, 515, respectively, and into the keeper 228 superposed therewith. When orienting the control currents I1, I2 such that both control fluxes 541, 542 extend in the same sense as it is shown in FIG. 21, interference between these control fluxes across the transducing gap 26 is significantly reduced.

In the embodiment of FIG. 21, the magnitude of the control current I1 is selected such that a resulting control flux 541 induced from the back core 516 into the front core 514 saturates a portion 544 thereof and of the overlying keeper layer 228, having a width W1. It is further shown in FIG. 21 that the magnitude of control current I2 is selected to induce a control flux 542 from back core 517 into front core 515 and the overlying keeper layer 228 to saturate a portion 545 having a width W2. The respective saturated portions are designated by cross-hatched areas.

In this particular transducer embodiment, the uppermost and lowermost portions of the front cores will not become saturated in areas where the front and back cores are in intimate contact with each other. This is due to an enlarged crosssectional area at these portions and thus lower flux density perpendicular to the control flux paths 541, 542. Therefore, only areas within a reduced width W' will be saturated.

Because of its very small cross sectional area in the direction perpendicular to the flux paths 541, 542 the entire portion of the keeper 228 which bridges the physical gap 26 is saturated along the width W' by the control fluxes 541, 542 as shown by cross-hatched area 529. Thus, the saturated area 529 represents a virtual transducing gap 529 projected from the physical gap 26 into the keeper 228. The saturated core portions 544, 545 define respective adjacent highly permeable nonsaturated portions or regions which overlap across the virtual gap 529. The overlapping permeable portions separated by the virtual gap 529 define a highly permeable transducing zone 56 of a width W3 in the keeper 228. More specifically, an upper edge of the transducing zone 56 is defined by the saturated zone 544 and its lower edge by the saturated zone 545. It is seen from FIG. 21 that the total gap width W'=W1+W2+W3 equals a constant, while a portion thereof having a width W3 becomes effective as a transducing zone 56 when control currents I1, I2 are applied.

By increasing the magnitude of one control current, for example I1, while proportionally decreasing the magnitude of the other control current I2, the respective widths W1, W2, change proportionally and the transducing zone 56 can be selectively moved along the width W' of the physical transducing gap 26. For example, when it is desired to move the transducing zone 56 at a high speed along the width W', control windings 38 and 39 are coupled to the saturation controller 54 (FIG.

16), which in turn is controlled by the tracking controller 227 to periodically change inversely linearly the magnitudes of both currents I1, I2, thereby inversely changing the widths W1, W2 of the saturated portions 544, 545. The effect of this control is movement of the transducing zone 56 along the width, W', of the virtual transducing gap 529 in the manner previously described with reference to the tracking control circuitry 227 of FIGS. 11, 16, 19 and 20. To maintain a constant width W3 of the transducing zone 56 during such control, it is necessary to maintain a constant sum of the changing control currents, that is, I1+I2 equals a constant.

To obtain the above-described selectively saturated portions of front cores 514, 515 and keeper 228, the saturation control circuit 54 illustrated in FIG. 11 may be utilized to supply respective control currents I1, I2 to control windings 38, 39 as described previously.

To obtain a high quality performance by this embodiment of the transducer 20, a well defined boundary between adjacent saturated and unsaturated areas of the front cores 514, 515 and superposed keeper 228 is desirable. This is obtained in the preferred embodiment by selecting the shape of the confronting front cores such that a maximum rate of change in permeability between adjacent cross-sectional areas of each core is obtained across the transducer width W. The foregoing assures that while a selected area of each front core is saturated by a control current so that no appreciable flux passes therethrough, an immediately adjacent contiguous area remains sufficiently permeable as is necessary for transducing information signals. Consequently, the performance of the transducer 20 depends on the steepness of a permeability versus flux density gradient between each adjacent saturated and nonsaturated region within each front core.

The sharp permeability versus flux density gradient desired for forming a well defined transducing zone 56 is obtained by selecting a material for the transducer core 500 and the keeper 228 having a steep permeability versus flux density gradient, and by designing the wedge sections such that large flux density changes take place between adjacent cross-sectional areas over the transducer width W'. The ferrite material manufactured by Ampex Corporation and identified as PS52B is a suitable material for constructing the core 500 and keeper 228. The permeability m versus flux density B characteristic of this material is illustrated in FIG. 8. The wedge shaped front and back core sections 514, 515 and 516, 517 are arranged to increase in size in opposite directions along the width dimension, W, of the transducer 20 to provide the desired oppositely directed reluctance gradients along the width dimension. The effect of so arranging the wedge shaped section is the same as that previously described with reference to FIGS. 9 and 10. It is understood that by superposing the keeper 228 on the front cores 514, 515 as shown in FIG. 21, the herein described control operation remains substantially unchanged.

A further increase in the permeability gradient can be achieved by use of a transducer core material having a magnetic anisotropy and oriented with an easy axis of magnetization perpendicular to the transducing gap plane.

To further maximize the flux density gradient between two adjacent cross-sectional areas for obtaining a desired maximum permeability versus flux density gradient, the wedge sections are shaped to obtain cross sectional areas of the wedge shaped front cores 514, 515 exponentially increasing in the direction of the transducer width W. The foregoing can be obtained by providing exponentially increasing side surfaces 548, 549 of front cores 514, 515 as shown in phantom in FIG. 9.

It is understood from the foregoing description of the operation of the transducer of FIG. 21 that the control flux 541 or 542 generated in one back core 516 or 517 should not be coupled into the other back core. Therefore, it is preferable to provide between these back cores 516, 517 a gap 550 of a substantially greater length with respect to a length of the transducing gap 26 provided between the front cores 514, 515. Preferably, the ratio is selected to be 10:1 or more.

To keep transducing signal flux losses at a minimum, it is preferable to provide the transducing winding 25 closer to the keeper 228 than to the front surfaces 522, 524 of the back cores 516 and 517, respectively.

While a transducer front surface 543 in the transducer-to-medium interface area is shown FIG. 21 as being generally flat, it may be contoured, if desired, utilizing well known contouring techniques. In that event, it is understood that the keeper 228 will also assume the contoured shape.

It is preferable to hold the resulting transducer structure in a nonmagnetic holder (not shown) and to bond the respective transducer core element together, for example by epoxy, utilizing well known bonding techniques. However, the holder and bonding material are not shown in the drawings to obtain better clarity of representation of the transducer 20.

As has been described with respect to the embodiment of the transducer 20 illustrated in FIG. 21, the respective control fluxes 541, 542 extend substantially in perpendicular paths to the direction of the transducing signal flux 540, resulting in reduction of interference between these fluxes. However, this is not a necessary condition for proper operation of the transducer in accordance with the present invention. Because of the presence of the saturable keeper 228, the fringing flux outside the useful transducing zone 56 is confined within the keeper, thereby eliminating the abovedescribed disadvantages of prior art transducers related to cross talk and signal erasure in general.

In the embodiment of the transducer 20 of FIG. 21 the control currents I1, I2 in the respective control windings 38, 39 have the same direction, resulting in control flux paths 541, 542 extending through the front cores 514, 515 and keeper 228 in the same sense. The resulting magnetic poles at adjacent ends of both front cores 514, 515 are alike and designated as south poles S at the upper end of the transducing gap 26 and as north poles N at the lower end. By selectively saturating areas 544, 545 of the respective front cores 514, 515 and overlying portions of keeper 228, the virtual transducing gap area 529 of the thin keeper 228 bridging the transducing gap 26 defined by the front cores 514, 515 becomes saturated as previously described, and it forms a virtual transducing gap 529. The saturated areas 544, 545 and 529 are shown in FIG. 21 as cross-hatched areas. The areas of the front cores 514, 515 and keeper 228 adjacent to the saturated areas remain permeable and they form a transducing zone 56 across the virtual transducing gap 529, as it has been described hereinbefore.

In the particular embodiment of the transducer 20 illustrated in FIG. 21, with respect to the like poles at adjacent ends of the front cores 514, 515 across the transducing gap 26, the control flux lines 541, 542 extend through the saturated portion 529 of the keeper 228 in substantially straight lines between the opposite poles S, N.

The width W3 and location of the transducing zone 56 can be positioned and moved along the width W' of the transducer 20 by controlling the magnitudes of the control currents I1, I2 as previously described.

Figure 22:
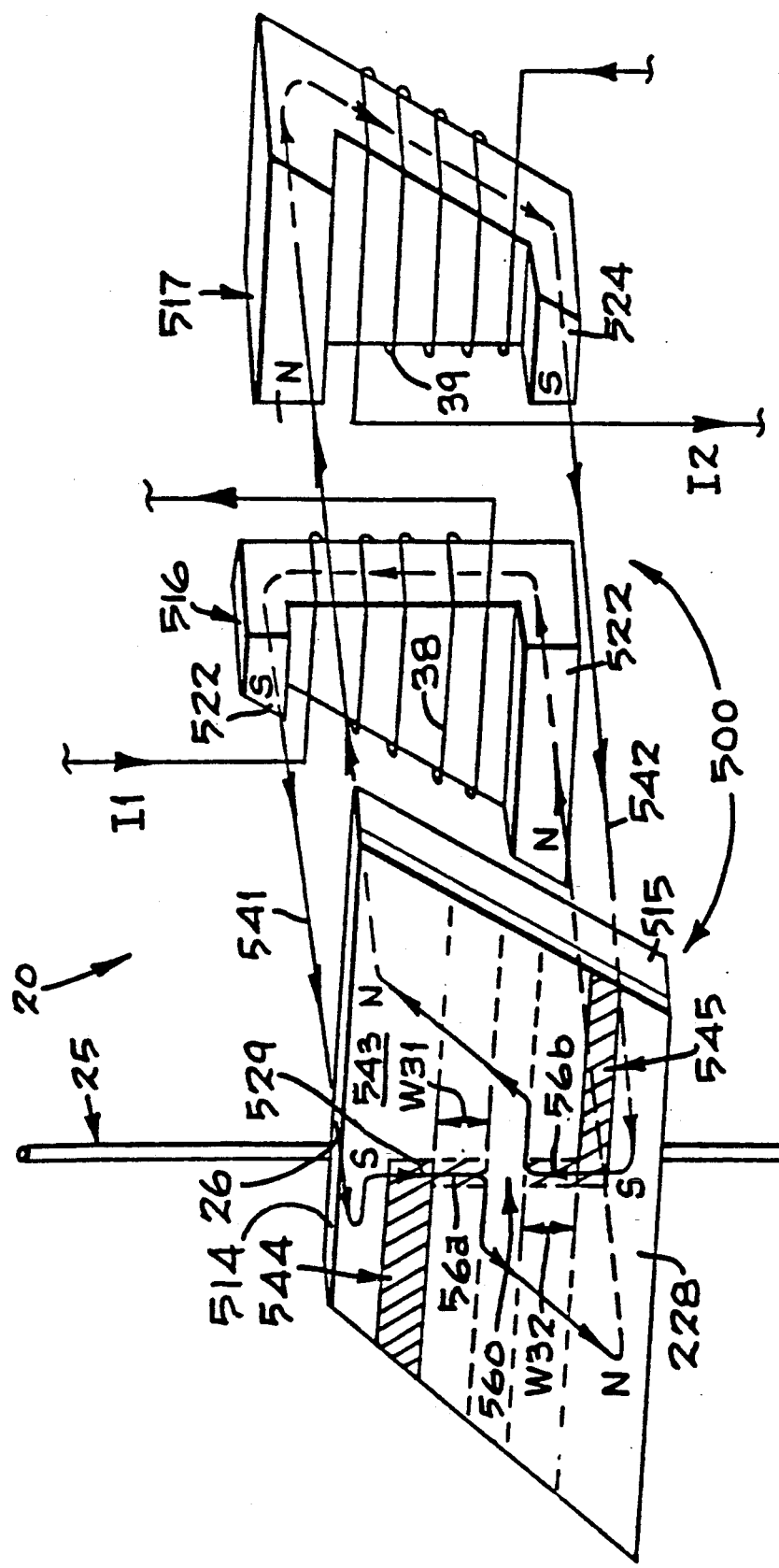
FIG. 22 is a simplified, exploded perspective view of another embodiment of a magnetic transducer of the kind illustrated in FIG. 21.

In the embodiment of the transducer 20 illustrated by FIG. 22, the control currents I1, I2 are shown to flow in opposite directions with respect to each other through the control windings 38, 39. Consequently, in the front cores 514, 515 oppositely oriented magnetic poles, S and N, are formed at adjacent ends of the oppositely oriented wedge sections across the transducing gap 26. In this instance, the areas 544, 545 of the front cores and the portion 529 of the keeper 228 are saturated by the respective control fluxes 541, 542 flowing in opposite directions to each other. As these oppositely oriented control fluxes approach each other they are repelled and diverted from the region 529 into different flux paths in each core half 514, 515 and adjacent portions of the keeper 228, as it is illustrated in FIG. 22. Each diverted flux path returns to the opposite pole formed in the same core where it has originated. Because of the diversion of the flux paths, there is an area 560 formed between respective saturated regions 56a and 56b which has a flux density far below the saturation density of the keeper 228. Thus, this area 560 is relatively flux free and does not saturate. Because this region or zone 560 is formed by the bucking effect of the opposite fluxes, it will be further referred thereto as the "bucking region" or "bucking zone."

However, portions 56a and 56b of the saturated area 529, which separate unsaturated, highly permeable areas of the cores 514, 515 and superposed keeper 228, form virtual transducing zones. Those portions of saturated keeper area 529 which are adjacent to saturated regions 544, 545 do not form an imaged virtual gap.

Consequently, in the embodiment of FIG. 22, each transducing zone 56a, 56b is defined on one side by a saturated area 544, 545, respectively, and on its other side by the bucking zone 560. Each zone 56a, 56b may be used to record or play back a signal on or from a magnetic medium. As previously described, there is no imaged gap in the bucking region 560 and therefore, signal transfers cannot be provided thereby.

When comparing the transducer 20 of FIG. 22 to that of FIG. 21, it is seen that instead of one transducing zone 56 as in the embodiment of FIG. 21, two such zones 56a, 56b separated by the bucking zone 560 are provided in the embodiment of FIG. 22.

As will be further described with reference to FIGS. 23A to 23D, the thusly obtained zones 56a, 56b, 560 can be positioned and moved together along the width W of the transducer 20 by controlling the magnitudes of the control currents I1, I2, as previously described with reference to other embodiments of the transducer 20. Moreover, the formation of two transducing zones 56a and 56b in the keeper 228 permits this embodiment to be employed to conveniently detect tracking position errors between the transducer 20 and selected paths along a magnetic record medium 42 without need of intentionally oscillating the transducing zones relative to the selected paths traced by them along the record medium. For example, this embodiment of the transducer 20 can be used to detect tracking signals pre-recorded along the record medium adjacent the locations at which the information signals are recorded. For the transducer 20 of FIG. 22, opposite phased tracking signals are recorded along the record medium at a frequency outside the frequency band of the information signals to be transferred with respect to the record medium. Upon the reproduction of the signals recorded on the record medium, the tracking signals are separated from the information signals by appropriate frequency band filters. The separated tracking signals are provided to suitable amplitude and phase comparison circuitry for measurement of the tracking position error of the transducer relative to the record medium. The amplitude of the tracking signals are indicative of the magnitude of the tracking position error, whereas the different phases of such signals enable the determination of the direction of tracking position error.

FIGS. 23A to 23D show respective track profile characteristics obtained by measuring a playback signal output of a transducer 20 constructed in accordance with the above-described embodiment of FIG. 22. As an example, a track 0.006 inches wide, shown at 633 is prerecorded longitudinally on a magnetic tape 42 and the tape is placed in contact with the surface 543 of the keeper 228. The length of track 633 is perpendicular to the width W of the physical transducing gap 26.

By selectively saturating the transducer front cores 514, 515 and the keeper 228, respective transducing zones 56a, 56b are obtained, separated from each other by a bucking zone 560, as has been described with reference to FIG. 22. Graph 635 is a plot obtained by moving the recorded track 633 on the tape 42 step-wise in the direction of arrow 637, corresponding to the direction of the transducer width W, while measuring on output signal from the signal winding 25 for each changed position. In this example, the track is moved in 0.005 inch increments. It is seen from FIG. 23D that the characteristic 635 has two peaks, each corresponding to one transducing zone 56a, 56b, shown in FIG. 23B. It is also seen from the shape of the characteristic 635 that the transition between a high and low playback signal output corresponding to the transitions between zones 56a and 560, and between zones 560 and 56b are substantially steeper than the transitions on the other sides of the zones 56a and 56b, opposite the sharp transitions. The foregoing corresponds to the previously described feature of improving the track definition by providing a bucking zone 560 adjacent to the transducing zone 56.

A plot of a second characteristic 636 is shown in FIG. 23D by a dashed line. This plot is obtained by changing the values of the control currents I1, I2 coupled to the control signal windings 38 and 39, and thereby shifting the transducing zones 56a, 56b and the bucking zone 560 in the direction of arrow 538 from the positions shown in FIG. 23B to new positions, as shown in FIG. 23C at 56a', 56b' and 560'. As seen from FIG. 23C, the respective widths of these zones in the direction W have not changed substantially.

The above described measurement is repeated for the shifted zones and the measured values are plotted into the resulting characteristic 636.

It is seen that characteristics 635, 636 are similar, each having respective high output peak portions designated N, R; P, S; for characteristic 635, and N', R'; P', S'; for characteristic 636. These portions correspond to transducing zones 56a, 56b; and 56a', 56b', respectively. In addition, each characteristic has a low output or valley portion R,P (for characteristic 635), and R', P' (for characteristic 636) corresponding to the bucking zones 560; 560'.

Figure 25:
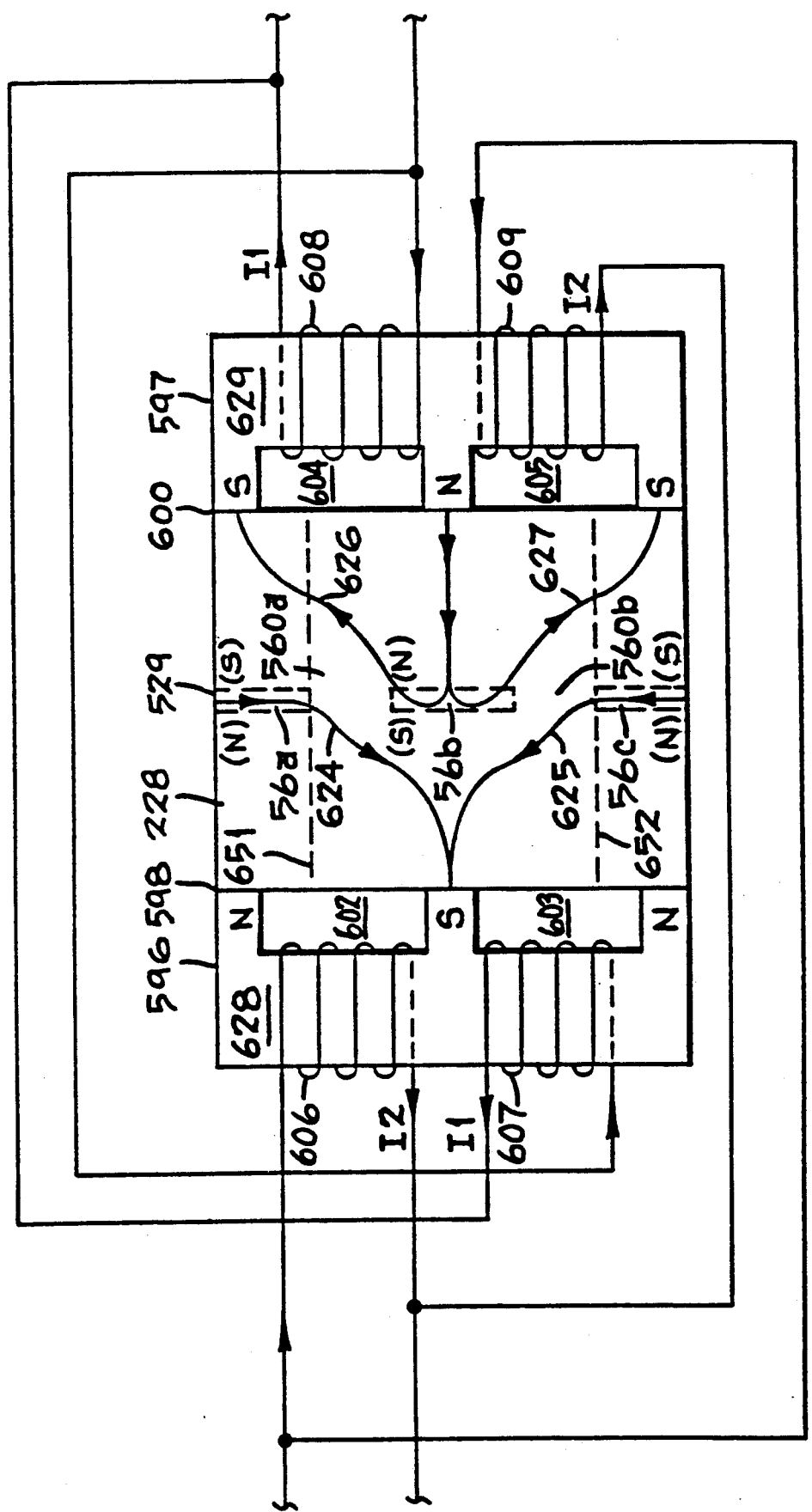
FIG. 25 is a front elevation view of the magnetic transducer illustrated in FIG. 24.

FIGS. 24 and 25 show another embodiment of the transducer 20 for use in accordance with the present invention. The transducer 20 of FIG. 24 has two confronting cores 591, 592 which are similar to the cores 511, 512 of the embodiment of FIG. 21, in that each core has a front core 594, 595 and a back core 596, 597 abutting at confronting planar surfaces 598 and 600. However, the cores 591, 592 are rectangular, rather than wedge shaped. Each back core 596, 597 has three legs which form two grooves therebetween utilized as control winding windows 602 to 605 to accommodate respective control windings 606 to 609. In this embodiment, the keeper 228 is made of a thin, soft magnetic material having similar characteristics as previously described with respect to FIG. 21.

Each control winding 606 to 609 is coupled to a saturation controller 54 (FIG. 16) to receive a control current therefrom. Preferably, for convenience, two control windings diagonally arranged on opposite sides are interconnected, as shown in FIG. 25.

Now, the operation of the transducer 20 of FIG. 24 will be described with further reference to FIG. 25. FIG. 25 is a schematic representation of a front elevation view of the keeper 228 of FIG. 24, taken in the direction of arrow 623. To facilitate showing of the control flux paths 624 to 627 extending between the rear cores 596, 597 and keeper 228 via front cores 594, 595, the rear cores are shown as being rotated by 90 degrees to have their lateral surfaces 628, 629 extending in the plane of the keeper 228. The control windings 606 to 609 are connected to the saturation controller 54 (FIG. 16) such that the outer legs of each back core form magnetic poles of the same polarity while its inner leg has a different polarity. At the same time, the respective back cores 596, 597 have opposite orientations of poles formed by their respective outer and inner legs, as shown in FIG. 25. As a result of such opposite orientation there are obtained oppositely oriented flux lines 624 to 627 extending in the virtual transducing gap area 529 of the keeper 228.

Because of the oppositely oriented magnetic poles across the transducing gap area 529, the respective control flux paths originating in the back cores 596, 597 saturate only portions 56a, 56b and 56c of the keeper 228 bridging the physical transducing gap 26 (FIG. 24), as shown in FIG. 25. In places where the oppositely oriented control fluxes approach each other, they are repelled and diverted into separate flux paths 624 to 627, as shown in FIG. 25. Each thusly diverted flux path returns to the same rear core where it originated. As a result of the above-described flux diversion, respective bucking regions 560a, 560b are formed which separate the adjacent saturated regions 56a to 56c. While these bucking regions are similar to the previously described bucking region 560 of FIG. 22, the manner in which they are formed and moved along the width of the transducing gap 529 to effect movement of the inner virtual transducing zone 56b differs. The two outer zones 56a and 56c change oppositely in length at their ends adjacent the bucking regions 560a and 560b (FIG. 24) by the same amount in response to a differential change in the control currents I1, I2 applied to the control signal windings 606, 607, 608 and 609 that alter the opposing control fluxes in paths 624, 625, 626 and 627 This opposing change in the opposing control fluxes effects a movement of the virtual transducing zone 56b along the width of the transducing gap 26 in the direction of the outer zone becoming shorter in length.

As described previously with reference to FIG. 22, the flux density in the bucking regions 560a, 560b is far below the saturation density of the keeper 228. Consequently, the areas between regions 56a to 56c of the keeper 228 bridging the physical transducing gap 26 do not saturate in the bucking regions.

It follows from the foregoing description that the transducer 20 illustrated in FIGS. 24 and 25 has three saturated gap regions or zones 56a to 56c provided in the keeper 228, separated from each other by relatively flux free regions or bucking zones. 560a, 560b. Because the area of the keeper 228 surrounding the saturated gap regions, as well as of the underlying front cores 594, 595 remains unsaturated and highly permeable, the saturated areas 56a to 56c provide respective transducing zones 56a to 56c similar to those previously described with respect to FIGS. 21-23.

When desired, the outer transducing zones 56a and 56c may be eliminated by spacing the front cores 594, 595 at a distance from the keeper 228 at both ends of the transducer width W. The cores 594, 595 will still provide a necessary flux path between the back cores 596, 597 and keeper 228, but there will be an increased reluctance in the flux path to prevent saturation of the areas 56a and 56c. Alternatively, a magnetic record medium, for example, magnetic tape 42 (FIG. 1) of a reduced width may be utilized which spans only a portion of the transducer width between lines 651, 652, thereby excluding transducing regions 56a and 56c from transferring information signals with respect to the tape 42.

It is seen from FIG. 25 that the control windings which are diagonally located from each other on opposite cores 596, 597 are connected together to receive the same control currents. Consequently, to move the transducing zones 56a, 56b and 56c in one direction along the width of the transducing gap 529, the control currents of one polarity, for example, I1', I2'', are increased while the control currents I1'', I2' of opposite polarity are decreased, in a similar way as previously described with reference to FIGS. 21-23.

It will be appreciated from the foregoing description of various embodiments, the present invention enables precise control of the tracking of a magnetic transducer relative to a magnetic record medium without reliance on mechanical displacement of tracking control devices. Moreover, such control can be exercised to maintain registration between the transducing zone of the transducer and the record medium as information signals are transferred between them at different relative transducer to record medium velocities. While preferred embodiments have been described wherein the speed and direction of transport of the tape is varied to achieve the different relative transducer to record medium velocities, the method and apparatus of the present invention can be implemented to effect such control regardless of how the different relative velocities are achieved. For example, it is common to vary the speed of rotation of rotating transducers to effect data compression and expansion. The method and apparatus of the present invention can be utilized in such applications to maintain the transducer registered with respect to a selected path extending in a prescribed direction along the tape so that the data is recorded and reproduced with respect to tracks in a predetermined format along the tape. Also, the present invention has been described as arranged to transfer information signals with respect to a magnetic tape using one rotatable transducer to generate special motion effects from television information signals. However, the present invention can be arranged to control two or more rotatable transducers to generate such effects. In such application, the reset strategy for determining when the movable transducing zone requires resetting of its location along the transducing gap would change. Such arrangements of the present invention provide more time for effecting a reset, and, therefore, the reset could be more gradual. Furthermore, the present invention has been described with reference to preferred embodiments wherein variation in the length of the path through which magnetic control flux flows and the area of the cross section through which the magnetic control flux flows has been relied upon to achieve the desired reluctance gradient. However, as generally described hereinbefore, the saturation flux density of the core body of the transducer can be varied to achieve a desired reluctance gradient. This variation can be achieved by constructing the core body of magnetically permeable materials of different saturation flux densities. In doing so, it is preferred to select such materials with appropriate coercive forces so that materials of different saturation flux densities do not have widely varying permeability characteristics. For example, each of the three transducer sections 150a, 150b and 150c of the embodiments of the transducer 20 illustrated by FIGS. 18A, 18B and 18C can be constructed of a magnetically permeable material of different saturation flux density, whereby the transducing zone in each transducer section moves a different distance along the width of the transducing gap 26 in response to the application of the same level of magnetic control flux. It therefore is not intended that the scope of the invention be limited other than by the claims and their equivalence.

What is claimed is:

1. A system for transferring information signals with respect to a magnetic record medium wherein the information signals are transferred by a transducer controlled to trace a selected path along the record medium during the transfers, the magnetic record medium has signals recorded thereon from which the location of the selected path can be determined, comprising:
    a magnetic transducer disposed for transferring information signals with respect to the magnetic record medium, said magnetic transducer including a body of magnetically permeable material defining a magnetic flux path therein and a winding disposed in electromagnetic coupling relation to the magnetic flux path, said body defining a transducing gap therein for magnetically coupling the magnetic flux path to the magnetic record medium;
    a saturation control means coupled to the magnetic transducer and responsive to a control signal for magnetically saturating a selected region of the body to enable a selected segment of the gap to effect the transfer of information signals between the magnetic record medium and the winding;
    means for producing relative movement between the selected segment of the gap and the magnetic record medium that cause the selected segment to trace a path along the record medium;
    means responsive to signals recorded on the magnetic record medium for sensing deviations of the enabled selected segment of the gap from the selected path; and
    a generator for generating a said control signal and coupling the same to the saturation control means, said generator is responsive to the sensed deviations to vary said control signal according to deviations of the selected segment of the gap from the selected path to effect, upon coupling to the saturation control means, a corresponding movement of the enabled selected segment along the defined transducing gap in a direction so that the enabled selected segment follows the selected path.

2. The system according to claim 1 wherein the generator includes a first control signal generator and a second control signal generator, the first control signal generator generates a first control signal of a selected magnitude, the saturation control means is responsive to the first control signal to saturate a selected region of the body determined by the magnitude of said first control signal and thereby enable a selected segment of the gap at a selected location along said gap, the second control signal generator generates a second control signal of a magnitude that varies according to the sensed deviations of the selected segment of the gap from the selected path, and the saturation control means is responsive to the second control signal to alter the selected region of the body that is saturated in accordance with variations of the magnitude of said second control signal and thereby effect the corresponding movement of the enabled selected segment along said gap.

3. The system according to claim 1 wherein the transducer is controlled to reproduce information signals previously recorded along at least one track defining the selected path on the magnetic record medium, the sensing means is responsive to the recorded signals to provide an indication of the deviations of the location of the enabled selected segment of the transducing gap from a track during the reproduction of recorded information signals therefrom, and the generator is responsive to the indication of deviations provided by the sensing means to vary the control signal according to the indicated deviations so that the enabled selected segment is moved along the defined transducing gap to follow said track.

4. The system according to claim 3 wherein each track of recorded information signals has a length dimension along the magnetic record medium in the direction of the path traced by the selected segment of the defined transducing gap and a width dimension transverse to the length dimension, the defined transducing gap has selected length and width dimensions, the magnetic transducer is disposed for reproducing information signals with the length and width dimensions of the defined transducing gap extending in the directions of the length and width dimensions, respectively, of the track of recorded information signals, and the control signal generator further comprising oscillation means for generating a periodically varying control signal and coupling the same to the saturation control means to effect corresponding periodic variation of the selected region of magnetic saturation in the direction of the width dimension of the defined transducing gap to periodically move the enabled selected segment of the gap along said width dimension and thereby cause corresponding periodic variation in magnitude of reproduction of the recorded information signals, and wherein the sensing means is responsive to the periodic magnitude variation of the information signals reproduced by the magnetic transducer to provide the indication of deviations of the location of the enabled selected segment of the transducing gap along the width dimension of the track from which the information signals are reproduced.

5. The system according to claim 3 wherein each track of recorded information signals has a length dimension along the magnetic record medium in the direction of the path traced by the selected segment of the defined transducing gap and a width dimension transverse to the length dimension, the defined transducing gap has selected length and width dimensions, the magnetic transducer is disposed for reproducing information signals with the length and width dimensions of the defined transducing gap extending in the directions of the length and width dimensions, respectively, of the track of recorded information signals, the sensing means includes a detecting means for detecting information signals recorded on the magnetic record medium, said detecting means disposed for detecting information signals recorded on the magnetic record medium at least at one location displaced from the location from which information signals are reproduced by the enabled selected segment of the gap a distance along the width dimension of the defined transducing gap, said detecting means disposed for movement with the enabled selected width segment to maintain said distance of displacement constant, the distance of displacement selected so that the detecting means detects information signals at an edge of a recorded track of information signals when the enabled selected segment of the gap follows the selected path, and the sensing means includes a signal processor responsive to recorded information signals detected by the detecting means for providing the indication of deviations of the location of the enabled selected segment of the transducing gap from the selected path.

6. The system according to claim 5 wherein the body of magnetically permeable material defines separate magnetic flux paths therein extending respectively to one of at least two discrete width portions of the transducing gap, the magnetic transducer has separate windings associated with separate flux paths extending to the discrete width portions, a said discrete width portion forming the detecting means, the saturation control means includes separate saturation controllers associated with the discrete width portion forming the detecting means and with the other discrete width portions of the transducing gap, respectively, each saturation controller coupled to the magnetic transducer and responsive to a control signal for magnetically saturating a selected discrete region of the body to enable a selected width segment of the associated discrete width portion to reproduce information signals recorded on the magnetic record medium and couple the same to the winding associated with the flux path extending to said associated discrete width portion, the magnetic transducer is disposed for reproducing information signals with said discrete width portion forming the detecting means and the other said discrete width portion located so that their respective enabled selected width segments reproduce information signals from displaced locations on the magnetic record medium, each saturation controller coupled to receive the control signal generated by the generator so that the enabled selected width segments of the discrete width portions move together in response to control signal variations, and the winding associated with the flux path extending to the discrete width portion forming the detecting means is coupled to the signal processor.

7. The system according to claim 5 wherein the body of magnetically permeable material defines separate magnetic flux paths therein extending respectively to one of at least two discrete width portions of the transducing gap, the magnetic transducer has separate windings associated with separate flux paths extending to the discrete width portions, a said discrete width portion forming the detecting means, the saturation control means includes separate saturation controllers associated with the discrete width portion forming the detecting means and with the other discrete width portions of the transducing gap, respectively, each saturation controller coupled to the magnetic transducer and responsive to a control signal for magnetically saturating a selected discrete region of the body to enable a selected width segment of the associated discrete width portion to reproduce information signals recorded on the magnetic record medium and couple the same to the winding associated with the flux path extending to said associated discrete width portion, the magnetic transducer is disposed for reproducing information signals with said discrete width portion forming the detecting means located so that its enable selected width segment is at the edge of a recorded track of information signals when the enabled selected width segment of the other said discrete width portion follows the selected path, each saturation controller coupled to receive the control signal generated by the generator so that the enabled selected width segments of the discrete width portions move together in response to control signal variations, and the winding associated with the flux path extending to the discrete width portion forming the detecting means is coupled to the signal processor.

8. The system according to claim 7 wherein the body of magnetically permeable material defines separate magnetic flux paths therein extending respectively to a plurality of at least three discrete width portions of the transducing gap, two of said plurality of discrete width portions forming the detecting means, the magnetic transducer is disposed for reproducing information signals with the two discrete width portions forming the detecting means located so that their respective enable selected width segments are at different edges of recorded tracks of information signals when the enabled selected width segment of each of the other said discrete width portions follow the selected path, each saturation controller coupled to receive the control signal generated by the generator so that the enabled selected width segments of the discrete width portions move together in response to control signal variations, and the windings associated with the flux paths extending to the two discrete width portions forming the detecting means are coupled to the signal processor.

9. The system according to claim 8 wherein the two discrete width portions of the transducing gap forming the detecting means are at opposite ends of the width dimension of the defined transducing gap with a third discrete width portion of the transducing gap therebetween, and the enable selected width segments of the two discrete width portions at opposite ends of the transducing gap located at opposite edges, respectively, of a recorded track of information signals when the enabled selected width segment of the third discrete width portion follows the selected path.

10. A system according to any one of the preceding claims wherein the body of the magnetic transducer has a face, said body defines the transducing gap therein at its face for magnetically coupling the magnetic transducer to the magnetic record medium, and the saturation control means is coupled to the magnetic transducer to effect magnetic saturation of the body selectively over a region of its face to define a magnetically unsaturated region of said face adjacent a selected segment of the gap at opposite sides thereof and enable the selected segment to magnetically couple the magnetic transducer to the magnetic record medium for effecting transfer of information signals with respect to said record medium.

11. A system for transferring information signals between magnetic tape and a rotating transducer with respect to a plurality of discrete tracks located adjacent one another and extending along the tape transverse to its length dimension as said transducer is controlled to trace a path that follows a track along the tape as information signals are transferred, the magnetic tape has signals recorded thereon from which the location of a track along the tape can be determined, comprising:

a magnetic transducer disposed for transferring information signals with respect to the magnetic tape, said magnetic transducer including a body of magnetically permeable material defining a magnetic flux path therein and a winding disposed in electromagnetic coupling relation to the magnetic flux path, said body defining a transducing gap therein of selected length and width dimensions for magnetically coupling the magnetic flux path to the tape;

a saturation control means coupled to the magnetic transducer and responsive to a control signal for magnetically saturating a selected region of the body to enable a selected width segment of the gap to effect the transfer of information signals between the tape and the winding;

a rotatable member for rotating the magnetic transducer relative to the tape so that the selected width segment of the transducing gap traces a path that follows a track along the tape during the transfers of information signals with respect to the tape, said magnetic transducer mounted to the rotatable member with the length dimension of the gap extending in the direction of rotation of the magnetic transducer so that the selected width segment of the gap extends along the tape as the magnetic transducer rotates;

means responsive to signals recorded on the magnetic tape for sensing deviations of the selected width segment of the transducing gap from the track being followed along the tape; and a generator for generating said control signal and coupling the same to the saturation control means, said generator is responsive to the sensed deviations to vary said control signal according to deviations of the selected width segment of the gap from the track followed along the tape to effect, upon coupling to the saturation control means, a corresponding movement of the enabled selected width segment along the defined transducing gap in the direction of the width dimensions so that the enabled selected width segment follows said track.

12. The system according to claim 11 wherein the transducer is controlled to reproduce information signals previously recorded along the track being followed, the sensing means is responsive to the recorded information signals to provide an indication of the deviations of the location of the enabled selected segment of the transducing gap from said track during the reproduction of recorded information signals therefrom, and the generator is responsive to the indication of deviations provided by the sensing means to vary the control signal according to the indicated deviations.

13. The system according to claim 12 wherein each track of recorded information signals has a length dimension along the magnetic tape in the direction of the path traced by the selected segment of the defined transducing gap and a width dimension transverse to the length dimension, the defined transducing gap has selected length and width dimensions, the magnetic transducer is disposed for reproducing information signals with the length and width dimensions of the defined transducing gap extending in the directions of the length and width dimensions, respectively, of the track of recorded information signals, and the control signal generator further comprising oscillation means for generating a periodically varying control signal and coupling the same to the saturation control means to effect corresponding periodic variation of the selected region of magnetic saturation in the direction of the width dimension of the defined transducing gap to periodically move the enabled selected segment of the gap along said width dimension and thereby cause corresponding periodic variation in magnitude of reproduction of the recorded information signals, and wherein the sensing means is responsive to the periodic magnitude variation of the information signals reproduced by the magnetic transducer to provide the indication of deviations of the location of the enabled selected segment of the transducing gap along the width dimension of the track from which the information signals are reproduced.

14. The system according to claim 12 wherein each track of recorded information signals has a length dimension along the magnetic tape in the direction of the path traced by the selected segment of the defined transducing gap and a width dimension transverse to the length dimension, the defined transducing gap has selected length and width dimensions, the magnetic transducer is disposed for reproducing information signals with the length and width dimensions of the defined transducing gap extending in the directions of the length and width dimensions, respectively, of the track of recorded information signals, the sensing means includes a detecting means for detecting information signals recorded on the magnetic tape, said detecting means disposed for detecting information signals recorded on the magnetic tape at least at one location displaced from the location from which information signals are reproduced by the enabled selected segment of the gap a distance along the width dimension of the defined transducing gap, said detecting means disposed for movement with the enabled selected width segment to maintain said distance of displacement constant, the distance of displacement selected so that the detecting means detects information signals at an edge of a recorded track of information signals when the enabled selected segment of the gap follows the track, and the sensing means including a signal processor responsive to recorded information signals detected by the detecting means for providing the indication of deviations of the location of the enabled selected segment of the transducing gap from the track being followed.

15. The system according to claim 11 wherein the magnetic tape is transportable past the rotating magnetic transducer in the direction of the length dimension of said tape to effect a net relative velocity of relative movement between said tape and the selected width segment of the gap of said transducer dependent on the velocity of transport of said tape and the velocity of rotation of said transducer and corresponding to the velocity of relative motion between the tape and the selected width segment of the gap, the tracks are at a selected angle relative to the length dimension of the tape at a first net relative velocity, and further comprising means for adjusting the net relative velocity to a second net relative velocity during the transfer of information signals with respect to the tape that is different from the first net relative velocity, and wherein the generator generates said control signal that varies to effect movement of the enabled selected width segment along the width dimension of the gap to follow a track during the transfer of information signals with respect thereto and, subsequent to said transfer, that varies to effect movement of the enabled selected width segment along the width dimension of the gap to position it to begin following a track with respect to which a subsequent transfer of information signals is to occur.

16. The system according to claim 15 wherein the generator varies the control signal according to the sensed deviations and the difference between the first and second net relative velocities.

17. The system according to claim 20 wherein the generator includes a first means for varying the control signal according to the sensed deviations of the enabled selected width segment from the track being followed along the tape, and a second means for varying the control signal according to the difference between the first and second net relative velocities to move the enabled selected width segment along the width dimension of the gap to follow a track during the transfer of information signals with respect thereto, and subsequent to said transfer, for varying the control signal selectively to move the enabled selected width segment along the width dimension of the gap to position it to begin following a track with respect to which a subsequent transfer of information signals is to occur.

18. The system according to claim 17 wherein the magnetic transducer is disposed for reproducing information signals previously recorded along the tracks it follows with the length and width dimensions of the defined transducing gap extending in the directions of the length and width dimensions, respectively, of the track it follows, and the first means of the control signal generator further comprises oscillation means for generating a periodically varying control signal and coupling the same to the saturation control means to effect corresponding periodic variation of the selected region of magnetic saturation in the direction of the width dimension of the defined transducing gap to periodically move the enabled selected segment of the gap along said width dimension and thereby cause corresponding periodic variation in magnitude of reproduction of the recorded information signals, and wherein the sensing means is responsive to the periodic magnitude variation of the information signals reproduced by the magnetic transducer to sense the deviations of the location of the enabled selected segment of the transducing gap along the width dimension of the track from which the information signals are reproduced.

19. The system according to claim 17 wherein the body of the magnetic transducer has a face, said body defines the transducing gap therein at its face for magnetically coupling the magnetic transducer to the magnetic tape, and the saturation control means is coupled to the magnetic transducer to effect magnetic saturation of the body selectively over a region of its face to define a magnetically unsaturated region of said face adjacent a selected segment of the gap at opposite sides thereof and enable the selected segment to magnetically couple the magnetic transducer to the magnetic tape for effecting transfer of information signals with respect to said tape.

20. A system according to any one of claims 11, 12 to 16 or 18 wherein the body of the magnetic transducer has a face, said body defines the transducing gap therein at its face for magnetically coupling the magnetic transducer to the magnetic tape, and the saturation control means is coupled to the magnetic transducer to effect magnetic saturation of the body selectively over a region of its face to define a magnetically unsaturated region of said face adjacent a selected segment of the gap at opposite sides thereof and enable the selected segment to magnetically couple the magnetic transducer to the magnetic tape for effecting transfer of information signals with respect to said tape.

21. A rotary segmented scan magnetic tape apparatus for reproducing information signals recorded along parallel tracks extending laterally of the magnetic tape at an angle to its length dimension, wherein the information signals are reproduced by a rotating transducer located at a transducing station and in transducing relation with respect to the magnetic tape which is transportable through the transducing station, comprising:
 a transport mechanism for transporting the magnetic tape through the transducing station;
 a magnetic transducer including a body of magnetically permeable material defining a magnetic flux path therein and a winding disposed in electromagnetic coupling relation to the magnetic flux path, said body defining a transducing gap therein of selected length and width dimensions for reproducing information signals from the tape;
 a saturation control means coupled to the magnetic transducer and responsive to a control signal for magnetically saturating a selected region of the body to enable a selected width segment of the gap to effect the reproduction of information signals from the tape and coupling to the winding;
 a rotatable member for rotating the magnetic transducer relative to the tape at the transducing station during reproduction of information signals with respect to the tape, said magnetic transducer mounted to the rotatable member to be in transducing relation to the tape with the length dimension of the gap extending in the direction of rotation of the magnetic transducer so that the selected width segment of the gap traces a path along the tape in the direction the tracks extend along the tape as the magnetic transducer rotates; and
 a generator for generating said control signal and coupling the same to the saturation control means, said control signal varied according to deviations of the selected width segment of the gap from the track followed along the tape to effect, upon coupling to the saturation control means, a corresponding movement of the enabled selected width segment along the defined transducing gap in the direction of the width dimension so that the enabled selected width segment follows said track.

22. The apparatus of claim 21 further comprising sensing means for sensing deviations of the enabled selected segment of the gap from the track being followed along the tape, and wherein said generator is responsive to the sensing means to vary the control signal according to the sensed deviations so that the enabled selected segment is moved along the defined transducing gap to follow said track.

23. The apparatus according to claim 22 wherein the sensing means is responsive to the recorded information signals to provide an indication of deviations of the location of the enabled selected segment of the transducing gap from said track, and the generator is responsive to the indication of deviations provided by the sensing means to vary the control signal according to the indicated deviations.

24. The apparatus according to claim 23 wherein the control signal generator further comprises oscillation means for generating a periodically varying control signal and coupling the same to the saturation control means during the reproduction of information signals from the tape to effect corresponding periodic variation of the selected region of magnetic saturation in the direction of the width dimension of the defined transducing gap to periodically move the enabled selected segment of the gap along said width dimension and thereby cause corresponding periodic variation in magnitude of reproduction of the information signals, and wherein the sensing means is responsive to the periodic magnitude variation of the reproduced information signals to provide the indication of deviations of the location of the enabled selected segment of the transducing gap along the width dimension of the track from which the information signals are reproduced.

25. The apparatus according to claim 21 wherein the magnetic tape is transportable through the transducing station to effect a net relative velocity of relative movement between said tape and the selected width segment of the gap of said transducer dependent on the velocity of transport of said tape and the velocity of rotation of said transducer and corresponding to the velocity of relative motion between the tape and the selected width segment of the gap, the tracks are at a selected angle relative to the length dimension of the tape at a first net relative velocity, and further comprising means for adjusting the net relative velocity to a second net relative velocity during reproduction of information signals that is different from the first net relative velocity, and wherein the generator generates said control signal that varies to effect movement of the enabled selected width segment along the width dimension of the gap to follow a track during the reproduction of information signals with respect thereto and, subsequent to said reproduction, that varies to effect movement of the enabled selected width segment along the width dimension of the gap to position it to begin following a track with respect to which a subsequent reproduction of information signals is to occur.

26. The apparatus according to claim 25 wherein the generator varies the control signal according to the deviations of the selected width segment of the gap from the track followed along the tape and the difference between the first and second net relative velocities.

27. The apparatus according to claim 33 wherein the generator includes a first means for varying the control signal according to the deviations of the enabled selected width segment from the track being followed along the tape, and a second means for varying the control signal according to the difference between the first and second net relative velocities to move the enabled selected width segment along the width dimension of the gap to follow a track during the reproduction of information signals with respect thereto, and subsequent to said reproduction, for varying the control signal selectively to move the enabled selected width segment along the width dimension of the gap to position it to being following at track with respect to which a subsequent reproduction of information signals is to occur.

28. The apparatus according to claim 25 further comprising sensing means for sensing deviations of the enabled selected width segment of the gap from the track being followed along the tape, and wherein the generator is responsive to the sensing means to vary the control signal according to the sensed deviations so that the enabled selected segment is moved in a direction along the defined transducing gap that counteracts the deviations.

29. The apparatus according to claim 28 wherein the generator includes a first control signal generator and a second control signal generator, the first control signal generator generates a first control signal and is responsive to the sensing means to vary said first control signal according to the sensed deviation of the enabled selected width segment of the gap from the track being followed along the tape, the second control signal generator generates a second control signal that varies to effect movement of the enabled selected width segment to follow a track during the reproduction of information signals with respect thereto and, subsequent to said reproduction, that varies to effect movement of the enabled selected width segment to position it to begin following a track with respect to which a subsequent reproduction of information signals is to occur, and the saturation control means is responsive to said control signals to alter the selected region of the body that is saturated in accordance with the variations of said control signals.

30. The apparatus according to claim 29 wherein the sensing means is responsive to the recorded information signals to provide an indication of deviations of the location of the enabled selected segment of the transducing gap from said track, and the first control signal generator is responsive to the indication of deviations provided by the sensing means to vary the first control signal according to the indicated deviations.

31. The apparatus according to claim 30 wherein the first control signal generator further comprises oscillation means for generating a periodically varying control signal and coupling the same to the saturation control means during the reproduction of information signals from the tape to effect corresponding periodic variation of the selected region of magnetic saturation in the direction of the width dimension of the defined transducing gap to periodically move the enabled selected segment of the gap along said width dimension and thereby cause corresponding periodic variation in magnitude of reproduction of the information signals, and wherein the sensing means is responsive to the periodic magnitude variation of the reproduced information signals to provide the indication of deviations of the location of the enabled selected segment of the transducing gap along the width dimension of the track from which the information signals are reproduced.

32. An apparatus according to claim 31 wherein the net relative velocity adjusting means adjusts the velocity at which the tape is transported through the transducing station to produce the second net relative velocity of relative movement between the tape and the selected width segment of the gap of the magnetic transducer.

33. An apparatus according to any one of claims 25, 26 or 28 to 30 wherein the net relative velocity adjusting means adjusts the velocity at which the tape is transported through the transducing station to produce the second net relative velocity of relative movement between the tape and the selected width segment of the gap of the magnetic transducer.

34. An apparatus according to any one of claims 21 to 26 or 28 to 32 wherein the body of the magnetic transducer has a face, said body defines the transducing gap therein at its face for magnetically coupling the magnetic transducer to the magnetic tape, and the saturation control means is coupled to the magnetic transducer to effect magnetic saturation of the body selectively over a region of its face to define a magnetically unsaturated region of said face adjacent a selected segment of the gap at opposite sides thereof and enable the selected segment to magnetically couple the magnetic transducer to the magnetic tape for effecting reproduction of information.

35. A helical scan tape apparatus for transferring information signals with respect to parallel tracks extending diagonally across a magnetic tape at an angle to its length dimension, the magnetic tape has signals recorded thereon from which the location of a track along the tape can be determined, comprising:
 a tape guide including a cylindrical surface for guiding the magnetic tape in the direction of its length dimension along a helical path about said surface at a helix angle relative to a rotation axis;
 a transport mechanism for transporting the magnetic tape in the direction of its length dimension along a path that extends through the helical path;
 at least one magnetic transducer including a body of magnetically permeable material defining a magnetic flux path therein and a winding disposed in electromagnetic coupling relation to the magnetic flux path, said body defining a transducing gap therein of selected length and width dimensions for magnetically coupling the magnetic flux path to the tape;
 a saturation control means coupled to the magnetic transducer and responsive to a control signal for magnetically saturating a selected region of the body to enable a selected width segment of the gap to effect the transfer of information signals between the tape and the winding;
 a rotatable member for rotating the magnetic transducer relative to the tape about the rotation axis through a transducing station along the helical path at which transfers of information signals occur with respect to the tape, said magnetic transducer mounted to the rotatable member to be in transducing relation to the tape as said transducer passes the transducing station, said transducer mounted to the rotatable member to have the length dimension of the gap extending in the direction of rotation of the magnetic transducer so that the selected width segment of the gap traces a path along the tape in the direction the tracks extend along the tape as the magnetic transducer rotates;
 means responsive to signals recorded on the magnetic tape for sensing deviations of the selected width segment from the track being followed along the tape; and
 a generator for generating said control signal and coupling the same to the saturation control means, said generator is responsive to the sensed deviations to vary said control signal according to deviations of the selected width segment of the gap from the track followed along the tape to effect, upon coupling to the saturation control means, a corresponding movement of the enabled selected width segment along the defined transducing gap in the direction of the width dimension so that the enabled selected width segment follows said track.

36. The apparatus according to claim 35 wherein the transducer is controlled to reproduce information signals previously recorded along the track being followed, the sensing means is responsive to the recorded information signals to provide an indication of the deviations of the location of the enabled selected segment of the transducing gap from said track during the reproduction of recorded information signals therefrom, and the generator is responsive to the indication of deviations provided by the sensing means to vary the control signal according to the indicated deviations.

37. The apparatus according to claim 36 wherein the control signal generator further comprises oscillation means for generating a periodically varying control signal and coupling the same to the saturation control means during the reproduction of information signals from the tape to effect corresponding periodic variation of the selected region of magnetic saturation in the direction of the width dimension of the defined transducing gap to periodically move the enabled selected segment of the gap along said width dimension and thereby cause corresponding periodic variation in magnitude of reproduction of the information signals, and wherein the sensing means is responsive to the periodic magnitude variation of the reproduced information signals to provide the indication of deviations of the location of the enabled selected segment of the transducing gap along the width dimension of the track from which the information signals are reproduced.

38. The apparatus according to claim 35 wherein the magnetic tape is transportable through the helical path to effect a net relative velocity of relative movement between said tape and the selected width segment of the gap of said transducer dependent on the velocity of transport of said tape and the velocity of rotation of said transducer and corresponding to the velocity of relative motion between the tape and the selected width segment of the gap, the tracks are at a selected angle relative to the length dimension of the tape at a first net relative velocity, and further comprising means for adjusting the net relative velocity to a second net relative velocity during the transfer of information signals with respect to the tape that is different from the first net relative velocity, and wherein the generator generates said control signal that varies to effect movement of the enabled selected width segment along the width dimension of the gap to follow a track during the transfer of information signals with respect thereto and, subsequent to said transfer, that varies to effect movement of the enabled selected width segment along the width dimension of the gap to position it to begin following a track with respect to which a subsequent transfer of information signals is to occur.

39. The apparatus according to claim 38 wherein the generator includes a first means for varying the control signal and a second means for varying the control signal, said first means varies the control signal according to the deviation of the enabled selected width segment from the track being followed along the tape, the second means varies the control signal according to the difference between the first and second net relative velocities to move the enabled selected width segment along the width dimension of the gap to follow a track during the transfer of information signals with respect thereto, and subsequent to said transfer, varies the control signal selectively to move the enabled selected width segment along the width dimension of the gap to position it to begin following a track with respect to which a subsequent transfer of information signals is to occur.

40. The apparatus according to claim 39 wherein the second means varies the control signal selectively subsequent to a transfer of information signals at a predetermined time during the rotation of the magnetic transducer.

41. The apparatus according to claim 40 wherein the second means varies the control signal monotonically at a first rate according to the difference between the first and second net relative velocities to effect movement of the enabled selected width segment in a first direction parallel to the rotation axis during the transfer of information signals with respect to the tape, and subsequent to said transfer of information signals, varies the control signal selectively to effect movement of the enabled selected width segment in a second direction parallel to the rotation axis opposite said first direction.

42. The apparatus according to claim 41 further comprising a tachometer operatively coupled to the rotatable member for generating a tachometer signal indicative of the rotational position of the rotating magnetic transducer, and wherein the second means is responsive to said tachometer signal to initiate the variation of the second control signal subsequent to the transfer of information signals at a time determined by said tachometer signal.

43. The apparatus according to claim 42 wherein the time of variation of the control signal subsequent to the transfer of information signals corresponds to a time when the enabled selected width segment is outside the transducing station.

44. The apparatus according to claim 38 wherein the generator includes a first control signal generator and a second control signal generator, the first control signal generator generates a first control signal and is responsive to the sensing means to vary said first control signal according to the sensed deviation of the enabled selected width segment of the gap from the track being followed along the tape, the second control signal generator generates a second control signal that varies to effect movement of the enabled selected width segment to follow a track during the transfer of information signals with respect thereto and, subsequent to said transfer, that varies to effect movement of the enabled selected width segment to position it to begin following a track with respect to which a subsequent transfer of information signals is to occur, and the saturation control means is responsive to said control signals to alter the selected region of the body that is saturated in accordance with the variations of said control signals.

45. The system according to claim 44 wherein the transducer is controlled to reproduce information signals previously recorded along the track being followed, the sensing means is responsive to the recorded information signals to provide an indication of deviations of the location of the enabled selected segment of the transducing gap from said track during the reproduction of recorded information signals therefrom, and the first control signal generator is responsive to the indication of deviations provided by the sensing means to vary the first control signal according to the indicated deviations.

46. The apparatus according to claim 45 wherein the second control signal generator includes a first means for generating a first component of the second control signal that varies to move the enabled selected width segment along the width dimension of the gap to follow a track during the reproduction of information signals with respect thereto, and a second means for generating a second component of the second control signal selectively that varies to move the enabled selected width segment along the width dimension of the gap to position it to begin following a track with respect to which a subsequent reproduction of information signals is to occur.

47. The apparatus according to claim 46 wherein the second means generating the second component relative to a predetermined time during the rotation of the magnetic transducer.

48. The apparatus according to claim 47 wherein the first component of the second control signal varies monotonically at a first rate to effect movement of the enabled selected width segment in a first direction parallel to the rotation axis, and the second component of the second control signal varies to effect movement of the enabled selected width segment in a second direction parallel to the rotation axis opposite said first direction.

49. The apparatus according to claim 48 further comprising a tachometer operatively coupled to the rotatable member for generating a tachometer signal indicative of the rotational position of the rotating magnetic transducer, and wherein the second means is responsive to said tachometer signal to initiate generation of the second component of the second control signal at a time determined by said tachometer signal.

50. The apparatus according to claim 49 wherein the time of generation of the second component of the second control signal corresponds to a time when the enabled selected width segment is outside the transducing station.

51. An apparatus according to claim 50 wherein the net relative velocity adjusting means adjusts the velocity at which the tape is transported through the transducing station to produce the second net relative velocity of relative movement between the tape and the selected width segment of the gap of the magnetic transducer, the second means includes a ramp generator and a reset generator, said ramp generator generates the first component of the second control signal to have a magnitude that varies in accordance with the adjusted velocity of transport of the tape, and the reset generator generates the second component of the second control signal to have a magnitude that changes at the predetermined time determined by the adjusted velocity of transport of the tape.

52. The apparatus according to claim 51 wherein the velocity at which the tape is transported through the transducing zone is a constant velocity different than a normal velocity, the magnitude of the first component of the second control signal generated by the ramp generator varies linearly and has a period proportional to the difference between the constant velocity and the normal velocity, and the second component of the second control signal generated by the reset generator has a frequency proportional to the difference between the constant velocity and the normal velocity.

53. The apparatus according to claim 52 wherein the normal velocity corresponds to the velocity at which the tape was transported for recording of the information signals on the tape.

54. The apparatus according to claim 52 wherein the control signal generator further comprises oscillation means for generating a periodically varying control signal and coupling the same to the saturation control means during the reproduction of information signals from the tape to effect corresponding periodic variation of the selected region of magnetic saturation in the direction of the width dimension of the defined transducing gap to periodically move the enabled selected segment of the gap along said width dimension and thereby cause corresponding periodic variation in magnitude of reproduction of the information signals, and wherein the sensing means is responsive to the periodic magnitude variation of the reproduced information signals to provide the indication of deviations of the location of the enabled selected segment of the transducing gap along the width dimension of the track from which the information signals are reproduced.

55. An apparatus according to any of claims 35, 36 to 43, 44 or 45 to 54 wherein the body of the magnetic transducer has a face, said body defines the transducing gap therein at its face for magnetically coupling the magnetic transducer to the magnetic tape, and the saturation control means is coupled to the magnetic transducer to effect magnetic saturation of the body selectively over a region of its face to define a magnetically unsaturated region of said face adjacent a selected segment of the gap at opposite sides thereof and enable the selected segment to magnetically couple the magnetic transducer to the magnetic tape for effecting reproduction of information.

56. A method of effecting control of the path traced along a magnetic record medium by a magnetic transducer having a body of magnetically permeable material defining therein a transducing gap with a magnetically movable segment for transferring information signals with respect to the magnetic record medium, the magnetic record medium has signals recorded thereon from which the location of the magnetically movable segment relative to the magnetic record medium can be determined, said method comprising the steps of:
  relatively moving the magnetic transducer and magnetic record medium as information signals are transferred with respect to a track along said magnetic record medium follow by the magnetically movable segment of the transducing gap;
  sensing signals recorded on the magnetic record medium to obtain an indication of deviations of the magnetically movable segment relative to the track followed thereby; and
  moving the movable segment of the transducing gap along said transducing gap in response to the indicated deviations.

57. A method of effecting control of the path traced along a magnetic record medium by a magnetic transducer having a body of magnetically permeable material defining therein a transducing gap with a magnetically movable segment for transferring information signals with respect to the magnetic record medium, said method comprising the steps of:
  relatively moving the magnetic transducer and magnetic record medium for transferring information signals with respect to a track along said magnetic record medium followed by the magnetically movable segment of the transducing gap;
  sensing deviations of the magnetically movable segment relative to the track followed thereby; and
  moving the movable segment of the transducing gap along said transducing gap in response to the sensed deviations in a direction to a counteract the deviations so that the movable segment follows said track as the information signals are transferred.

58. A system for transferring information signals with respect to a magnetic record medium wherein the information signals are transferred by a transducer controlled to trace a selected path along the record medium during the transfers, the magnetic record medium has signals recorded thereon from which the location of the selected path can be determined, comprising:
  a magnetic core having a pair of core portions defining a transducing gap therebetween that is controllable to have a segment thereof forming a transducing zone for magnetically coupling the transducer and the record medium;
  control signal for magnetically saturating selected regions of the core portions to enable a selected segment of the gap to form the transducing zone for magnetically coupling the transducer and the record medium;
  means for producing relative movement between the transducing zone and the magnetic record medium that causes the transducing zone to trace a path along the record medium;
  means responsive to signals recorded on the magnetic record medium for sensing deviations of the enabled selected segment of the gap from the selected path; and
  a generator for generating a said control signal and coupling the same to the saturation control means, said generator is responsive to the sensed deviations to vary said control signal according to deviations of the transducing zone from the selected path to effect, upon coupling in the saturation control means, a corresponding movement of the enabled selected segment along the defined transducing gap in a direction so that the transducing zone follows the selected path.

59. A system for transferring information signals with respect to a magnetic record medium wherein the information signals are transferred by a transducer controlled to trace a selected path along the record medium during the transfer, the magnetic record medium has signals recorded thereon from which the location of the selected path can be determined, comprising:
  a magnetic core having a pair of core portions defining a nonmagnetic gap between them;
  a body of magnetic material which is located magnetically proximate each of said record medium and the gap of said magnetic core;
  means responsive to a control signal for generating a bias flux in said magnetic core which is coupled into said body of magnetic material to define in said body a signal transfer zone along a selected segment of said gap through which magnetic flux is coupled between said body and the record medium;
  means for producing relative movement between the signal transfer zone and the record medium along said gap that causes the signal transfer zone to trace a path along the record medium;

means responsive to signals recorded on the magnetic record medium for sensing deviations of the enabled selected segment of the gap from the selected path; and a generator for generating said control signal to which said bias flux generating means is responsive, said generator is responsive to the sensed deviations to vary said control signal according to deviations of the signal transfer zone from the selected path to effect a corresponding movement of the selected segment along said gap in a direction which causes the signal transfer zone to follow said path.

60. The system of claim 59 wherein said bias flux magnetically saturates selected regions of said body to define a non-saturated highly permeable portion of said body that forms said signal transfer zone.

61. The system according to any one of the claims 58, 59 or 60 wherein the transducer is controlled to reproduce information signals previously recorded along at least one track defining the selected path on the magnetic record medium; and further comprising a sensing means responsive to the recorded information signals to provide an indication of deviations of the location of the transducing zone from a track during the reproduction of recorded information signals therefrom, the generator is responsive to the indication of deviations provided by the sensing means to vary the control signal according to the indicated deviations so that the transducing zone is moved to follow said track.

62. A system for transferring information signals between a rotating transducer and tracks that extend along a magnetic tape at a selected angle relative to the length dimension of the tape, the transfer occurring during relative motion between the tape and the transducer at a net relative velocity different from a first net relative velocity that causes the transducer to trace a path along the tape at the selected angle, the net relative velocity determined by the velocity of transport of the tape and the velocity of rotation of the transducer and corresponding to the velocity of the relative motion between the tape and the transducer, comprising:

a magnetic transducer disposed for transferring information signals with respect to the magnetic tape, said magnetic transducer including a body of magnetically permeable material defining a magnetic flux path therein and a winding disposed in electromagnetic coupling relation to the magnetic flux path, said body defining a transducing gap therein of selected length and width dimensions for magnetically coupling the magnetic flux path to the tape;

a saturation control means coupled to the magnetic transducer and responsive to a control signal for magnetically saturating a selected region of the body to enable a selected width segment of the gap to effect the transfer of information signals between the tape and the winding;

a rotatable member for rotating the magnetic transducer relative to the tape at a velocity during the transfers of information signals with respect to the tape;

means for transporting the magnetic tape past the rotating magnetic transducer in the direction of the length dimension of the tape at a velocity during the transfers of information signals with respect to the tape, the velocity of rotation of the magnetic transducer and the velocity of transport of the tape selected to produce relative motion between the tape and the selected width segment of the transducing gap of the transducer at a second net relative velocity different from the first net velocity; and a generator for generating said control signal and coupling the same to the saturation control means, said control signal varied according to the difference between the first and second net relative velocities to effect, upon coupling to the saturation control means, a movement of the enabled selected width segment along the defined transducing gap in the direction of the width dimension so that the enabled selected width segment follows a path along the magnetic tape at the selected angle that said tracks extend along the tape.

63. The system according to claim 62 further comprising sensing means for sensing the location of the enabled selected width segment of the transducing gap of the magnetic transducer relative to said path along the magnetic tape and generating an indication of deviations of the location of the enabled selected width segment from said path, and wherein the generator is responsive to the indication of deviations generated by the sensing means to vary the control signal according to the indicated deviations so that the enabled selected segment is moved in a direction along the defined transducing gap that counteracts the deviations.

64. The system according to claim 63 wherein the generator includes a first control signal generator and a second control signal generator, the first control signal generator generates a first control signal and is responsive to the sensing means to vary said first control signal according to the indicated deviations of the location of the enabled selected width segment of the transducing gap of the magnetic transducer from the path along the tape, the second control signal generator generates a second control signal that varies according to the difference between the first and second net relative velocities to effect movement of the enabled selected width segment to follow the path during the transfer of information signals with respect thereto and, subsequent to said transfer, that varies to effect movement of the enabled selected width segment to position it to begin following a path with respect to which a subsequent transfer of information signals is to occur, and the saturation control means is responsive to said control signals to alter the selected region of the body that is saturated in accordance with the variations of said control signals.

65. The system of claim 64 wherein the magnetic tape has signals recorded thereon previous to the transfer of information signals by the magnetic transducer from which the location of the selected segment of the transducing gap relative to the path along the tape can be determined, the sensing means is responsive to the signals previously recorded on the tape to provide the indication of deviations of the location of the enabled selected segment from the path along the tape, and the first control signal generator is responsive to the indication of deviations provided by the sensing means to vary the first control signal.

66. The system according to claim 65 wherein the transducer is controlled to reproduce information signals previously recorded along a track that extends along the tape at the selected angle, the sensing means is responsive to the recorded information signals to provide the indication of deviations of the location of the enabled selected segment of the transducing gap of the magnetic transducer from said track during the reproduction of recorded information signals therefrom, and the first control signal generator is responsive to the indication of deviations provided by the sensing means to vary the first control signal according to the indicated deviations.

67. The system according to claim 66 wherein the magnetic transducer is disposed for reproducing information signals previously recorded along the tracks it follows with the length and width dimensions of the defined transducing gap extending in the directions of the length and width dimensions, respectively, of the track it follows, and the control signal generator further comprises oscillation means for generating a periodically varying control signal and coupling the same to the saturation control means to effect corresponding periodic variation of the selected region of magnetic saturation in the direction of the width dimension of the defined transducing gap to periodically move the enabled selected segment of the gap along said width dimension and thereby cause corresponding periodic transducing gap to periodically move the enabled selected segment of the and wherein the sensing means is responsive to the periodic magnitude variation of the information signals reproduced by the magnetic transducer to sense the deviations of the location of the enabled selected segment of the transducing gap along the width dimension of the track from which the information signals are reproduced.

68. A system according to any of claims 62-67 wherein the body of the magnetic transducer has a face, said body defines the transducing gap therein at its face for magnetically coupling the magnetic transducer to the magnetic tape, and the saturation control means is coupled to the magnetic transducer to effect magnetic saturation of the body selectively over a region of its face to define a magnetically unsaturated region of said face adjacent a selected segment of the gap at opposite sides thereof and enable the selected segment to magnetically couple the magnetic transducer to the magnetic tape for effecting transfer of information signals with respect to said tape.

* * * * *